United States Patent
Kim et al.

(10) Patent No.: US 11,637,124 B2
(45) Date of Patent: Apr. 25, 2023

(54) STACKED MEMORY STRUCTURE WITH INSULATING PATTERNS

(71) Applicant: SK hynix Inc., Icheon-si (KR)

(72) Inventors: Changhan Kim, Icheon-si (KR); In Ku Kang, Icheon-si (KR); Sun Young Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 159 days.

(21) Appl. No.: 16/992,926

(22) Filed: Aug. 13, 2020

(65) Prior Publication Data

US 2021/0265383 A1    Aug. 26, 2021

(30) Foreign Application Priority Data

Feb. 20, 2020   (KR) ........................ 10-2020-0021284

(51) Int. Cl.
*H01L 29/423*    (2006.01)
*H01L 27/11582*   (2017.01)
*H01L 27/11556*   (2017.01)
*H01L 27/24*     (2006.01)
*H01L 27/1157*   (2017.01)
*H01L 27/11524*   (2017.01)
*H01L 45/00*    (2006.01)
*H01L 21/28*    (2006.01)

(52) U.S. Cl.
CPC .... *H01L 27/11582* (2013.01); *H01L 27/1157* (2013.01); *H01L 27/11524* (2013.01); *H01L 27/11556* (2013.01); *H01L 27/249* (2013.01); *H01L 29/40114* (2019.08); *H01L 29/40117* (2019.08); *H01L 29/4234* (2013.01); *H01L 29/42324* (2013.01); *H01L 45/06* (2013.01); *H01L 45/1683* (2013.01)

(58) Field of Classification Search
CPC ......... H01L 27/11582; H01L 27/11556; H01L 27/11524; H01L 27/1157; H01L 29/40117; H01L 29/4234
See application file for complete search history.

(56) References Cited

U.S. PATENT DOCUMENTS

| | | |
|---|---|---|
| 9,985,049 B1 | 5/2018 | Sandhu et al. |
| 2012/0235220 A1 | 9/2012 | Sekine et al. |
| 2016/0079269 A1 | 3/2016 | Sekine et al. |
| 2016/0351582 A1 | 12/2016 | Kim et al. |
| 2018/0374860 A1* | 12/2018 | Goda ............... H01L 27/11582 |
| 2021/0151461 A1* | 5/2021 | Shim ................ H01L 27/1157 |

* cited by examiner

*Primary Examiner* — Wasiul Haider
(74) *Attorney, Agent, or Firm* — William Park & Associates Ltd.

(57) ABSTRACT

A semiconductor device includes a stacked structure with insulating layers and conductive layers that are alternately stacked on each other, a hard mask pattern on the stacked structure, a channel structure penetrating the hard mask pattern and the stacked structure, insulating patterns interposed between the insulating layers and the channel structure, wherein the insulating patterns protrude farther towards the channel structure than a sidewall of the hard mask pattern, and a memory layer interposed between the stacked structure and the channel structure, wherein the memory layer fills a space between the insulating patterns.

14 Claims, 48 Drawing Sheets

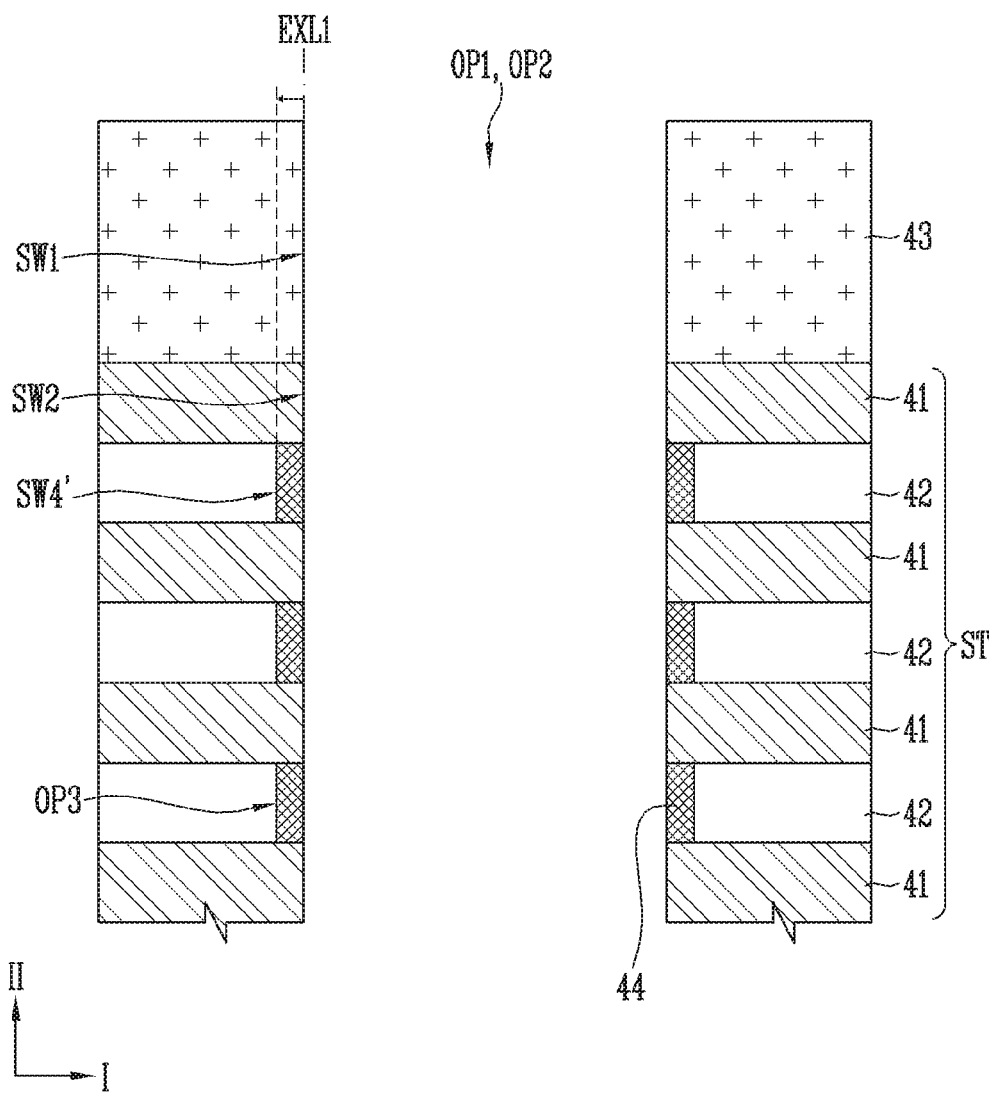

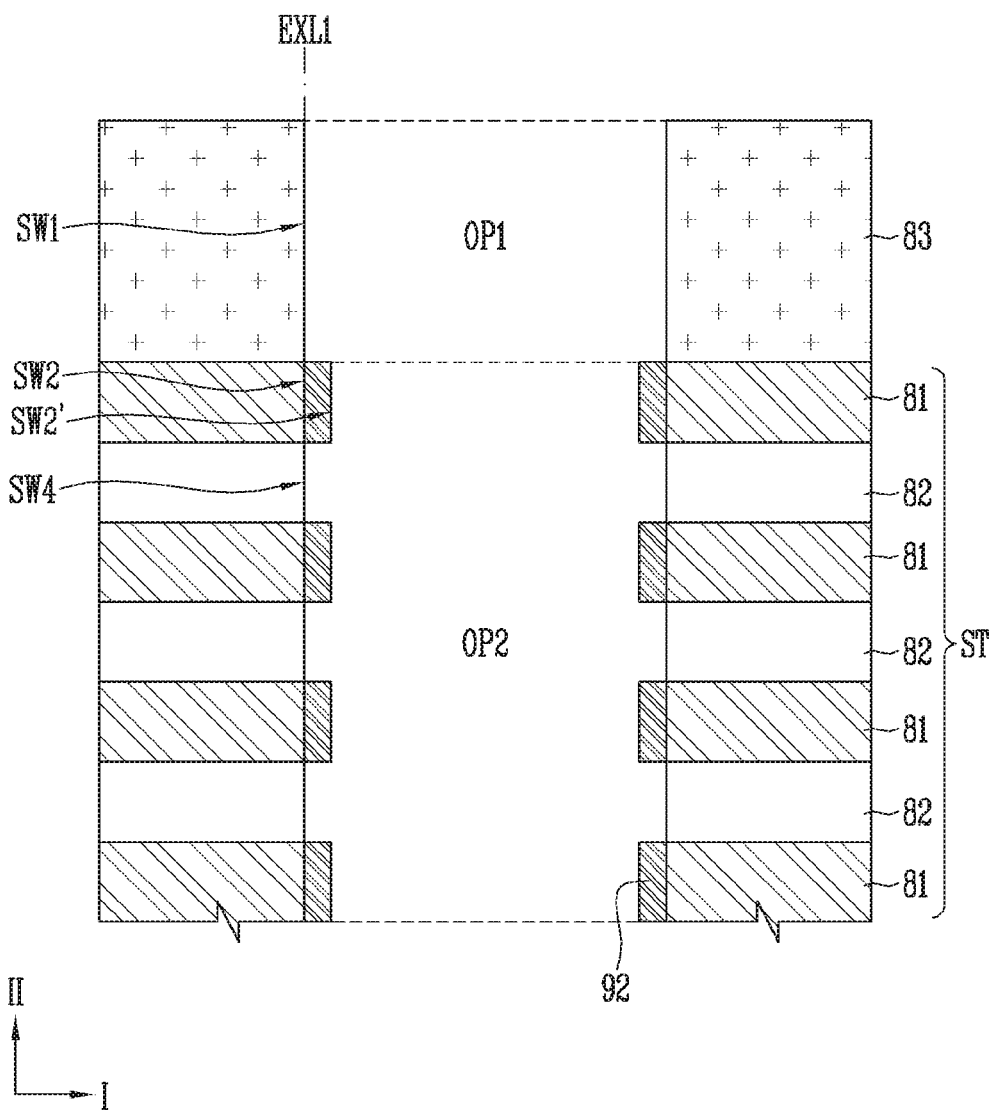

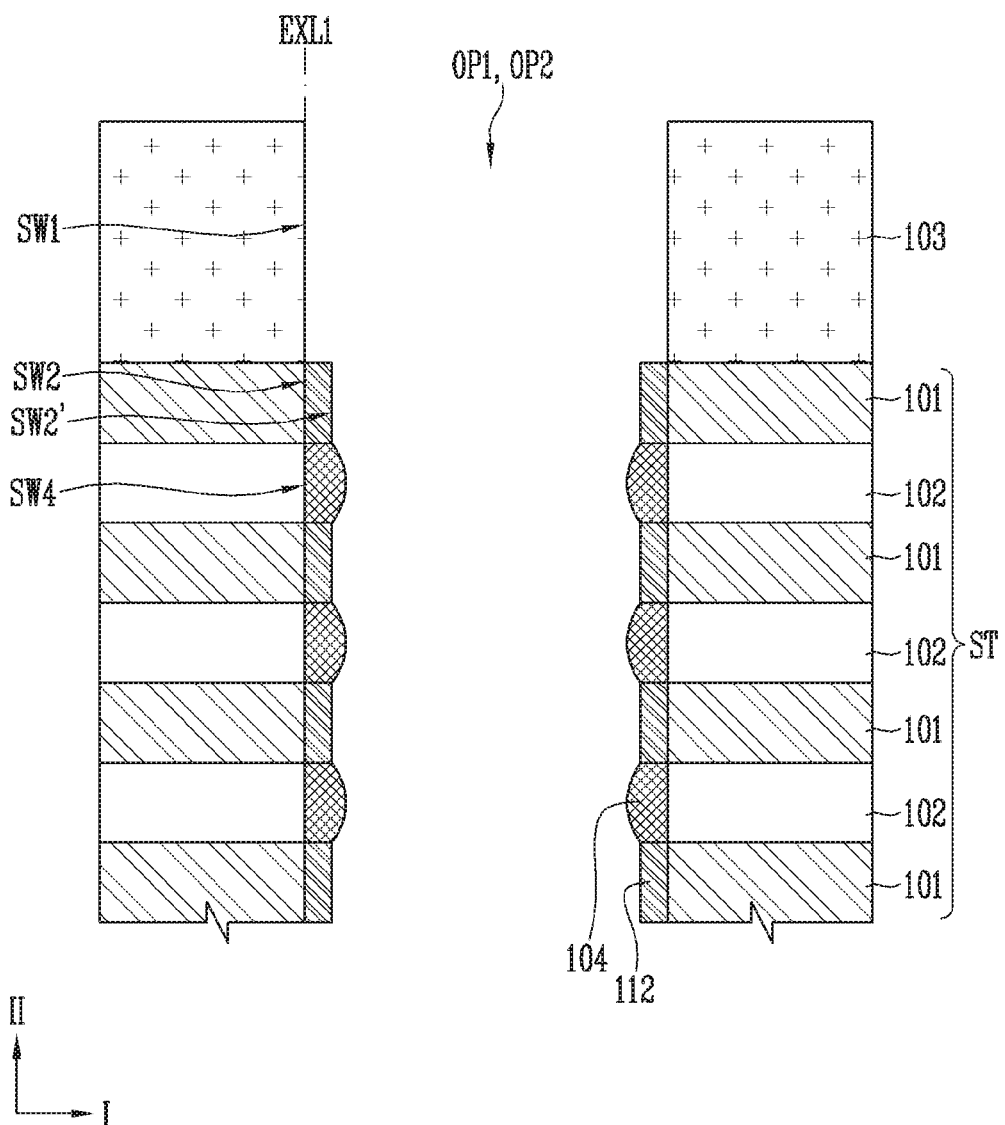

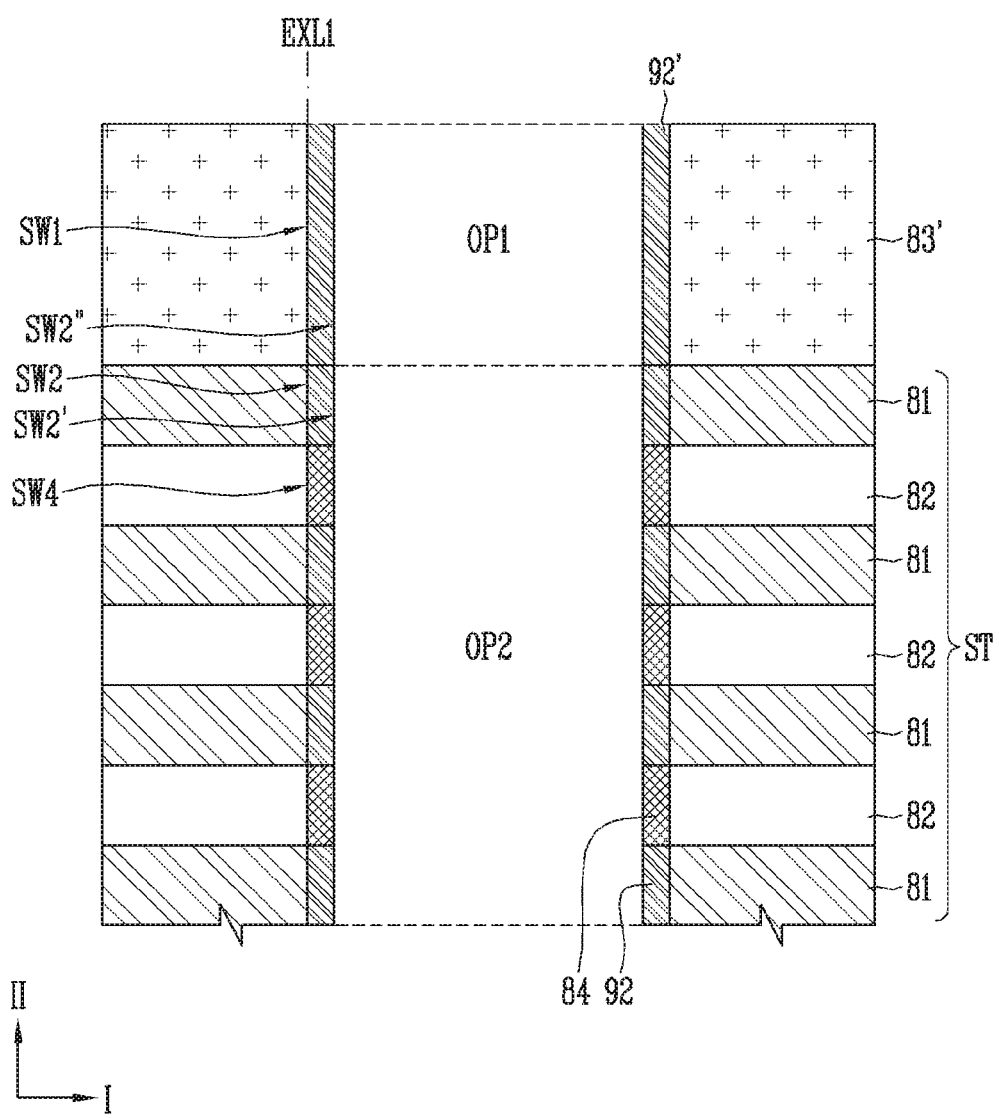

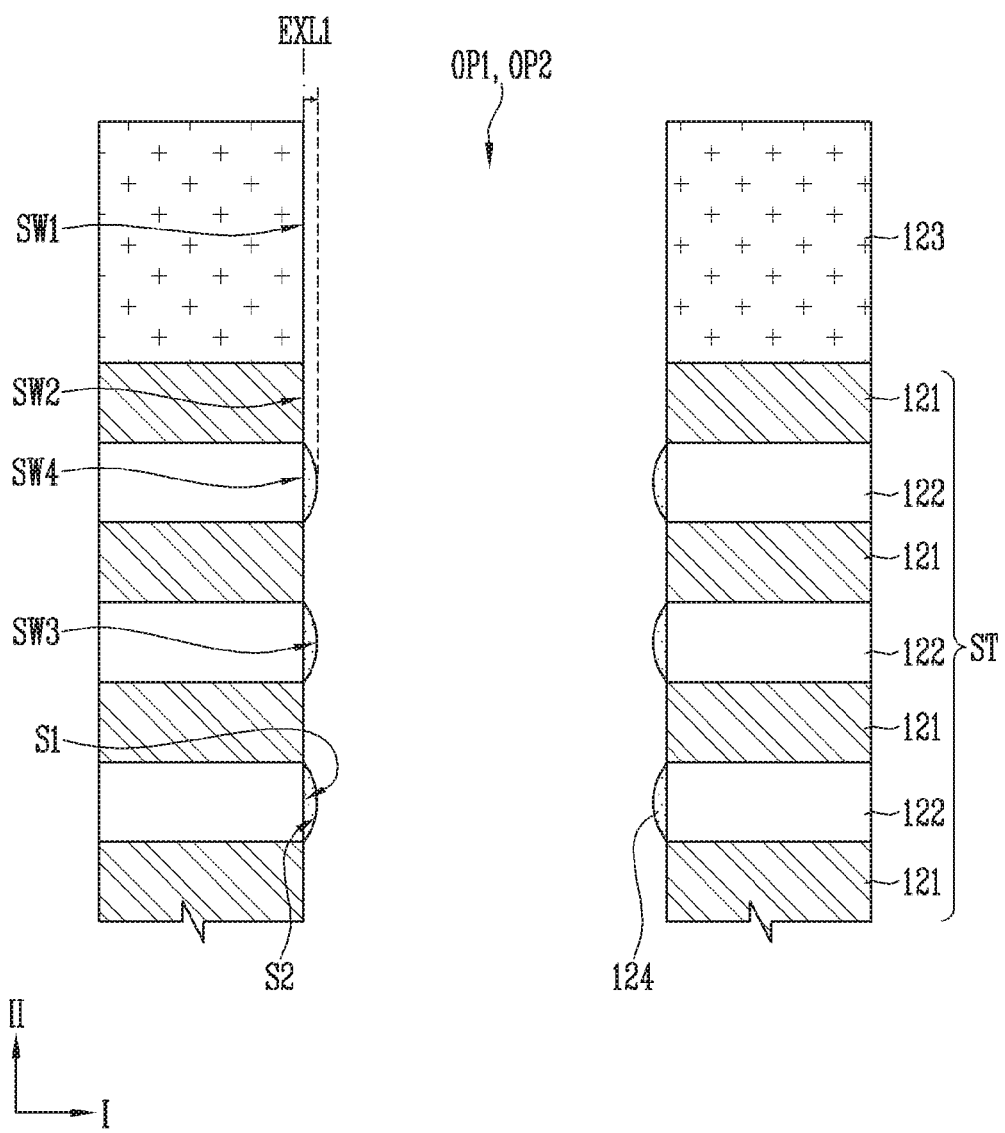

STACKED MEMORY STRUCTURE WITH INSULATING PATTERNS

CROSS-REFERENCE TO RELATED APPLICATION

The present application claims priority under 35 U.S.C. § 119(a) to Korean patent application number 10-2020-0021284, filed on Feb. 20, 2020, in the Korean Intellectual Property Office, the entire disclosure of which is incorporated herein by reference.

BACKGROUND

1. Technical Field

Various embodiments generally relate to an electronic device, and more particularly, to a semiconductor device and a manufacturing method of the semiconductor device.

2. Related Art

Non-volatile memory devices retain stored data even in the absence of a power supply. Due to the limitations in increasing the integration density of two-dimensional non-volatile memory devices in which memory cells that are formed in a single layer over a substrate, three-dimensional non-volatile memory devices have been proposed in which memory cells are stacked in a vertical direction over a substrate.

A three-dimensional non-volatile memory device may include interlayer insulating layers and gate electrodes that are alternately stacked on each other and channel layers that pass through the interlayer insulating layers and the gate electrodes, and memory cells may be stacked along the channel layers. Various structures and manufacturing methods have been developed to improve the operational reliability of three-dimensional non-volatile memory devices.

SUMMARY

According to an embodiment, a semiconductor device may include a stacked structure with insulating layers and conductive layers that are alternately stacked on each other, a hard mask pattern on the stacked structure, a channel structure penetrating through the hard mask pattern and the stacked structure, insulating patterns interposed between the insulating layers and the channel structure, wherein the insulating patterns protrude farther towards the channel structure than a sidewall of the hard mask pattern, and a memory layer interposed between the stacked structure and the channel structure, wherein the memory layer fills a space between the insulating patterns.

According to an embodiment, a method of manufacturing a semiconductor device may include forming a stacked structure with first material layers and second material layers that are alternately stacked on each other, forming a hard mask pattern on the stacked structure, forming a first opening that penetrates through the stacked structure and the hard mask pattern, forming insulating patterns on respective second material layers, wherein the insulating patterns protrude farther into the first opening than a sidewall of the hard mask pattern, forming a memory layer that fills a space between the insulating patterns, in the first opening, and forming a channel structure in the memory layer.

BRIEF DESCRIPTION OF THE DRAWINGS

FIGS. 5A to 5E are diagrams, illustrating a method of manufacturing a semiconductor device, according to an embodiment;

FIGS. 7A to 7D are diagrams, illustrating a method of manufacturing a semiconductor device, according to an embodiment;

FIGS. 8A to 8C are diagrams, illustrating a method of manufacturing a semiconductor device, according to an embodiment;

FIGS. 9A and 9B are diagrams, illustrating a method of manufacturing a semiconductor device, according to an embodiment;

FIGS. 14A to 14C are diagrams, illustrating a method of manufacturing a semiconductor device, according to an embodiment;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out through various forms but the descriptions are not limited to the examples of embodiments described in this specification.

It will be understood that although the terms "first", "second", "third" etc. are used herein to describe various elements, these elements should not be limited through these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments are directed to a semiconductor device with a stabilized structure and improved characteristics, and a manufacturing method of the semiconductor device.

Figure 1A:
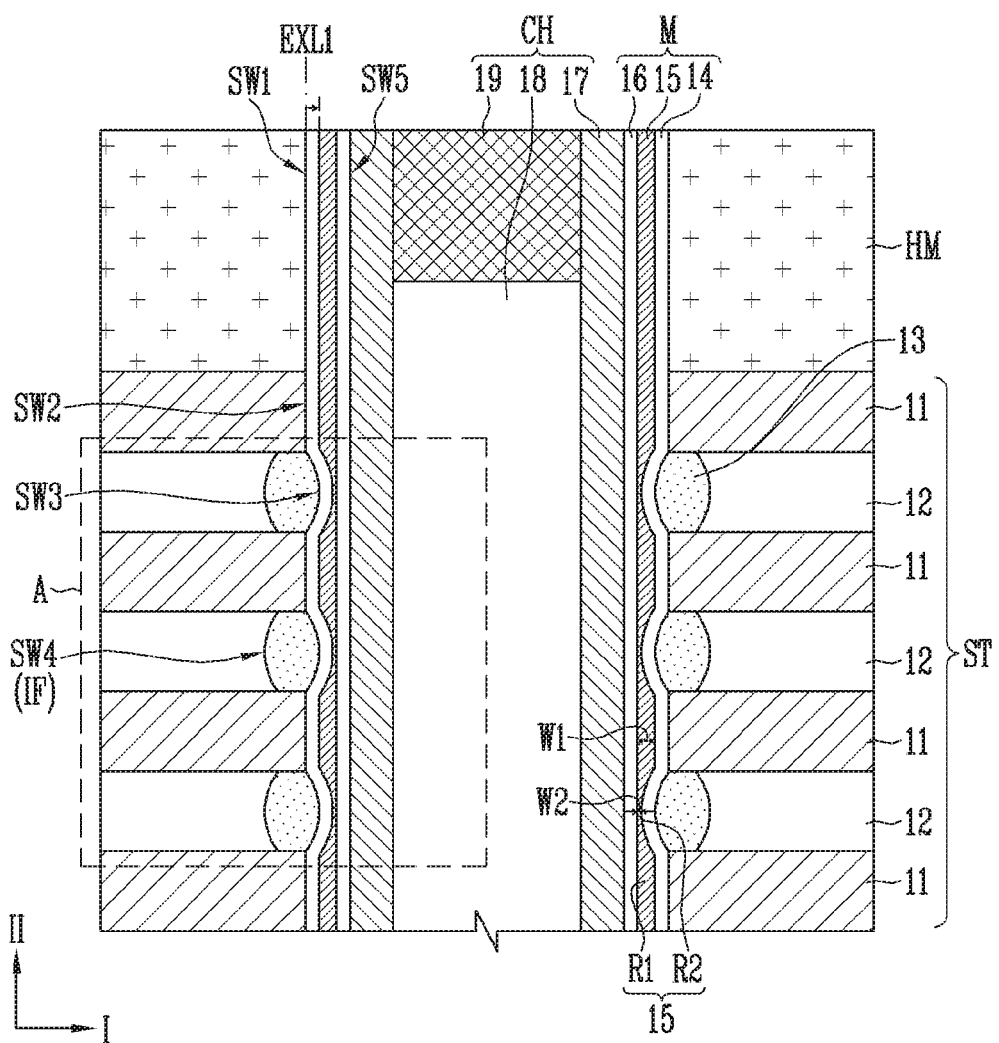
FIGS. 1A to 1D are diagrams, illustrating the structure of a semiconductor device, according to an embodiment.
Figure 1B:
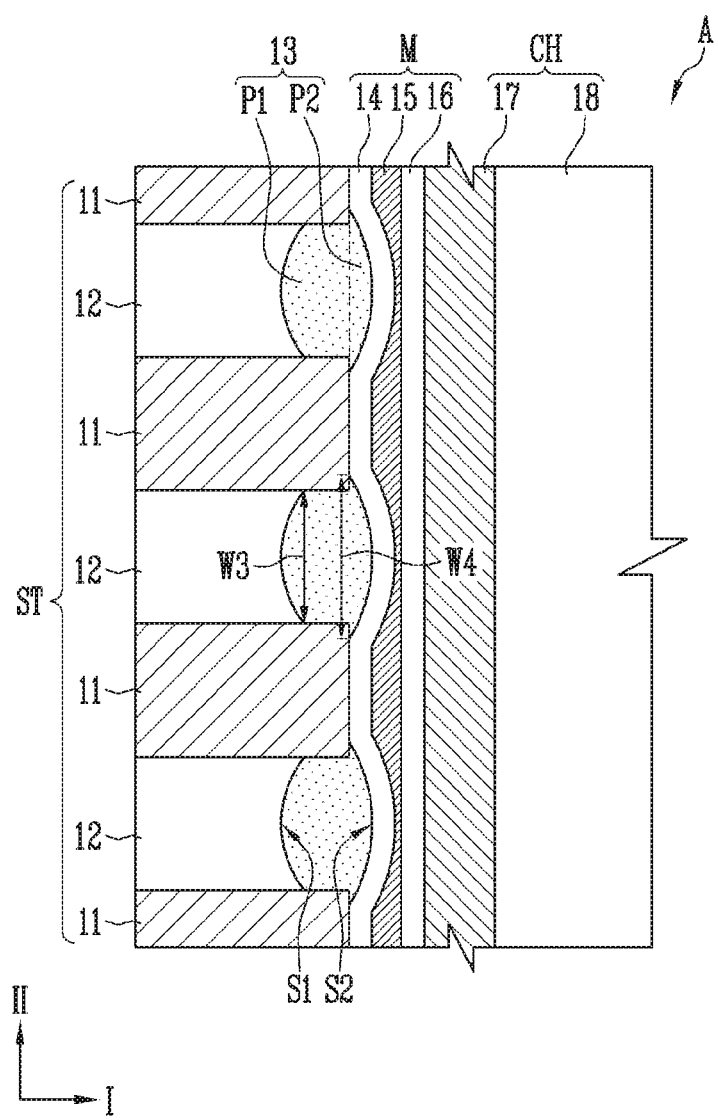
Figure 1C:
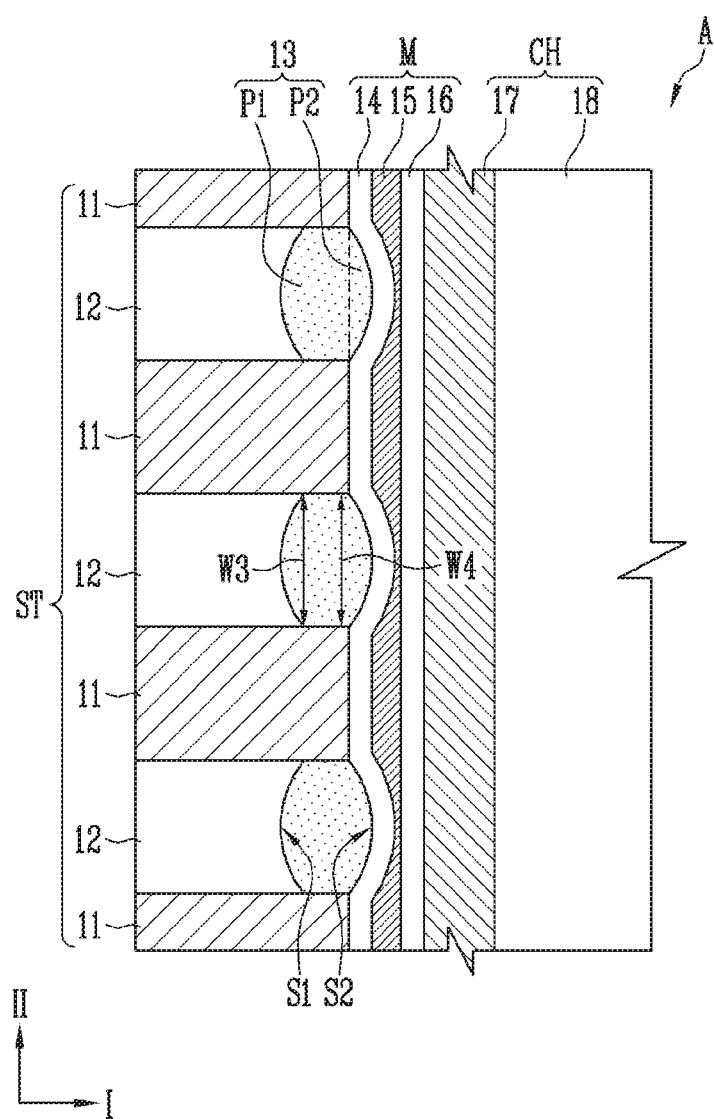
Figure 1D:
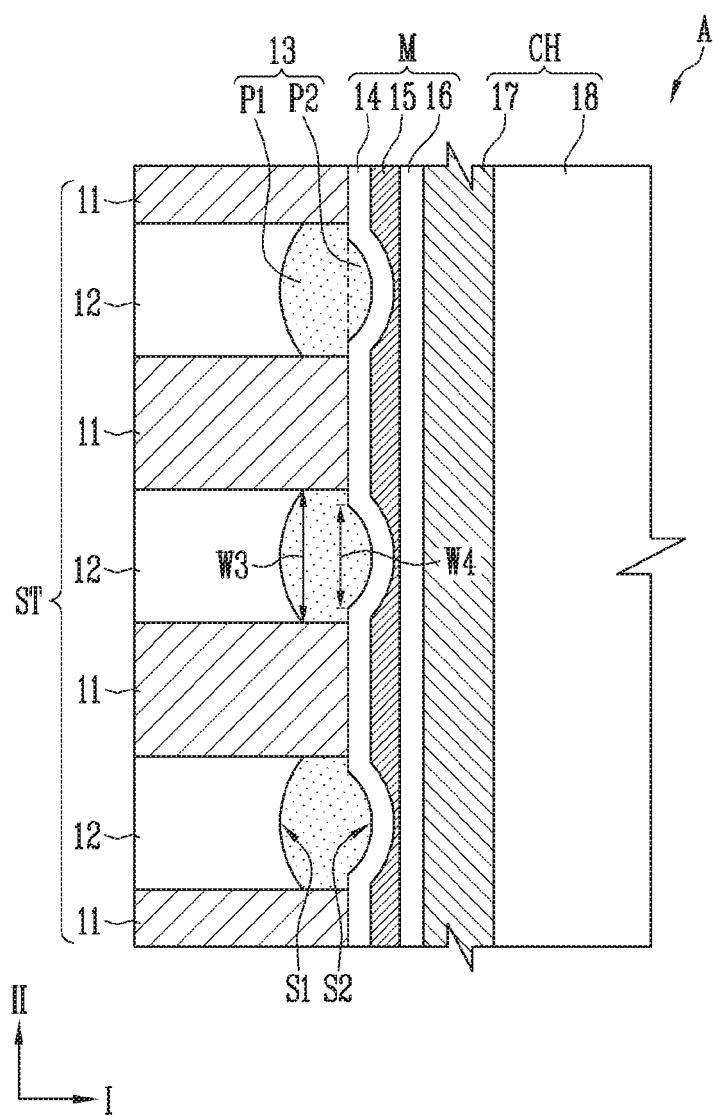

FIGS. 1A to 1D are diagrams, illustrating the structure of a semiconductor device, according to an embodiment. FIGS. 1B to 1D are enlarged views of region A that is shown in FIG. 1A.

Referring to FIG. 1A, a semiconductor device according to an embodiment may include a stacked structure ST, a hard mask pattern HM, a channel structure CH, insulating patterns 13, and a memory layer M.

The stacked structure ST may include conductive layers 11 and insulating layers 12 that are alternately stacked on each other. The conductive layers 11 may be gate electrodes of a select transistor, a memory cell, and the like. The conductive layers 11 may include a conductive material, such as polysilicon, tungsten, or metal. The insulating layers 12 may be provided to insulate the stacked conductive layers 11 from each other. The insulating layers 12 may include an insulating material, such as an oxide or a nitride.

The hard mask pattern HM may be located on the stacked structure ST. The hard mask pattern HM may include a material with etch selectivity with respect to the insulating layers 12. The hard mask pattern HM may include a nitride, a carbon-based material, or a combination thereof.

The channel structure CH may pass through the stacked structure ST and the hard mask pattern HM. The channel structure CH may extend in a direction in which the conductive layers 11 and the insulating layers 12 are stacked. The direction in which the conductive layers 11 and the insulating layers 12 are stacked may be a second direction II. The channel structure CH may include a channel layer 17 and may further include at least one of a gap-fill layer 18 and a capping layer 19. The channel layer 17 may be a region in which a channel, such as a select transistor or a memory cell, is formed. The channel layer 17 may include a semiconductor material, such as silicon or germanium, or a nanostructure such as a nanodot, a nanotube, or graphene. The gap-fill layer 18 may be formed in a space defined by the channel layer 17 and may include an insulating material, such as an oxide. The capping layer 19 may be coupled to the channel layer 17 and may include a conductive material, such as polysilicon.

The insulating patterns 13 may be interposed between the insulating layers 12 and the channel structure CH. The insulating patterns 13 may correspond to the insulating layers 12, respectively, and may be located in substantially the same level as the insulating layers 12. The insulating patterns 13 may directly contact the insulating layers 12.

The insulating patterns 13 may include an insulating material, such as an oxide. The insulating patterns 13 and the insulating layers 12 may be formed through different methods. Therefore, the insulating patterns 13 and the insulating layers 12 may have different properties of matter. For example, properties of matter such as a dielectric constant, dielectric strength, density, an etch rate, thermal stability, a composition, and a nitrogen concentration may be different between the insulating patterns 13 and the insulating layers 12.

The insulating layers 12 may be formed through a deposition method, such as a Chemical Vapor Deposition (CVD) method. The insulating patterns 13 may be formed through an oxidation process. Because an oxidation process may be performed at a higher temperature than a deposition process, a layer that is formed through the oxidation process may have a superior property of matter than a layer formed through the deposition process. The insulating patterns 13 may have a higher dielectric strength, a lower etch rate, and a higher thermal stability than the insulating layers 12 and may have less defects than the insulating layers 12. In addition, the insulating patterns 13 may include a material with high etch selectivity with respect to a nitride or polysilicon.

The hard mask pattern HM may include a first sidewall SW1. The first sidewall SW1 may be a surface defined by an etching process. Each of the conductive layers 11 may include a second sidewall SW2. The second sidewall SW2 may correspond to the first sidewall SW1. In a cross section that is defined by a first direction I and a second direction II crossing the first direction I, the second sidewall SW2 may be located on a first extending line EXL1 of the first sidewall SW1. The second direction II may be a direction perpendicular to the first direction I. The first sidewall SW1 and the second sidewall SW2 may be flat.

Each of the insulating patterns 13 may include a third sidewall SW3. The third sidewall SW3 may protrude farther towards the channel structure CH than the first sidewall SW1 of the hard mask pattern HM. The third sidewall SW3 may protrude farther towards the channel structure CH than the first extending line EXL1 of the first sidewall SW1. The third sidewall SW3 may protrude farther towards the channel structure CH than the second sidewall SW2. The third sidewall SW3 may be a surface defined by an oxidation process. The third sidewall SW3 may include a curved surface.

Each of the insulating layers 12 may include a fourth sidewall SW4. The fourth sidewall SW4 may be an etched surface or a surface that is defined by an oxidation process. The fourth sidewall SW4 may be an interface IF between the insulating layer 12 and the insulating pattern 13. The fourth sidewall SW4 may be spaced apart farther from the channel structure CH than the first sidewall SW1 and the second sidewall SW2. The interface IF may be spaced apart farther from a fifth sidewall SW5 of the channel structure CH than the first sidewall SW1 and the second sidewall SW2.

The memory layer M may be interposed between the stacked structure ST and the channel structure CH and may fill the spaces between the insulating patterns 13. The memory layer may include at least one of a blocking layer 14, a data storage layer 15, and a tunnel insulating layer 16. The tunnel insulating layer 16 may surround the sidewall of the channel structure CH. The tunnel insulating layer 16 may be a layer that allows charge tunneling through F—N tunneling or the like, and may include an insulating material such as an oxide or a nitride. The data storage layer 15 may surround the tunnel insulating layer 16. The data storage layer 15 may include a floating gate, a charge trapping material, polysilicon, a nitride, a variable resistance material, a phase-change material, a nanostructure, or the like. The blocking layer 14 may surround the data storage layer 15. The blocking layer 14 may prevent charges from moving to the conductive layer 11 and may include a high-k material, such as aluminum oxide, for example, $Al_2O_3$.

The data storage layer 15 may be interposed between the channel structure CH and the stacked structure ST and may extend to the first sidewall SW1 of the hard mask pattern HM. The data storage layer 15 may have a thickness that varies based on the region thereof. The thickness may be a thickness that is measured in the first direction I. The data storage layer may include a first region R1 that corresponds to the conductive layer 11 and a second region R2 that corresponds to the insulating pattern 13. The first region R1 may be a memory cell region, and the second region R2 may be a space region between adjacent memory cells. The first region R1 may have a thickness that is greater than the second region R2 (W1>W2).

The data storage layer 15 may have a flat inner wall that is adjacent to the channel structure CH and an uneven outer wall that is adjacent to the stacked structure ST. The first region R1 may include a protrusion that protrudes farther towards the stacked structure ST than the second region R2, and the protrusion may protrude between the adjacent insulating patterns 13. A surface of the first region R1 may have a shape that corresponds to a shape of the second sidewall SW2 of each of the conductive layers 11 and may be flat. A surface of the second region R2 may have a shape that corresponds to a shape of the third sidewall SW3 of each of the insulating patterns 13 and may include a curved surface.

According to the structure as described above, a memory cell or a select transistor may be located in each of the intersections of the channel structure CH and the conductive layers 11. Memory cells and select transistors, sharing the channel structure CH, may form a single memory string. The memory string may include at least one drain select transistor, memory cells, and at least one source select transistor.

Referring to FIGS. 1B to 1D, each of the insulating patterns 13 may include a first surface S1 that faces the insulating layer 12 and a second surface S2 that faces the channel structure CH. Each of the first surface S1 and the second surface S2 may include a curved surface. The first surface S1 may contact the insulating layer 12, and the second surface S2 may contact the blocking layer 14. The second surface S2 may correspond to the third sidewall SW3 as shown in FIG. 1A.

The thickness of each of the conductive layers 11 and the thickness of each of the insulating layers 12 in the second direction II may be the same or may be different. Each of the conductive layers 11 may have a thickness that is greater than each of the insulating layers 12.

Each of the insulating patterns 13 may include a first portion P1 and a second portion P2. The first portion P1 may be interposed between the adjacent conductive layers 11. The second portion P2 may protrude farther towards the channel structure CH than the second sidewall SW2. The second portion P2 may protrude farther towards the channel structure CH than the first sidewall SW1. The first portion P1 may have a third width W3 in the second direction II. When the first surface S1 includes a curved surface, the third width W3 may be a width of the first portion P1 in an interface between the first portion P1 and the second portion P2. The third width W3 may be substantially the same as the width of each of the insulating layers 12. The second portion P2 may have a fourth width W4 in the second direction II. When the second surface S2 includes a curved surface, the fourth width W4 may be a width of the second portion P2 in the interface between the first portion P1 and the second portion P2. The fourth width W4 may be substantially the same as or may be different from the width of each of the insulating layers 12.

Referring to FIG. 1B, the second portion P2 may have a greater width than the first portion P1 (W4>W3). The second portion P2 may extend in the second direction II and may partially overlap with the conductive layers 11. Each of the insulating patterns 13 may have a mushroom shape. Referring to FIG. 1C, the second portion P2 may have substantially the same width as the first portion P1 (W4=W3). Referring to FIG. 1D, the second portion P2 may have a smaller width than the first portion P1 (W4<W3).

According to the above-described structure, the third sidewall SW3 of each of the insulating patterns 13 may protrude farther towards the channel structure CH than the first sidewall SW1 of the hard mask pattern HM. In addition, the first region R1 of the data storage layer 15 may have a thickness that is greater than the second region R2 of the date storage layer 15 (W1>W2). Therefore, according to the above-described structure, the movement of charges between memory cells, which share the channel structure CH and the memory layer M and neighbor each other in the second direction II, may be mitigated. In addition, according to the above-described structure, data retention characteristics may be improved, and interference between the memory cells that are stacked may be reduced.

Figure 2A:
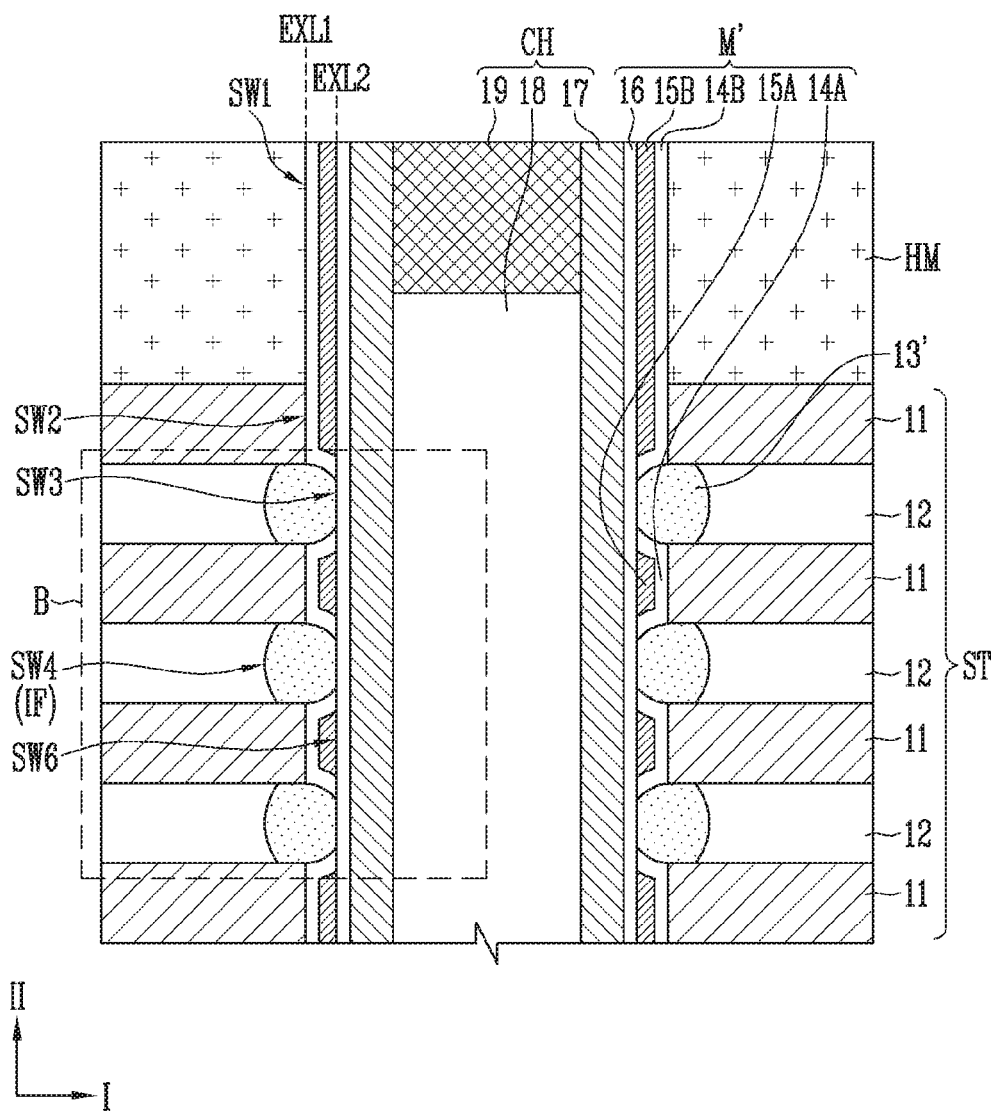
FIGS. 2A to 2D are diagrams, illustrating the structure of a semiconductor device, according to an embodiment.
Figure 2B:
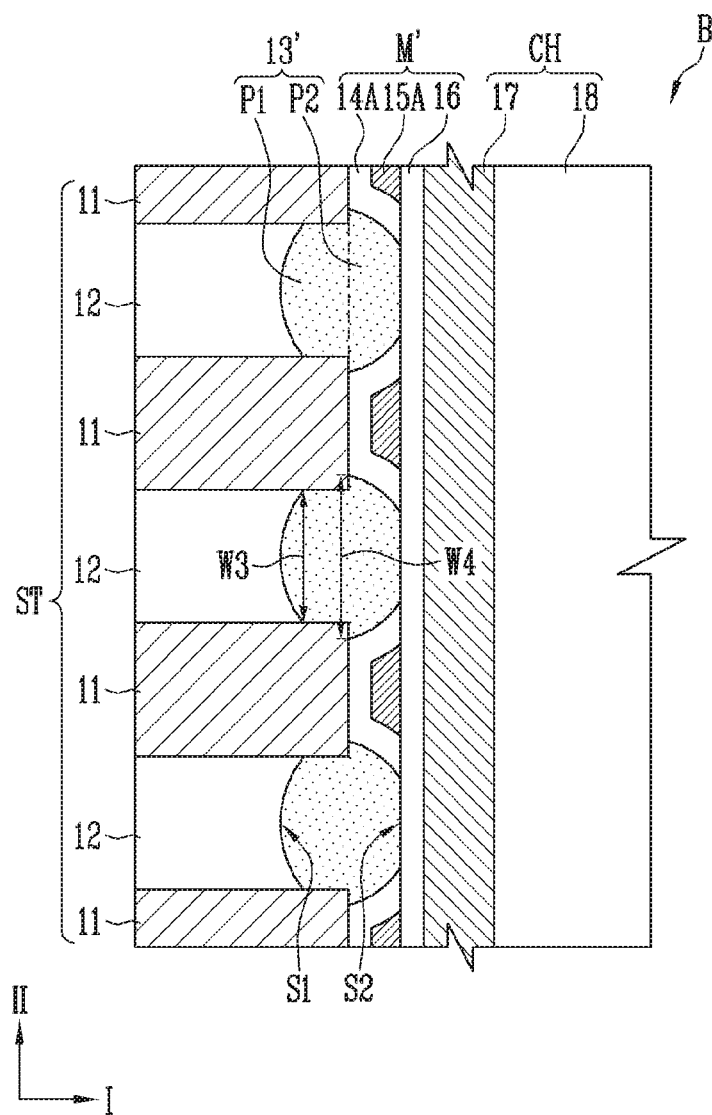
Figure 2C:
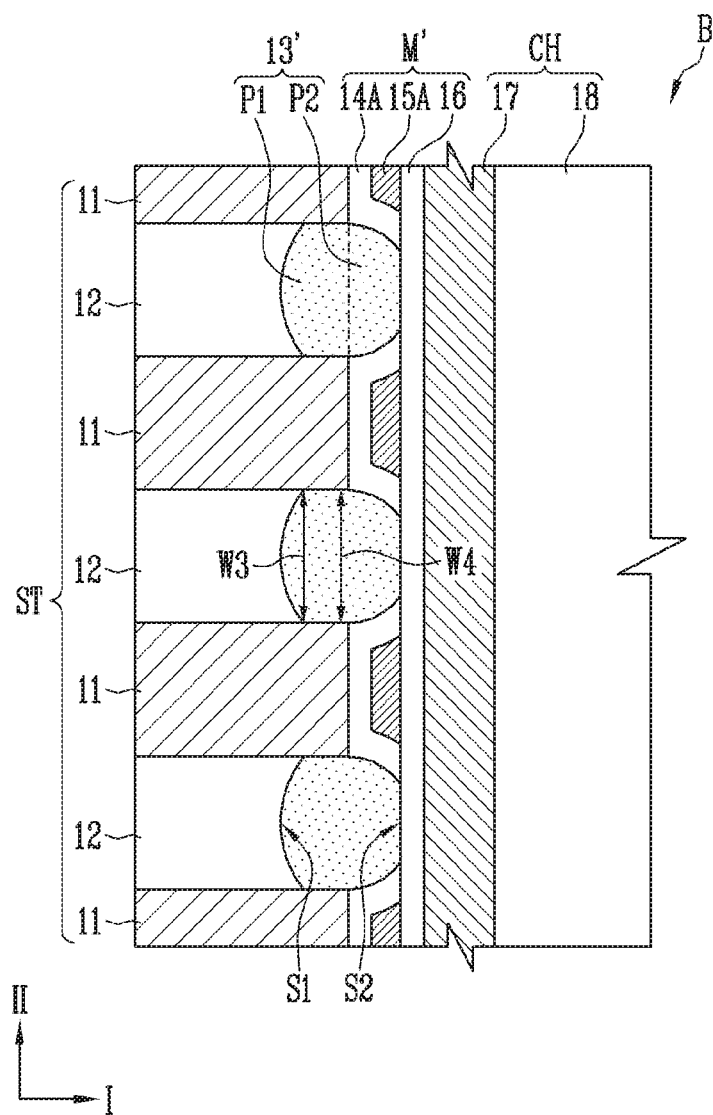
Figure 2D:
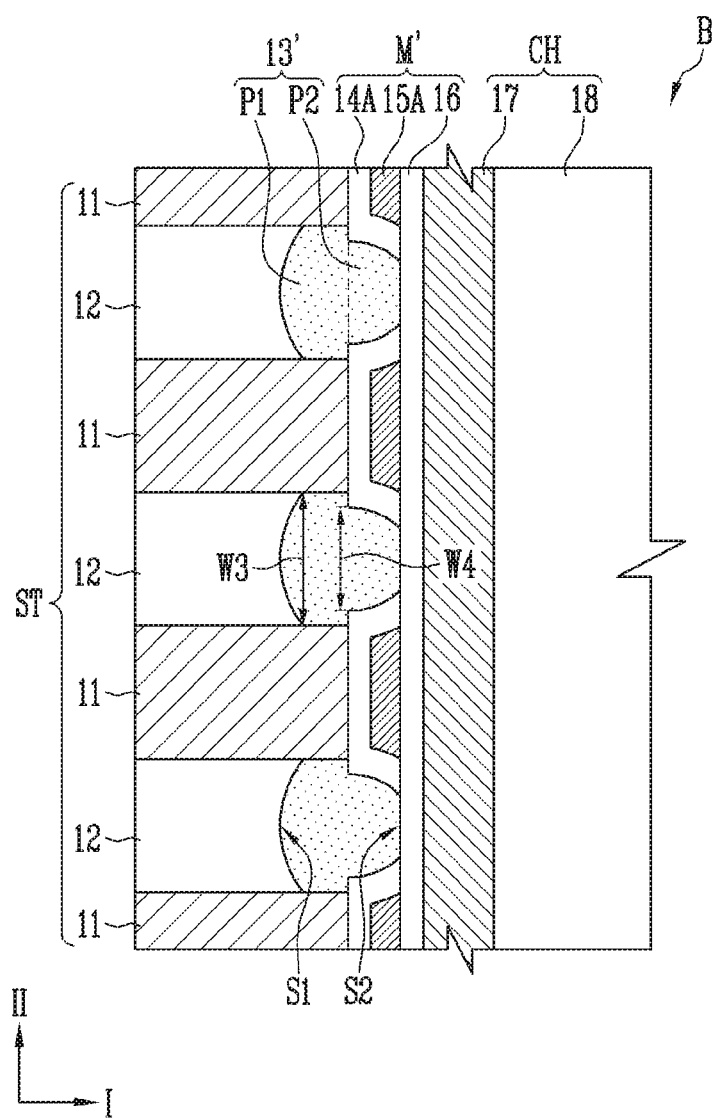

FIGS. 2A to 2D are diagrams, illustrating the structure of a semiconductor device, according to an embodiment. FIGS. 2B to 2D are enlarged views of region B shown in FIG. 2A. Hereinafter, any repetitive descriptions of components that have already been mentioned above will be omitted.

Referring to FIG. 2A, a semiconductor device may include the stacked structure ST, the hard mask pattern HM, the channel structure CH, insulating patterns 13', and a memory layer M'. The hard mask pattern HM may include a material with etch selectivity with respect to the insulating layers 12. The hard mask pattern HM may include a nitride, a carbon-based material, or a combination thereof.

The insulating patterns 13' may be interposed between the insulating layers 12 and the channel structure CH. The third sidewall SW3 of each of the insulating patterns 13' may protrude farther towards the channel structure CH than the first sidewall SW1 of the hard mask pattern HM. The second sidewall SW2 of each of the conductive layers 11 may be located on an extending line of the first sidewall SW1. The third sidewall SW3 may protrude farther towards the channel structure CH than the second sidewall SW2. The fourth sidewall SW4 of each of the insulating layers 12 may be spaced apart farther from the channel structure CH than the first sidewall SW1. A sixth sidewall SW6 of each of data storage patterns 15A and 15B may be located on a second extending line EXL2 of the third sidewall SW3.

The memory layer M' may be interposed between the stacked structure ST and the channel structure CH. The memory layer M' may fill the spaces between insulating patterns 13'. The memory layer M' may include at least one of first blocking patterns 14A, a second blocking pattern 14B, first data storage patterns 15A, a second data storage pattern 15B, and the tunnel insulating layer 16. The first and second blocking patterns 14A and 14B may be interposed between the conductive layers 11 and the first and second data storage patterns 15A and 15B, respectively. The first and second blocking patterns 14A and 14B may be separated from each other. The first blocking patterns 14A may be located between the insulating patterns 13' and may be separated from each other. The second blocking pattern 14B may extend to the first sidewall SW1 of the hard mask pattern HM. The first and second data storage patterns 15A and 15B may be interposed between the tunnel insulating layer 16 and the first and second blocking patterns 14A and 14B, respectively. The first and second data storage patterns 15A and 15B may be separated from each other. The first data storage patterns 15A may be located between the insulating patterns 13' and may be separated from each other. The second data storage pattern 15B may extend to the first sidewall SW1 of the hard mask pattern HM.

Referring to FIGS. 2B to 2D, each of the insulating patterns 13' may include the first surface S1 that faces the insulating layer 12 and the second surface S2 that faces the channel structure CH. The first surface S1 may include a curved surface and the second surface S2 may include a plane. The second surface S2 may include a curved surface and a plane. In addition, the second surface S2 may contact the tunnel insulating layer 16.

Referring to FIG. 2B, the second portion P2 may have a greater width than the first portion P1 (W4>W3). Referring to FIG. 2C, the second portion P2 may have substantially the same width as the first portion P1 (W4=W3). Referring to FIG. 2D, the second portion P2 may have a smaller width than the first portion P1 (W4<W3).

According to the above-described structure, the third sidewall SW3 of each of the insulating patterns 13' may protrude farther towards the channel structure CH than the first sidewall SW1 of the hard mask pattern HM. In addition, the first data storage patterns 15A may be located between the insulating patterns 13' and may be separated from each other. Therefore, according to the above-described structure, the movement of charges between memory cells, which share the channel structure CH and the memory layer M' and neighbor each other in the second direction II, may be mitigated. In addition, according to the above-described structure, data retention characteristics may be improved, and the interference between memory cells that are stacked may be reduced.

Figure 3A:
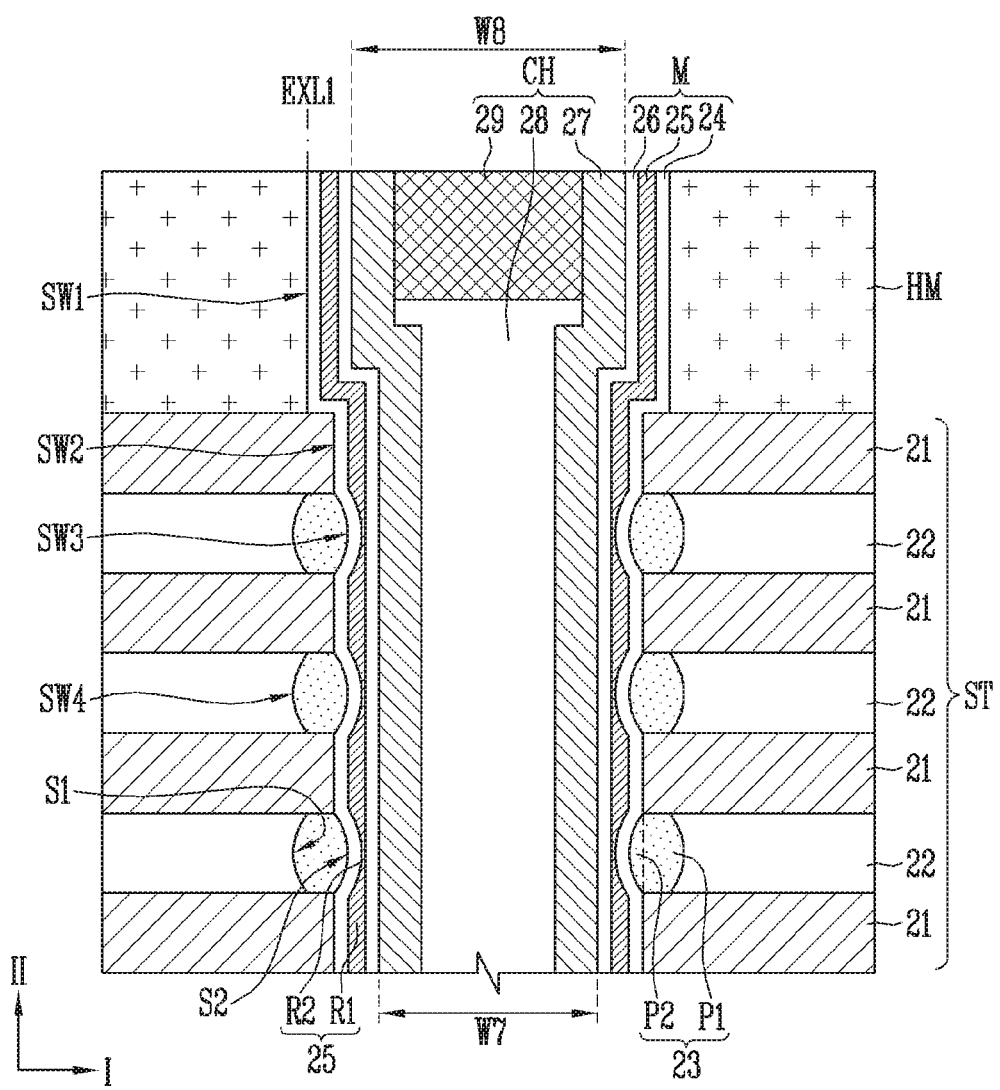
FIGS. 3A to 3D are diagrams, illustrating the structure of a semiconductor device, according to an embodiment.
Figure 3B:
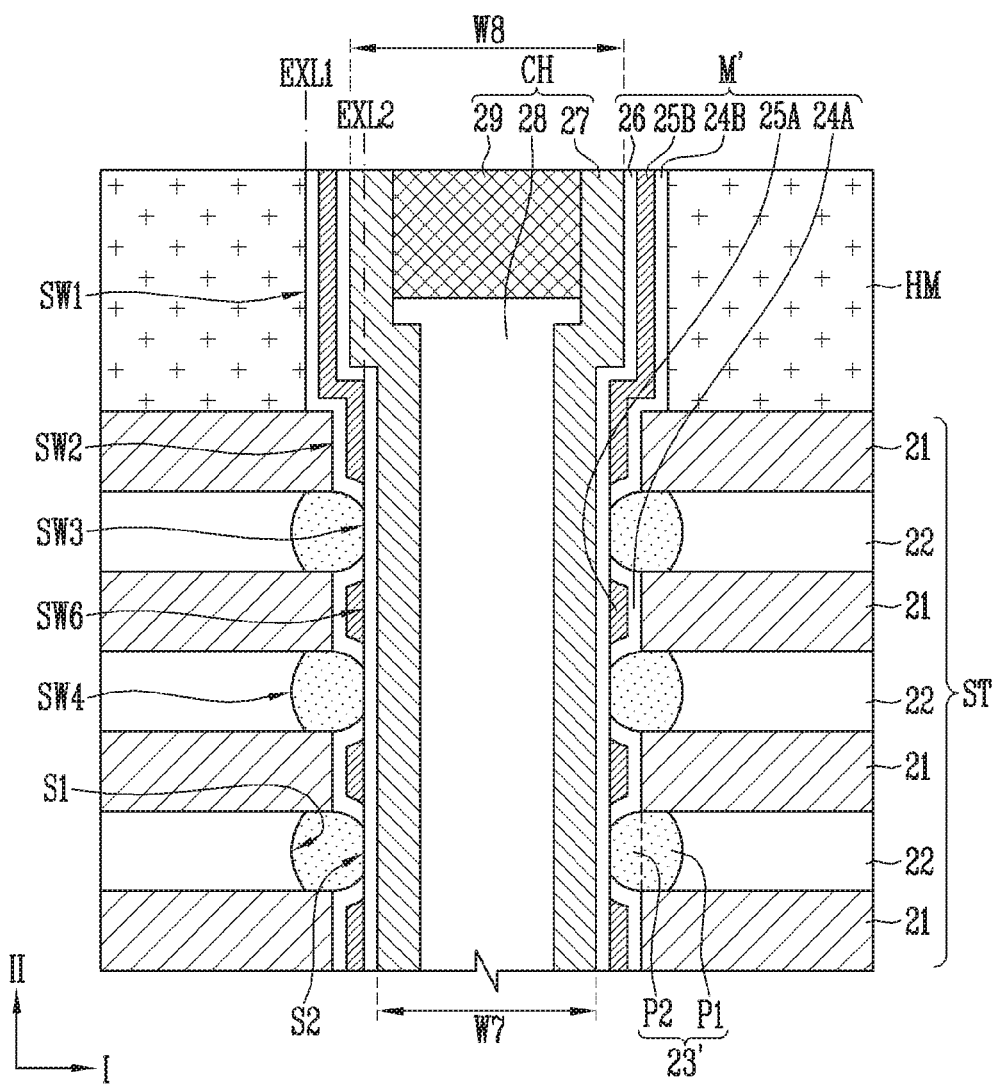

FIGS. 3A and 3B are diagrams, illustrating the structure of a semiconductor device, according to an embodiment. Hereinafter, any repetitive descriptions of components, already mentioned above, will be omitted.

Referring to FIGS. 3A and 3B, a semiconductor device may include the stacked structure ST, the hard mask pattern HM, the channel structure CH, insulating patterns 23 or 23', and the memory layer M or M'. The stacked structure ST may include conductive layers 21 and insulating layers 22 that are alternately stacked on each other. The hard mask pattern HM may be located on the stacked structure ST. The hard mask pattern HM may include an oxide, a carbon-based material, or a combination thereof.

The channel structure CH may pass through the stacked structure ST and the hard mask pattern HM. The channel structure CH may include a channel layer 27, and may further include at least one of a gap-fill layer 28 and a capping layer 29.

The second sidewall SW2 of each of the conductive layers 21 may protrude farther towards the channel structure CH than the first sidewall SW1 of the hard mask pattern HM. A step may be formed due to misalignment between the first sidewall SW1 and the second sidewall SW2 in the first direction I in a boundary between the hard mask pattern HM and the stacked structure ST, and a sidewall step of the channel structure CH may be caused due to formation of the memory layer M or M' and the channel layer 27 along the step. A portion of the channel structure CH that passes through the hard mask pattern HM may have an eighth width W8 and a portion of the channel structure CH that passes through the stacked structure ST may have a seventh width W7. The eighth width W8 may be greater than the seventh width W7. Each of the seventh width W7 and the eighth width W8 may be a width measured in the first direction I or a diameter of the channel structure CH. Therefore, the sidewall of the channel structure CH may have the step.

The second sidewall SW2 may protrude farther towards the channel structure CH than the fourth sidewall SW4 of each of the insulating layers 22. The fourth sidewall SW4 may be located on the first extending line EXL1 of the first sidewall SW1 or may be spaced apart farther from the channel structure CH than the first sidewall SW1.

Referring to FIG. 3A, the memory layer M may be interposed between the stacked structure ST and the channel structure CH. The memory layer M may include at least one of a blocking layer 24, a data storage layer 25, and a tunnel insulating layer 26. The data storage layer 25 may include the first region R1 and the second region R2 with different thicknesses from each other. The first region R1 may include a protrusion protruding between the adjacent insulating patterns 23.

The insulating patterns 23 may be interposed between the insulating layers 22 and the channel structure CH. Each of the insulating patterns 23 may include the first surface S1 that faces the insulating layer 22 and the second surface S2 that faces the channel structure CH. Each of the first surface S1 and the second surface S2 may include a curved surface. Each of the insulating patterns 23 may include the first portion P1 and the second portion P2. The first portion P1 and the second portion P2 may have substantially the same width or different widths from each other. The insulating patterns 23 may have a similar shape to one of the insulating patterns 13 that are described with reference to FIGS. 1B to 1D or a combination of shapes of insulating patterns 13 that is described with reference to FIGS. 1B to 1D.

The third sidewall SW3 of each of the insulating patterns 23 may protrude farther towards the channel structure CH than the first sidewall SW1. The third sidewall SW3 may protrude farther towards the channel structure CH than the second sidewall SW2.

Referring to FIG. 3B, the memory layer M' may be interposed between the stacked structure ST and the channel structure CH. The memory layer M' may include at least one of first blocking patterns 24A, a second blocking pattern 24B, first data storage patterns 25A, a second data storage pattern 25B, and the tunnel insulating layer 26. The first blocking patterns 24A may be located between the insulating patterns 23' and may be separated from each other. The second blocking pattern 24B may extend to the first sidewall SW1 of the hard mask pattern HM. The first data storage patterns 25A may be located between the insulating patterns 23' and may be separated from each other. The second data storage pattern 25B may extend to the first sidewall SW1 of the hard mask pattern HM.

The insulating patterns 23' may be interposed between the insulating layers 22 and the channel structure CH. Each of the insulating patterns 23' may include the first surface S1 that faces the insulating layer 22 and the second surface S2 that faces the channel structure CH. The first surface S1 may include a curved surface and the second surface S2 may include a plane. Each of the insulating patterns 23' may include the first portion P1 and the second portion P2. The first portion P1 and the second portion P2 may have substantially the same width or different widths from each other. The insulating patterns 23' may have a similar shape to one of the insulating patterns 13' that are described with reference to FIGS. 2B to 2D or a combination of shapes of insulating patterns 13' that are described with reference to FIGS. 2B to 2D.

The third sidewall SW3 of each of the insulating patterns 23' may protrude farther towards the channel structure CH than the first sidewall SW1. The third sidewall SW3 may protrude farther towards the channel structure CH than the second sidewall SW2. The sixth sidewall SW6 of each of the first data storage patterns 25A may be located on the second extending line EXL2 of the third sidewall SW3.

According to the structure that is described with reference to FIGS. 3A and 3B, the second sidewall SW2 of each of the conductive layers 21 may protrude farther towards the channel structure CH than the first sidewall SW1 of the hard mask pattern HM. In addition, the third sidewall SW3 of each of the insulating patterns 23 or 23' may protrude farther towards the channel structure CH than the second sidewall SW2 of each of the conductive layers 21. Therefore, according to the above-described structure, data retention characteristics may be improved and interference between memory cells that are stacked may be reduced.

Figure 3C:
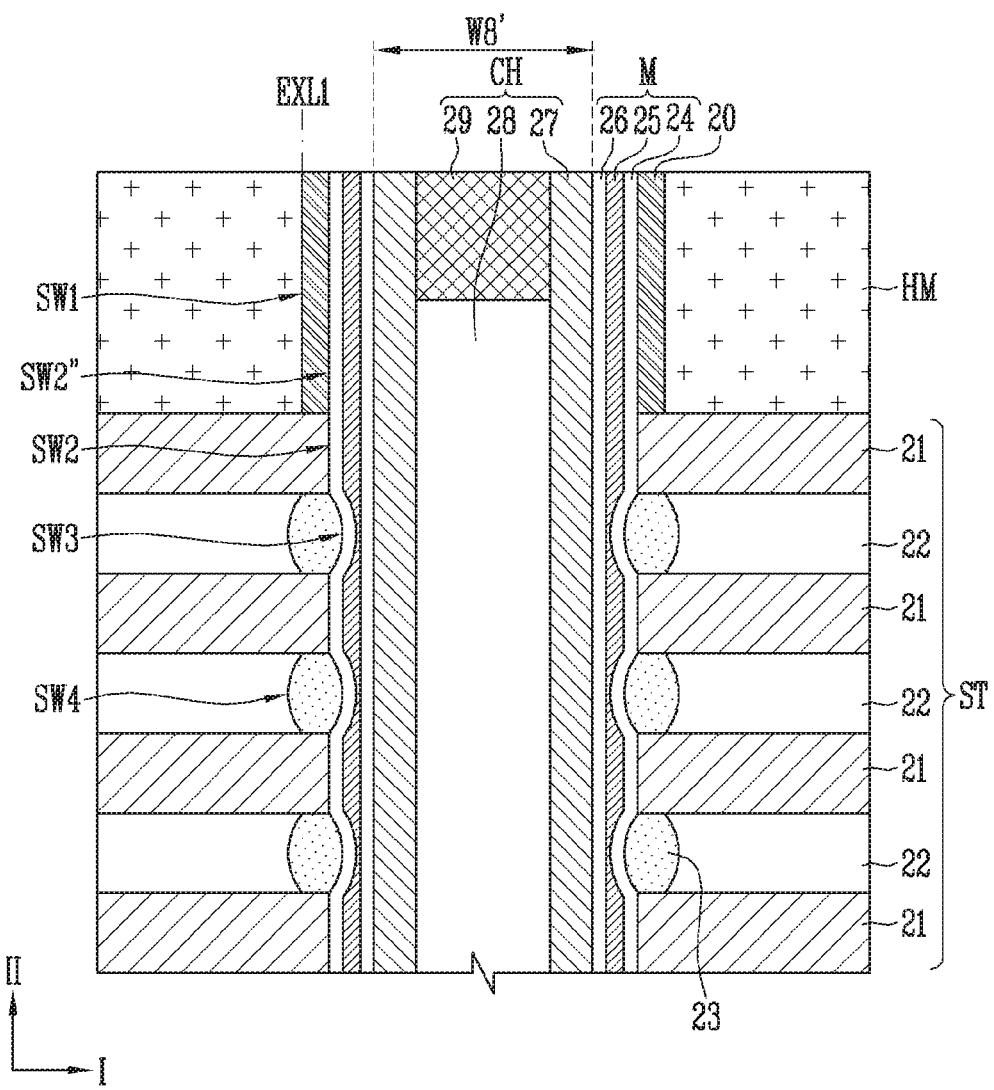
Figure 3D:
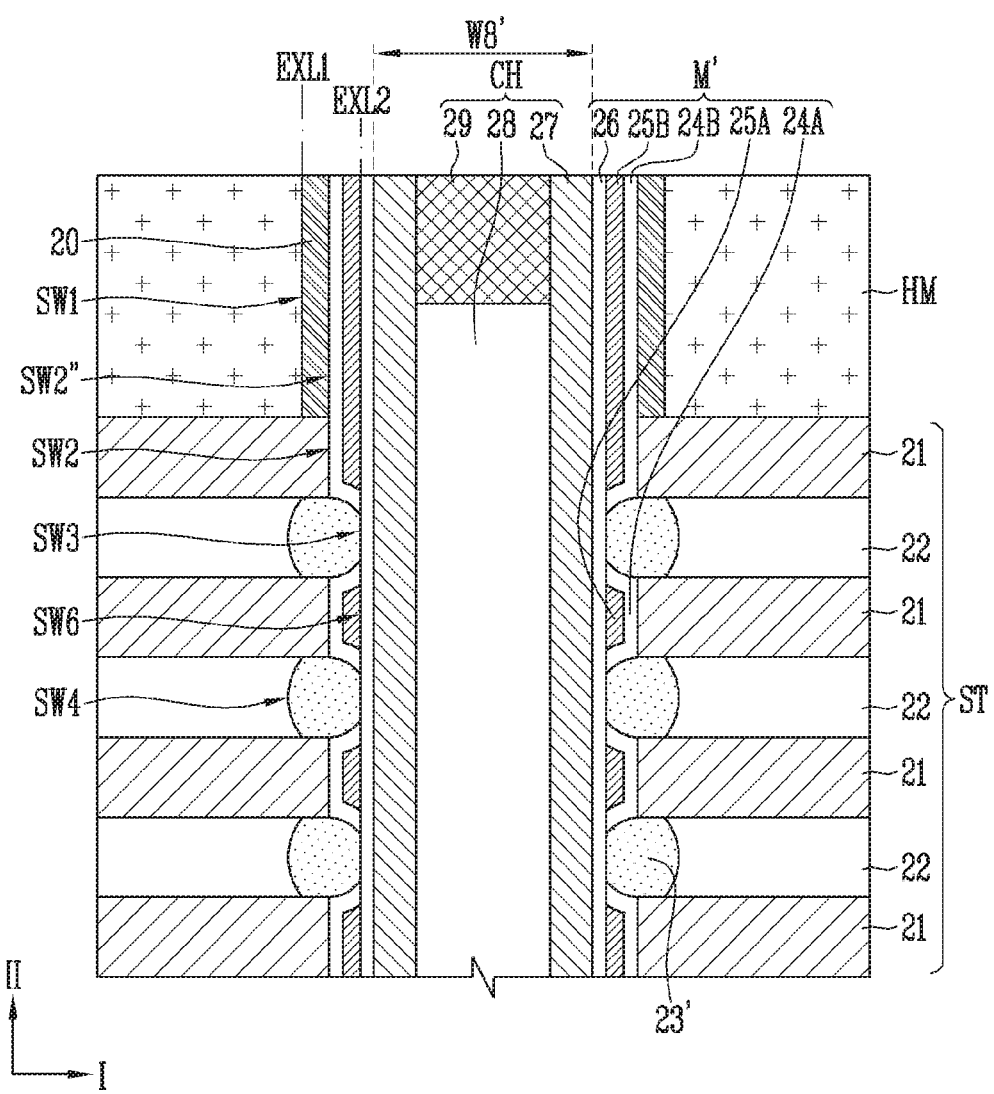

Referring to FIGS. 3C and 3D, a semiconductor device, according to an embodiment, may further include a first material pattern 20. The first material pattern 20 may be interposed between the channel structure CH and the hard mask pattern HM. The first material pattern 20 may be interposed between the memory layer M or M' and the hard mask pattern HM.

The first material pattern 20 may include a material with high etch selectivity with respect to the insulating layers 22. The insulating layers 22 may include an oxide, and the first material pattern 20 may include a nitride. Both the first material pattern 20 and the hard mask pattern HM may include a nitride, and the first material pattern 20 may have high etch selectivity with respect to the hard mask pattern HM. The hard mask pattern HM may be a nitride with a dopant such as carbon.

The channel structure CH may pass through the stacked structure ST and the hard mask pattern HM. The channel structure CH may include the channel layer 27 and may further include at least one of the gap-fill layer 28 and the capping layer 29.

The second sidewall SW2 of each of the conductive layers 21 may protrude farther towards the channel structure CH than the first sidewall SW1 of the hard mask pattern HM. A sidewall SW2" of the first material pattern 20 may be located on an extending line of the second sidewall SW2. The memory layer M or M' and the channel layer 27 may be formed along the sidewall SW2" of the first material pattern 20. Therefore, a portion of the channel structure CH that passes through the hard mask pattern HM may have an eighth width W8'. In addition, because the first material pattern 20 may compensate for the distance between the first sidewall SW1 and the second sidewall SW2, the first material pattern 20 may prevent a step from being produced on a sidewall of the channel structure CH in a boundary between the hard mask pattern HM and the stacked structure ST.

Referring to FIG. 3C, the memory layer M may include at least one of the blocking layer 24, the data storage layer 25, and the tunnel insulating layer 26. The data storage layer 25 may include protrusions that protrude between the insulating patterns 23. The insulating patterns 23 may have a shape that is similar to one of the insulating patterns 13 that are described with reference to FIGS. 1B to 1D or a combination of shapes of insulating patterns 13 that are described with reference to FIGS. 1B to 1D. The third sidewall SW3 of each of the insulating patterns 23 may protrude farther towards the channel structure CH than the first sidewall SW1. The third sidewall SW3 may protrude farther towards the channel structure CH than the second sidewall SW2 and the sidewall SW2" of the first material pattern 20.

Referring to FIG. 3D, the memory layer M' may include at least one of the first blocking patterns 24A, the second blocking pattern 24B, the first data storage patterns 25A, the second data storage pattern 25B, and the tunnel insulating layer 26. The insulating patterns 23' may have a similar shape to one of the insulating patterns 13' that are described with reference to FIGS. 2B to 2D or a combination of shapes of the insulating patterns 13' that are described with reference to FIGS. 2B to 2D. The third sidewall SW3 of each of the insulating patterns 23' may protrude farther towards the channel structure CH than the first sidewall SW1. The third sidewall SW3 may protrude farther towards the channel structure CH than the second sidewall SW2 and the sidewall SW2" of the first material pattern 20. The sixth sidewall SW6 of each of the first data storage patterns 25A may be located on the second extending line EXL2 of the third sidewall SW3.

According to the structure that is described with reference to FIGS. 3C and 3D, the second sidewall SW2 of each of the conductive layers 21 may protrude farther towards the channel structure CH than the first sidewall SW1 of the hard mask pattern HM. In addition, the third sidewall SW3 of each of the insulating patterns 23 or 23' may protrude farther towards the channel structure CH than the second sidewall SW2 of each of the conductive layers 21. Therefore, the first data storage patterns 25A may be separated from each other. Therefore, according to the above-described structure, data retention characteristics may be improved, and the interference between the memory cells that are stacked may be reduced.

Figure 4A:
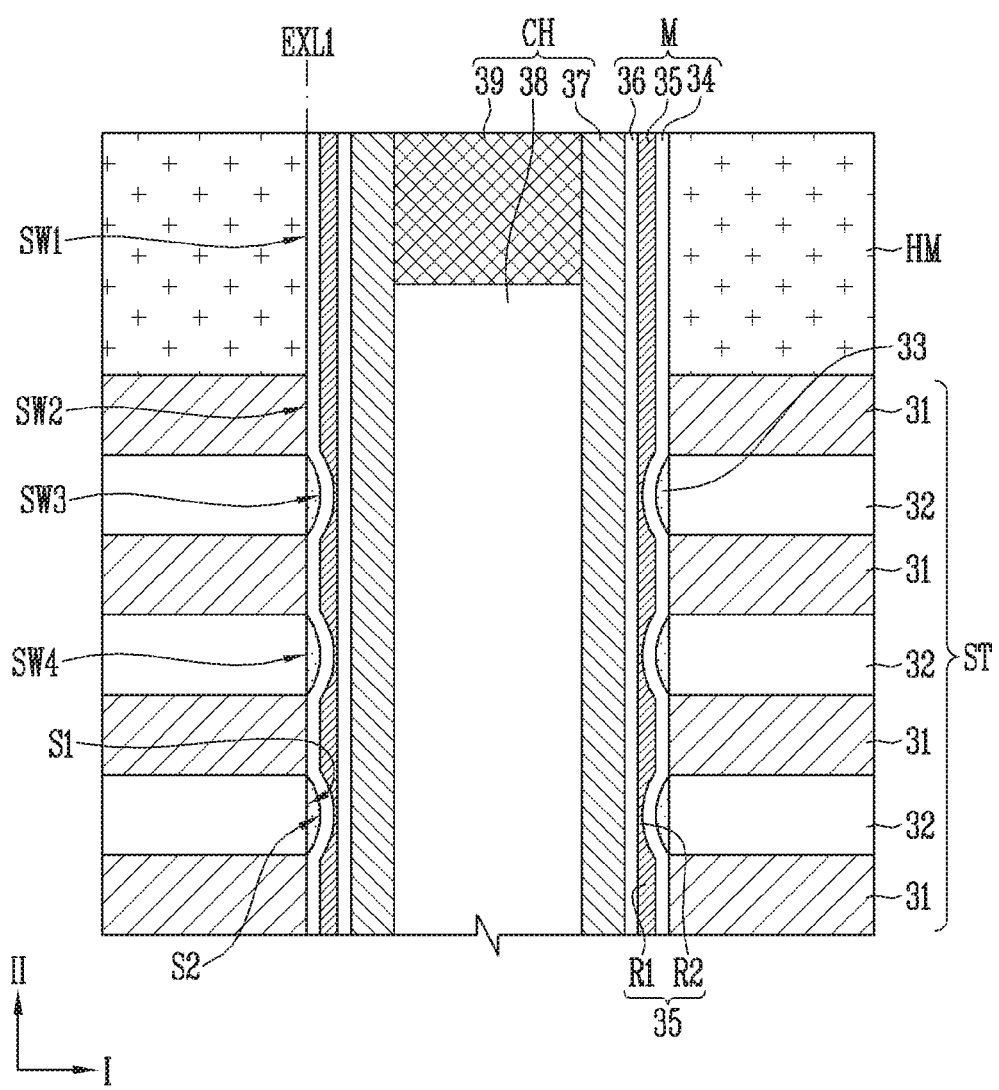
FIGS. 4A and 4B are diagrams, illustrating the structure of a semiconductor device, according to an embodiment.
Figure 4B:
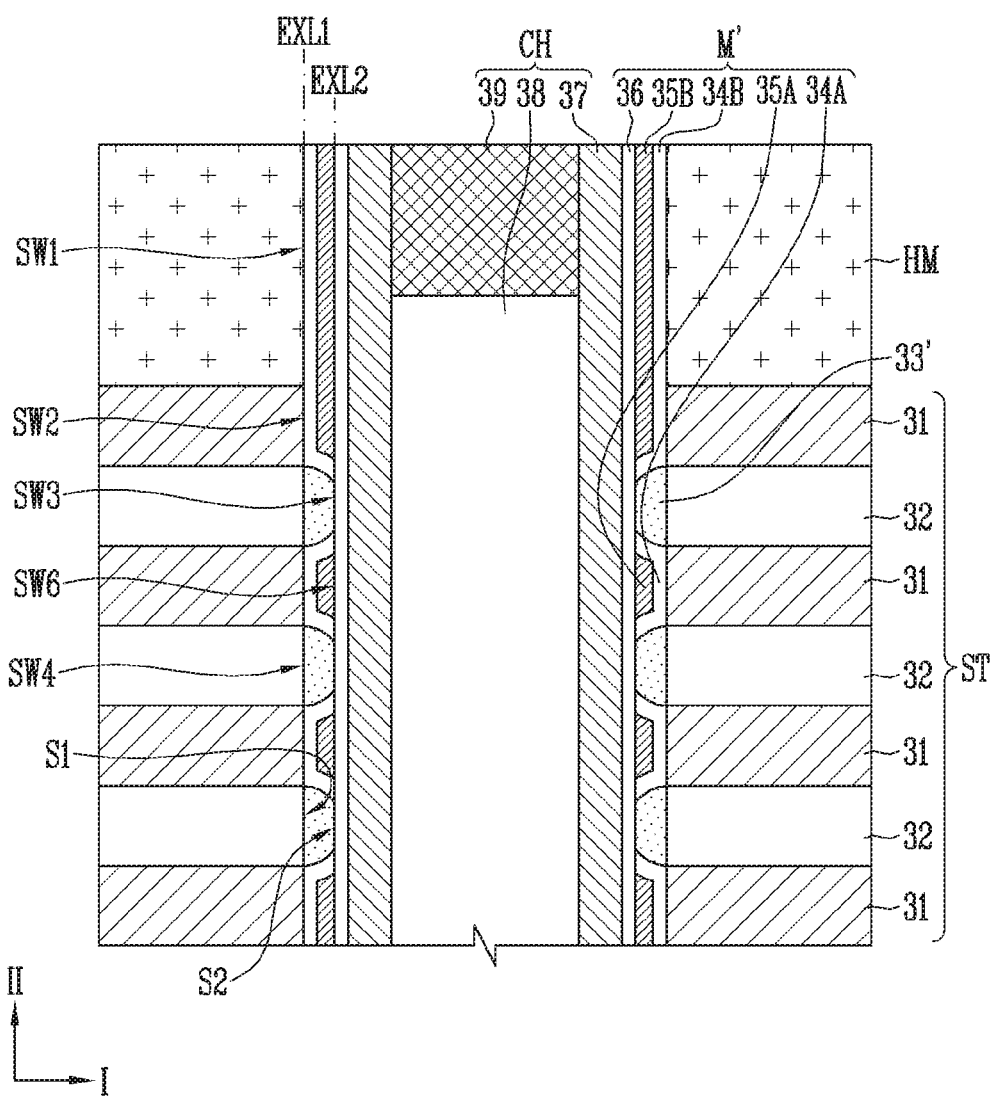

FIGS. 4A and 4B are diagrams, illustrating the structure of a semiconductor device, according to an embodiment. Hereinafter, any repetitive descriptions of components that have already been mentioned above will be omitted.

Referring to FIGS. 4A and 4B, a semiconductor device may include the stacked structure ST, the hard mask pattern HM, the channel structure CH, insulating patterns 33 or 33', and the memory layer M or M'. The stacked structure ST may include conductive layers 31 and insulating layers 32 that are alternately stacked on each other. The hard mask pattern HM may be located on the stacked structure ST. The channel structure CH may pass through the stacked structure ST and the hard mask pattern HM. The channel structure CH may include the channel layer 37 and may further include at least one of a gap-fill layer 38 and a capping layer 39.

The insulating patterns 33 or 33' may be interposed between the insulating layers 32 and the channel structure CH. The insulating patterns 33 or 33' and the insulating layers 32 may be formed through different deposition methods. In addition, the insulating patterns 33 or 33' and the insulating layers 32 may have different properties of matter. For example, properties of matter, such as a nitrogen concentration, an etch rate, thermal stability, and dielectric strength, may be different.

The insulating layers 32 may be formed through a Chemical Vapor Deposition (CVD) method. The insulating layers 32 may be deposited at a relatively high temperature and at a relatively high speed. The insulating patterns 33 or 33' may be formed through a selective deposition method or an Atomic Layer Deposition (ALD) method. The insulating patterns 33 or 33' may be deposited at a relatively low temperature and at a relatively low speed. Therefore, the insulating layers 32 may have superior films compared to the insulating patterns 33 or 33'. The insulating patterns 33 or 33' may have lower thermal stability, lower dielectric strength, and a higher etch rate than the insulating layers 32.

The third sidewall SW3 of each of the insulating patterns 33 or 33' may protrude farther towards the channel structure CH than the first sidewall SW1. The third sidewall SW3 may protrude farther towards the channel structure CH than the second sidewall SW2. The second sidewall SW2 of each of the conductive layers 31 may be located on the first extending line EXL1 of the first sidewall SW1 of the hard mask pattern HM. The fourth sidewall SW4 of each of the insulating layers 32 may be located on the first extending line EXL1 of the first sidewall SW1.

Referring to FIG. 4A, the memory layer M may be interposed between the stacked structure ST and the channel structure CH. The memory layer M may include at least one of a blocking layer 34, a data storage layer 35, and a tunnel insulating layer 36. The data storage layer 35 may include the first region R1 and the second region R2 with different thicknesses from each other. The first region R1 may include a protrusion protruding between the adjacent insulating patterns 33.

Each of the insulating patterns 33 may include the first surface S1 that faces the insulating layer 32 and the second surface S2 that faces the channel structure CH. The first surface S1 may be flat and may be located on the first extending line EXL1 of the first sidewall SW1. The second surface S2 may be a surface defined by a deposition process and may include a curved surface.

Referring to FIG. 4B, the memory layer M' may be interposed between the stacked structure ST and the channel structure CH. The memory layer M' may include at least one of first blocking patterns 34A, a second blocking pattern 34B, first data storage patterns 35A, a second data storage pattern 35B, and the tunnel insulating layer 36. The first blocking patterns 34A may be located between the insulating patterns 33' and may be separated from each other. The second blocking pattern 34B may extend to the first sidewall SW1 of the hard mask pattern HM. The first data storage patterns 35A may be located between the insulating patterns 33' and may be separated from each other. The second data storage pattern 35B may extend to the first sidewall SW1 of the hard mask pattern HM.

Each of the insulating patterns 33' may include the first surface S1 that faces the insulating layer 32 and the second surface S2 that faces the channel structure CH. Each of the first surface S1 and the second surface S2 may include a plane. The first surface S1 may be flat and the second surface S2 may include a curved surface and a plane.

The sixth sidewall SW6 of each of the first and second data storage patterns 35A and 35B may be located on the second extending line EXL2 of the third sidewall SW3.

According to the above-described structure, the third sidewall SW3 of the insulating patterns 33 or 33' may protrude farther towards the channel structure CH than the second sidewall SW2 of each of the conductive layers 31. Therefore, according to the above-described structure, the movement of charges between memory cells, which share the channel structure CH and the memory layer M or M' and neighbor each other in the second direction II, may be mitigated. In addition, according to the above-described structure, data retention characteristics may be improved, and the interference between memory cells that are stacked may be reduced.

FIGS. 5A to 5E are diagrams, illustrating a method of manufacturing a semiconductor device, according to an embodiment. Hereinafter, any repetitive descriptions of components that have already been mentioned above will be omitted.

Figure 5A:
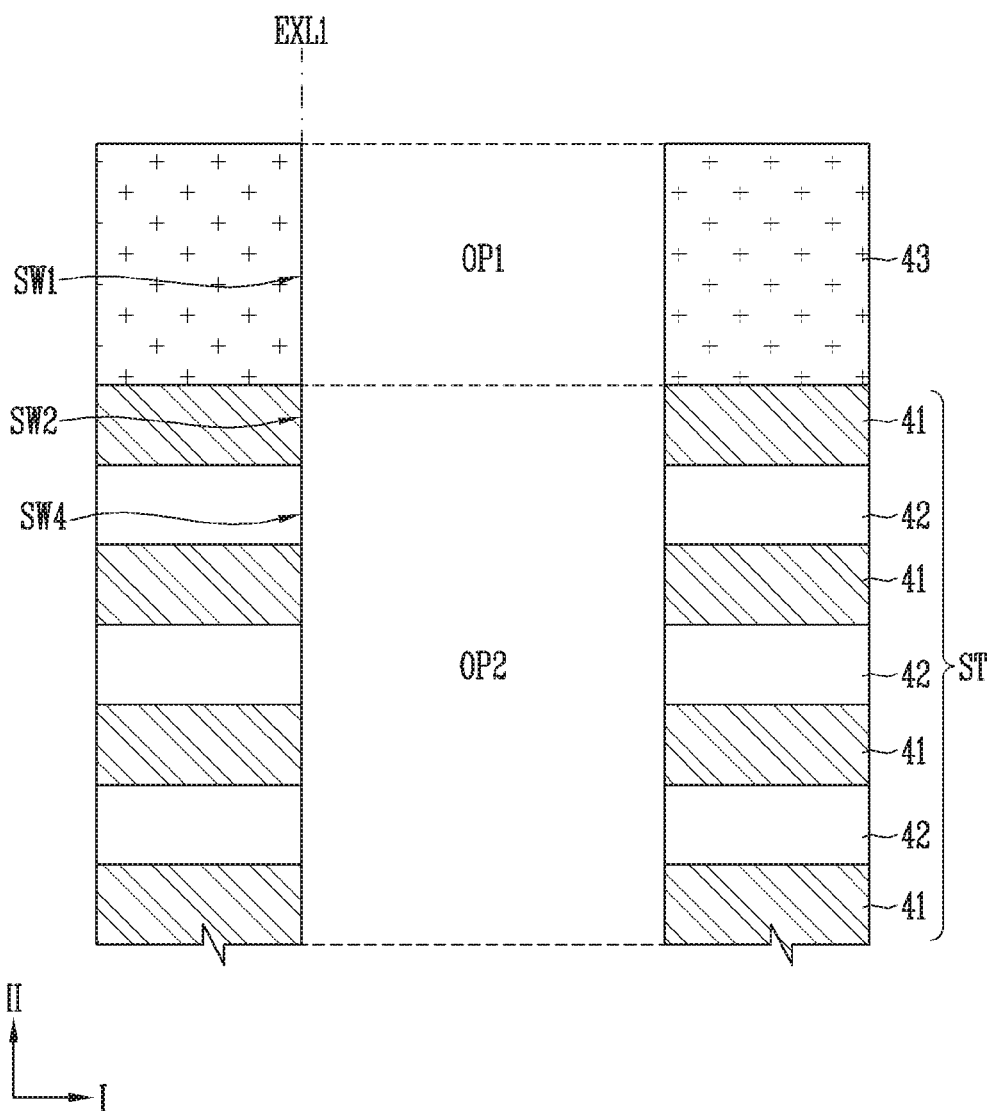

Referring to FIG. 5A, the stacked structure ST may be formed. The stacked structure ST may include first material layers 41 and second material layers 42 that are alternately stacked on each other. The first and second material layers 41 and 42 may be stacked in the second direction II. The first and second material layers 41 and 42 may be formed through a deposition process such as a Chemical Vapor deposition (CVD) process.

The first material layers 41 may include a material with high etch selectivity with respect to the second material layers 42. For example, the first material layers 41 may include a sacrificial material, such as a nitride, and the second material layers 42 may include an insulating material such as an oxide. In other examples, the first material layers 41 may include a conductive material, such as polysilicon or tungsten, and the second material layers 42 may include an insulating material, such as an oxide.

Subsequently, a hard mask pattern 43 may be formed on the stacked structure ST. The hard mask pattern 43 may include a material with etch selectivity with respect to the second material layers 42. The hard mask pattern 43 may include a nitride, a carbon-based material, or a combination thereof. The hard mask pattern 43 may include a first opening OP1. The first sidewall SW1 of the hard mask pattern 43 may be defined by the first opening OP1. The first sidewall SW1 may be an etched surface and may be flat. The hard mask pattern 43 may be formed by forming a hard mask layer on the stacked structure ST and then patterning the hard mask layer. The first opening OP1 may have a uniform width or a width that decreases from an upper portion towards a lower portion of the first opening OP1.

Subsequently, a second opening OP2 that passes through the stacked structure ST may be formed. The second opening OP2 may be formed by etching the stacked structure ST using the hard mask pattern 43 as an etching barrier. The second opening OP2 may be coupled to the first opening OP1.

The second opening OP2 may pass through the stacked structure ST in the second direction II. The second opening OP2 may have a uniform width or a width that decreases from an upper portion towards a lower portion of the second opening OP2. The second sidewall SW2 of each of the first material layers 41 and the fourth sidewall SW4 of each of the second material layers 42 may be defined by the second opening OP2. The second sidewall SW2 and the fourth sidewall SW4 may be an etched surface and may be flat. The second sidewall SW2 and the fourth sidewall SW4 may be located on the first extending line EXL1 of the first sidewall SW1.

Referring to FIG. 5B, third openings OP3 may be formed by selectively etching the second material layers 42. The third openings OP3 may be coupled to the second opening OP2. A fourth sidewall SW4' of each of the second material layers 42 may be newly defined by the third openings OP3. The fourth sidewall SW4' may recede from the first extending line EXL1 and may be spaced apart farther from the second opening OP2 than the second sidewall SW2. The fourth sidewall SW4' may be an etched surface and may be a plane or a curved surface.

Subsequently, seed patterns 44 may be formed in the third openings OP3, respectively. The seed patterns 44 may include silicon and may be polysilicon layers. The seed patterns 44 may be formed using a deposition process and an etching process. First, a seed material may be formed to fill the third openings OP3. The seed material may be formed using a deposition process. The seed material may be conformally formed along the inner surface of each of the first opening OP1, the second opening OP2, and the third openings OP3. Subsequently, the seed patterns 44 may be formed by etching the seed material. The seed patterns 44 may be formed by etching parts of the seed material that are formed in the first and second openings OP1 and OP2. The seed patterns 44 may be separated from each other.

Figure 5C:
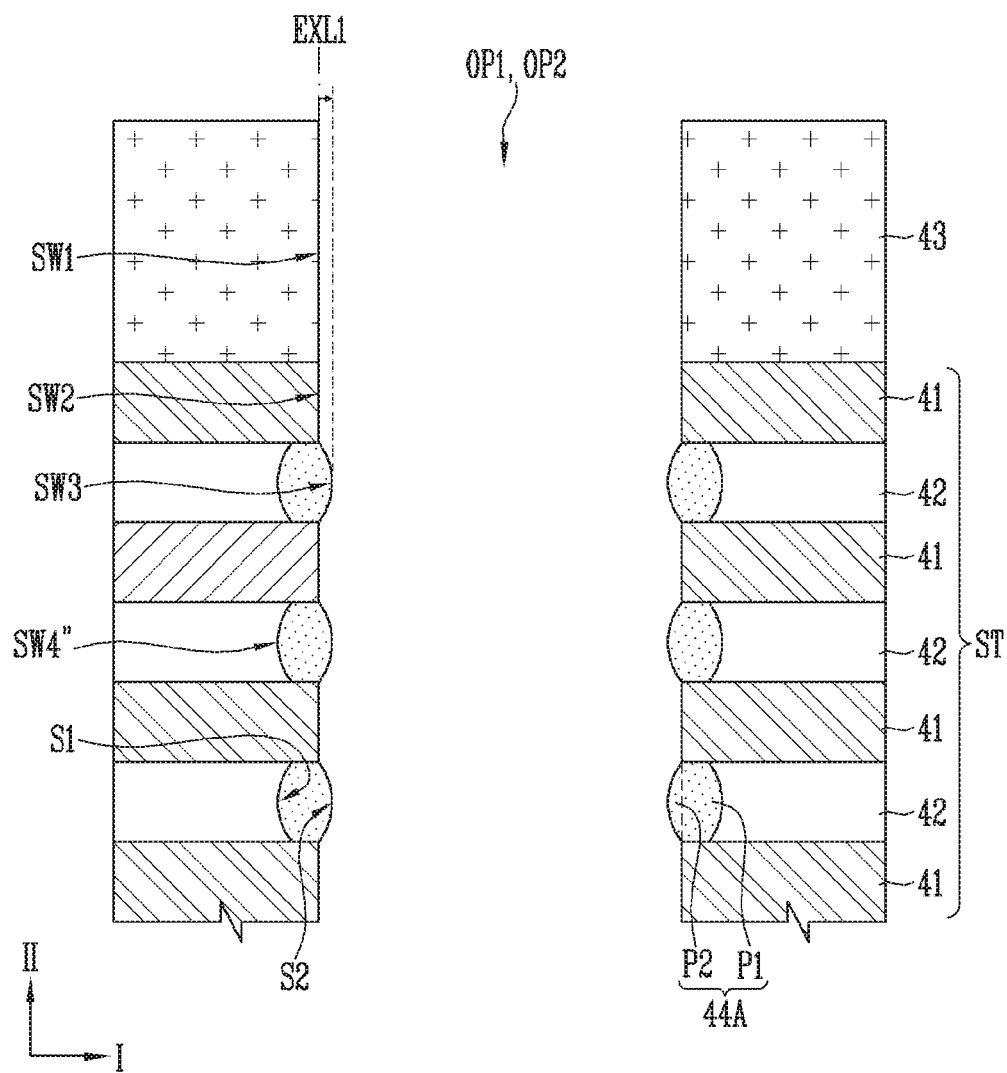

Referring to FIG. 5C, insulating patterns 44A may be formed on the second material layers 42, respectively. The insulating patterns 44A may protrude farther into the second opening OP2 than the first sidewall SW1. The third sidewall SW3 of each of the insulating patterns 44A may protrude farther into the second opening OP2 than the first extending line EXL1.

The insulating patterns 44A may be formed by oxidizing the seed patterns 44. The insulating patterns 44A formed through an oxidation method may have different properties of matter compared to the second material layers 42 formed through a deposition method. The insulating patterns 44A may have higher dielectric strength, a lower etch rate, and higher thermal stability than the second material layers 42. The insulating patterns 44A may have less defects than the second material layers 42. The insulating patterns 44A may have higher etch selectivity than the second material layers 42 and high etch selectivity with respect to a nitride or polysilicon.

A fourth sidewall SW4" of each of the second material layers 42 may be newly defined by an oxidation process. When the seed patterns 44 are oxidized, a part of each of the second material layers 42 may be oxidized at the same time. The fourth sidewall SW4" may recede from the first extending line EXL1. The fourth sidewall SW4" may be spaced apart farther from the second opening OP2 than the second sidewall SW2. The fourth sidewall SW4" may have a plane or a curved surface.

Each of the insulating patterns 44A may include the first portion P1, interposed between the adjacent first material layers 41 and the second portion P2, protruding farther towards the second opening OP2 than the second sidewall SW2. The first portion P1 may include the first surface S1 that contacts the second material layer 42, and the second portion P2 may include the second surface S2 that faces the first surface S1. Each of the first surface S1 and the second surface S2 may include a curved surface. The second surface S2 may correspond to the third sidewall SW3.

Figure 5D:
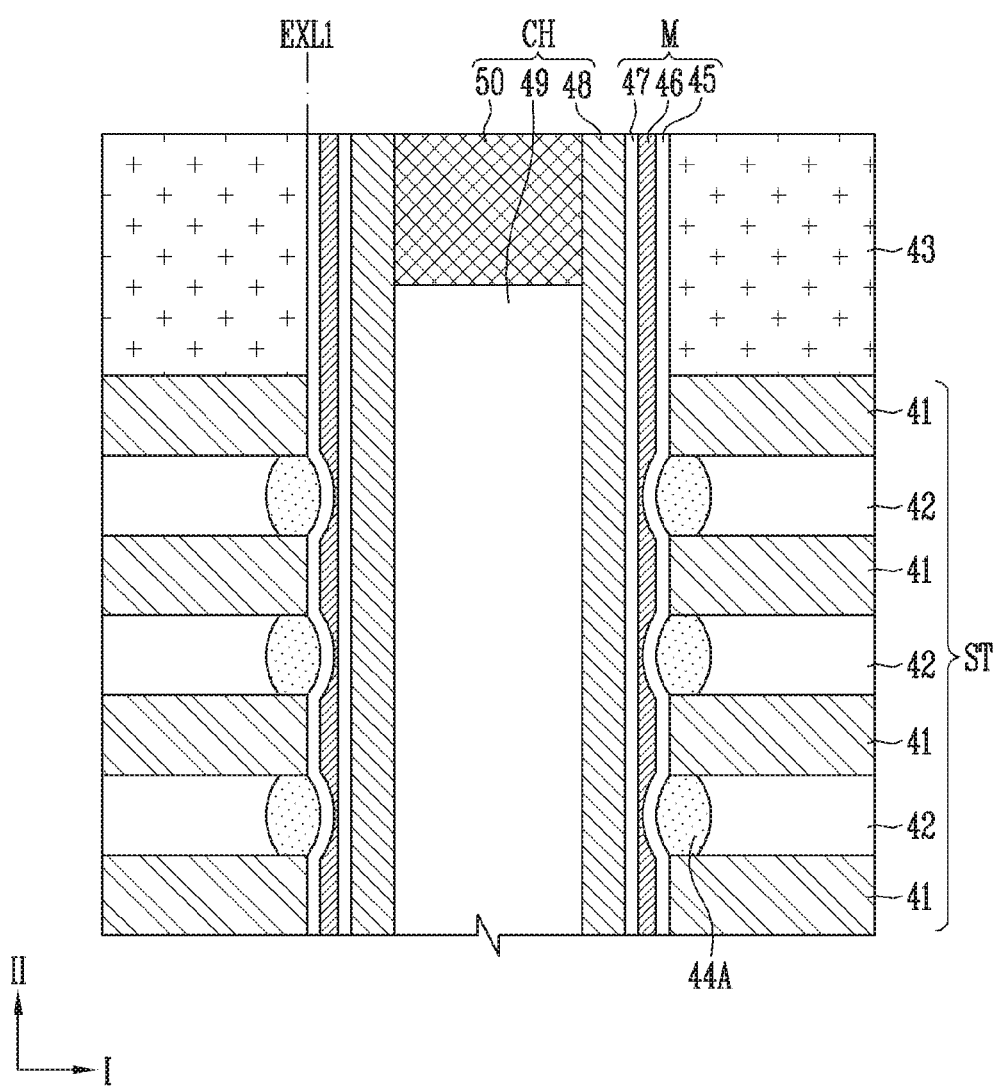

Referring to FIG. 5D, the memory layer M and the channel structure CH may be formed in the first and second openings OP1 and OP2. The memory layer M may include at least one of a blocking layer 45, a data storage layer 46, and a tunnel insulating layer 47. The channel structure CH may include at least one of a channel layer 48, a gap-fill layer 49, and a capping layer 50.

First, the blocking layer 45 may be formed in the first and second openings OP1 and OP2. The blocking layer 45 may be formed along the inner surfaces of the first and second openings OP1 and OP2 and along the second surface S2 of each of the protruding insulating patterns 44A. Subsequently, the data storage layer 46 may be formed on the inner surface of the blocking layer 45. The data storage layer 46 may be formed using a deposition process and an etching process. After a data storage material is deposited on the blocking layer 45, the data storage material is etched. Therefore, the data storage layer 46 with a flat inner surface and an uneven outer surface may be formed. The data storage layer 46 may fill the spaces between the insulating patterns 44A and may include protrusions that protrude between the insulating patterns 44A. Subsequently, the tunnel insulating layer 47 may be formed on the inner surface of the data storage layer 46. Subsequently, after the channel layer 48 is formed on the inner surface of the tunnel insulating layer 47, the gap-fill layer 49 may be formed in a space defined by the channel layer 48. Subsequently, after the gap-fill layer 49 is partially etched, the capping layer 50 may be formed.

Figure 5E:
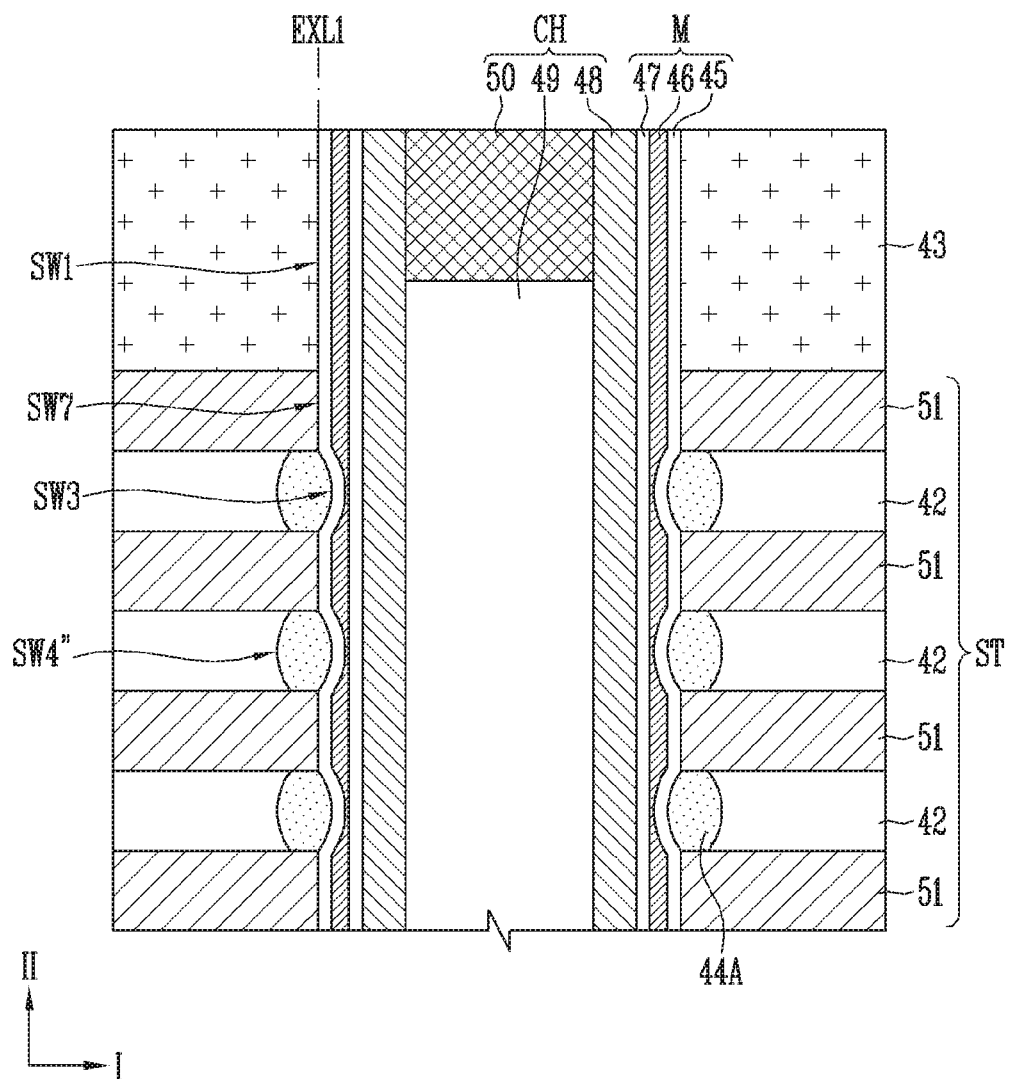

Referring to FIG. 5E, the first material layers 41 may be replaced by third material layers 51. For example, in the case where the first material layers 41 include a sacrificial material and the second material layers 42 include an insulating material, the first material layers 41 may be replaced by conductive layers. After the first material layers 41 are removed and then an additional memory layer or barrier layer is formed, the conductive layers may be formed. In other examples, in the case where the first material layers 41 include a conductive material and the second material layers 42 include an insulating material, the first material layers 41 may be silicidized.

The third sidewall SW3 of each of the insulating patterns 44A may protrude farther towards the channel structure CH than a seventh sidewall SW7 of each of the third material layers 51. The seventh sidewall SW7 may correspond to the second sidewall SW2 of each of the first material layers 41. The seventh sidewall SW7 may be located on the first extending line EXL1.

According to the above-described manufacturing method, the data storage layer 46 with a thickness that varies depending on the region thereof may be easily formed. In addition, because the insulating patterns 44A protrude farther than the first extending line EXL1, the data storage layer 46 may be easily formed without extending the width or the diameter of the second opening OP2 in the first direction I.

FIGS. 6A to 6D are diagrams, illustrating a method of manufacturing a semiconductor device, according to an embodiment. Hereinafter, any repetitive descriptions of components that have already been mentioned above will be omitted.

Figure 6A:
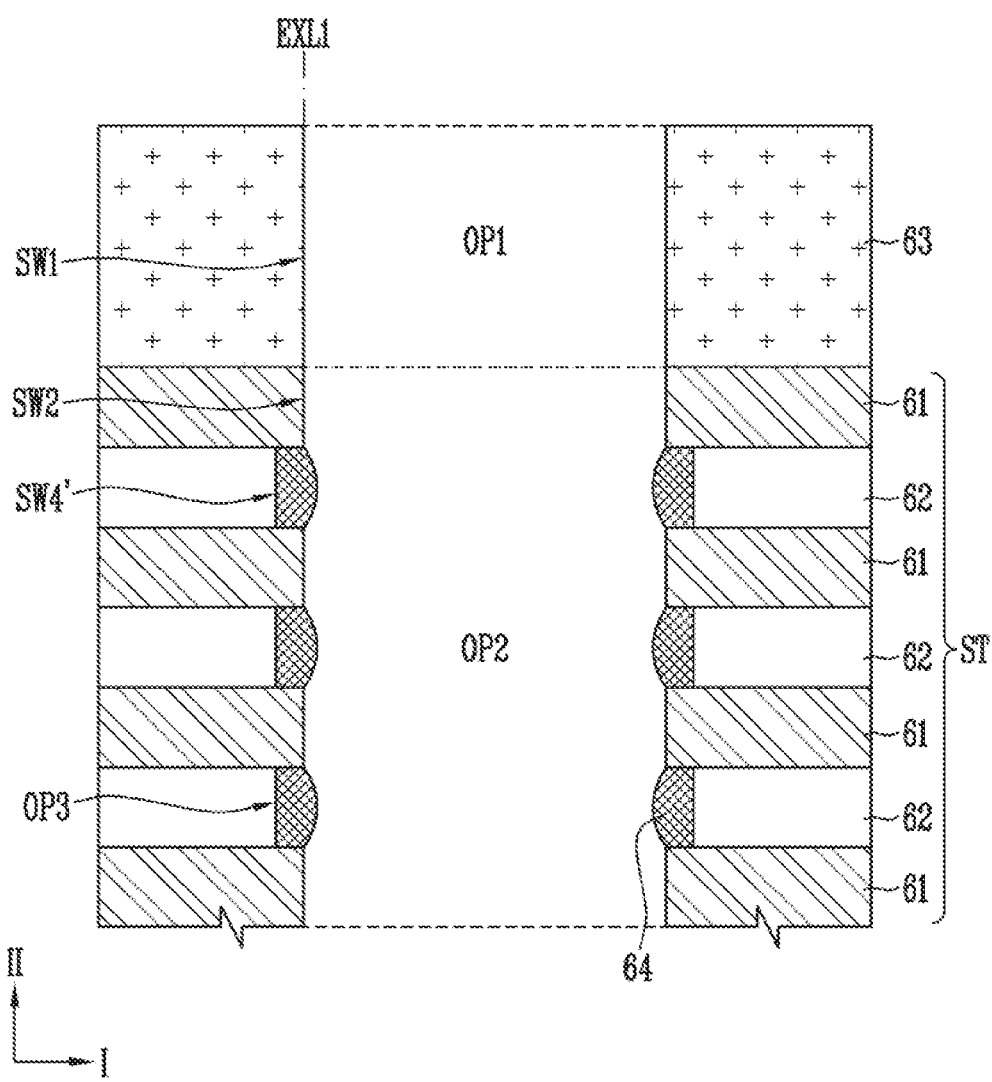
FIGS. 6A to 6D are diagrams, illustrating a method of manufacturing a semiconductor device, according to an embodiment.

Referring to FIG. 6A, the stacked structure ST may be formed. The stacked structure ST may include first material layers 61 and second material layers 62 that are alternately stacked on each other. The first and second material layers 61 and 62 may be formed through a deposition method, such as a Chemical Vapor Deposition (CVD) method. Subsequently, a hard mask pattern 63 may be formed on the stacked structure ST. The hard mask pattern 63 may include a material with etch selectivity with respect to the second material layers 62. The hard mask pattern 63 may include a nitride, a carbon-based material, or a combination thereof. The hard mask pattern 63 may include the first opening OP1. The first sidewall SW1 of the hard mask pattern 63 may be defined by the first opening OP1.

Subsequently, the second opening OP2 that passes through the stacked structure ST may be formed using the hard mask pattern 63 as an etching barrier. The second sidewall SW2 of each of the first material layers 61 may be defined by the second opening OP2. The second sidewall SW2 may be located on the first extending line EXL1 of the first sidewall SW1.

Subsequently, the third openings OP3 may be formed by selectively etching the second material layers 62. The fourth sidewall SW4' of each of the second material layers 62 may be defined by the third opening OP3. The fourth sidewall SW4' may be spaced apart farther from the second opening OP2 than the first sidewall SW1.

Subsequently, seed patterns 64 may be formed in the third openings OP3, respectively. The seed patterns 64 may include silicon and may be polysilicon layers. As described above with reference to FIG. 5B, the seed patterns 64 may be formed through deposition and etching processes. In addition, the size of the seed patterns 64 may be increased by growing a seed material on the seed patterns 64 through a selective growth process. According to this embodiment, the seed patterns 64 may have a greater size than the seed patterns according to the embodiment that is described above with reference to FIG. 5B. The seed patterns 64 may protrude farther into the second opening OP2 than the first extending line EXL1.

Figure 6B:
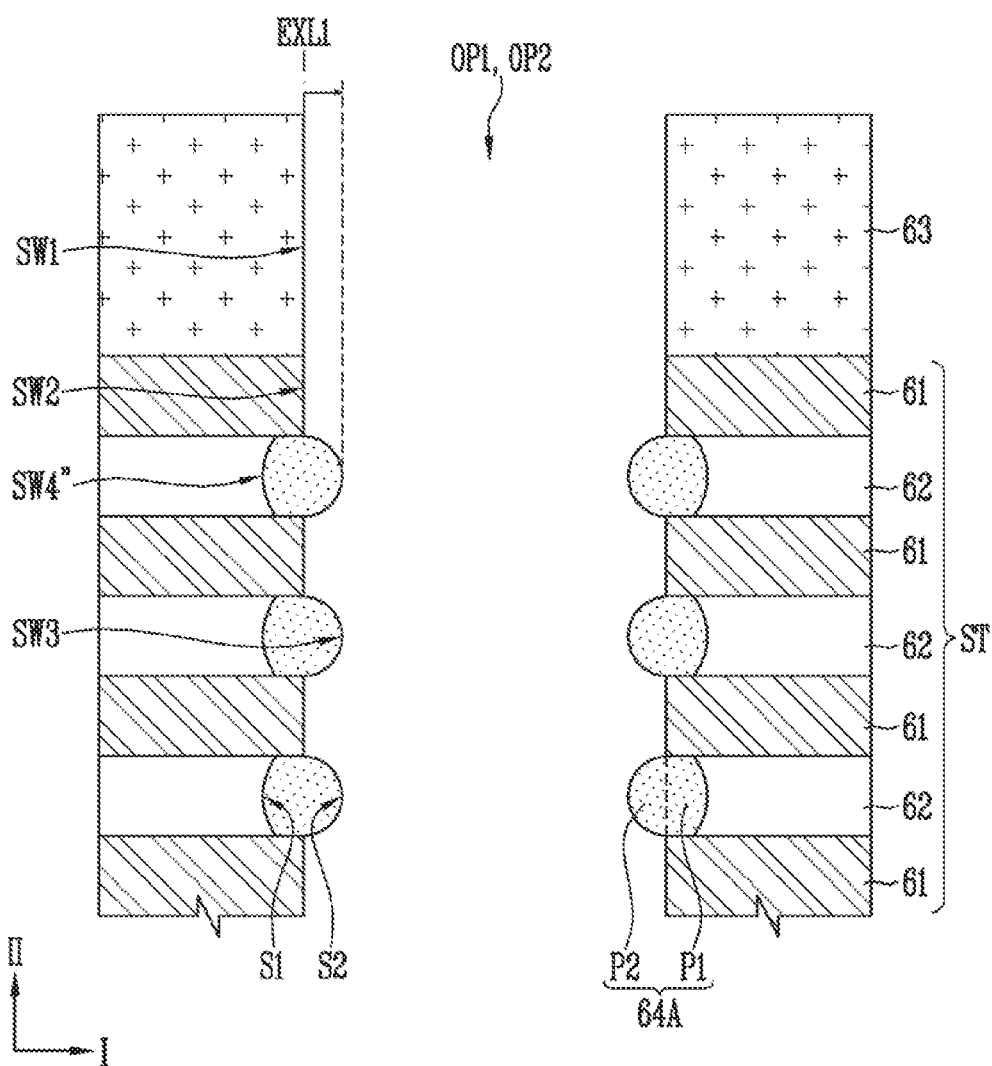

Referring to FIG. 6B, insulating patterns 64A may be formed on the second material layers 62, respectively. The third sidewall SW3 of each of the insulating patterns 64A may protrude farther into the second opening OP2 than the first extending line EXL1. The insulating patterns 64A may be formed by oxidizing the seed patterns 64. The insulating patterns 64A formed through an oxidation process may have different properties of matter compared to the second material layers 62 formed through a deposition process. The fourth sidewall SW4″ of each of the second material layers 62 may recede from the first extending line EXL1 by the oxidation process.

Each of the insulating patterns 64A may include the first portion P1, interposed between the adjacent first material layers 61 and the second portion P2, protruding farther towards the second opening OP2 than the second sidewall SW2. The first portion P1 may include the first surface S1 contacting the second material layer 62 and the second portion P2 may include the second surface S2 that faces the first surface S1. Each of the first surface S1 and the second surface S2 may include a curved surface. The second surface S2 may correspond to the third sidewall SW3.

Figure 6C:
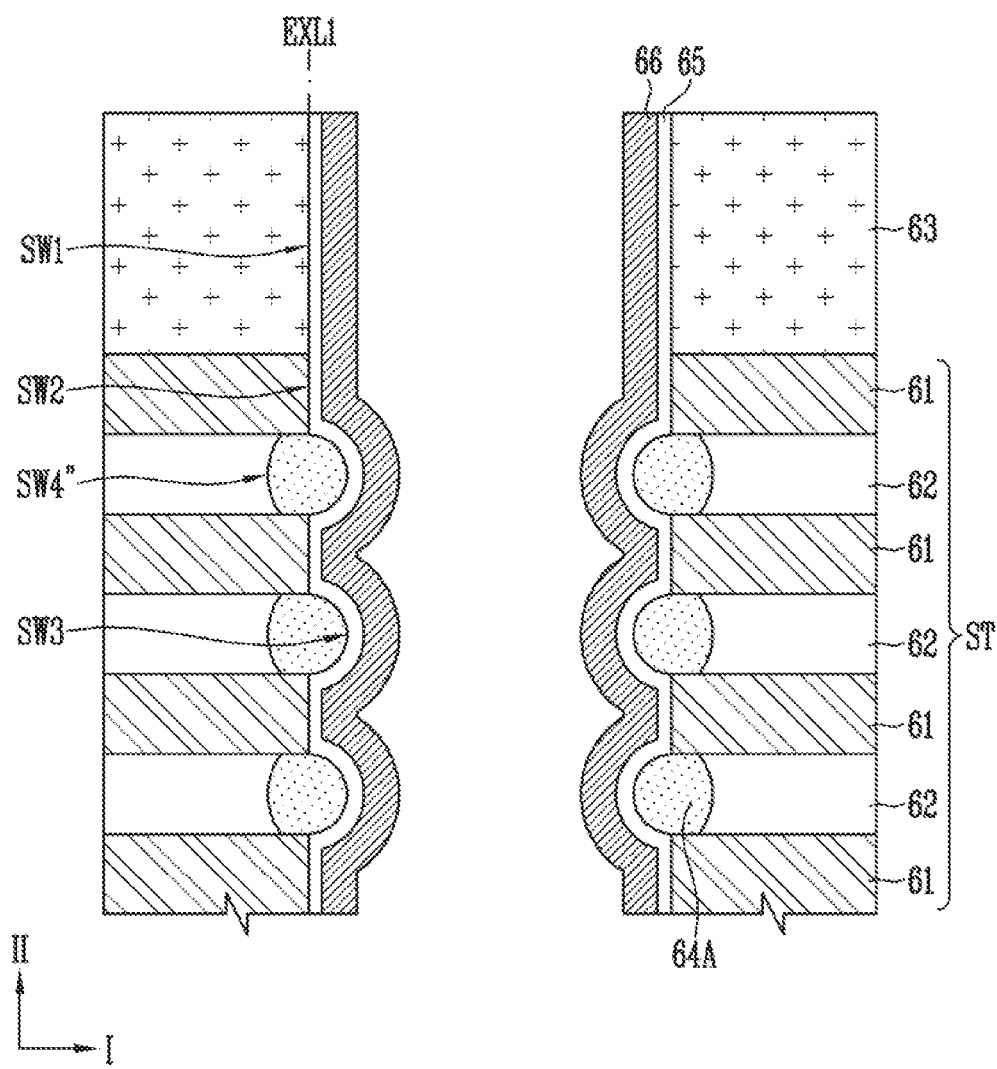

Referring to FIG. 6C, a blocking layer 65 may be formed in the first and second openings OP1 and OP2. The blocking layer 65 may be formed along the inner surfaces of the first and second openings OP1 and OP2. Subsequently, a data storage layer 66 may be formed on the inner surface of the blocking layer 65. The data storage layer 66 may be formed along the inner surface of the blocking layer 65 and may fill the spaces between the insulating patterns 64A.

Figure 6D:
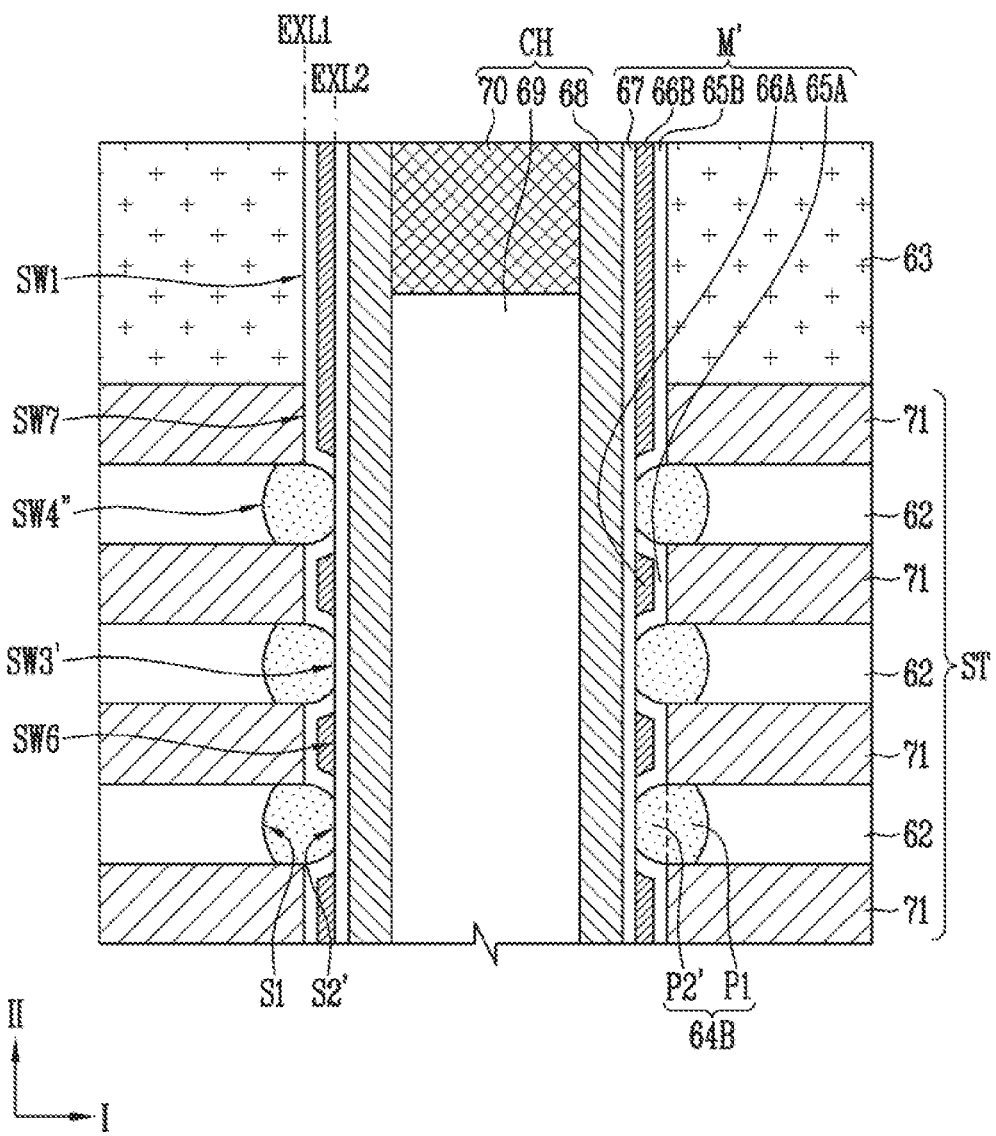

Referring to FIG. 6D, first data storage patterns 66A, a second data storage pattern 66B, first blocking patterns 65A, and a second blocking pattern 65B may be formed by etching the data storage layer 66 and the blocking layer 65. When the data storage layer 66 and the blocking layer 65 are etched, a part of each of insulating patterns 64B may be etched. The second portion P2 may be partially etched and an etched second portion P2' may include a second surface S2'. The second surface S2' may include a plane or may include a plane and a curved surface. The second surface S2' may correspond to a third sidewall SW3'.

The first and second blocking patterns 65A and 65B may be interposed between the first material layers 61 and the first and second data storage patterns 66A and 66B, respectively. The first and second blocking patterns 65A and 65B may be separated from each other. The first blocking patterns 65A may be located between the insulating patterns 64B and may be separated from each other. The second blocking pattern 65B may extend to the first sidewall SW1 of the hard mask pattern 63. The first and second data storage patterns 66A and 66B may be interposed between a tunnel insulating layer 67 and the first and second blocking patterns 65A and 65B, respectively. The first and second data storage patterns 66A and 66B may be separated from each other. The first data storage patterns 66A may be located between the insulating patterns 64B and may be separated from each other. The second data storage pattern 66B may extend to the first sidewall SW1. The sixth sidewall SW6 of each of the first and second data storage patterns 66A and 66B may be located on the second extending line EXL2 of the third sidewall SW3'.

Subsequently, the channel structure CH may be formed in the first and second openings OP1 and OP2. The channel structure CH may include a channel layer 68, a gap-fill layer 69, and a capping layer 70. Subsequently, the first material layers 61 may be replaced through third material layers 71. The third material layers 71 may be metal layers, silicide layers, or the like.

The third sidewall SW3' of each of the insulating patterns 64B may protrude farther towards the channel structure CH than the seventh sidewall SW7 of each of the third material layers 71. The seventh sidewall SW7 may correspond to the second sidewall SW2 of each of the first material layers 61. The seventh sidewall SW7 may be located on the first extending line EXL1.

According to the above-described manufacturing method, the first and second data storage patterns 66A and 66B that are separated from each other may be easily formed. In addition, because the insulating patterns 64B protrude farther towards the second opening OP2 than the first extending line EXL1, the first and second data storage patterns 66A and 66B may be easily formed without extending the width or the diameter of the second opening OP2 in the first direction I.

FIGS. 7A to 7D are diagrams, illustrating a method of manufacturing a semiconductor device, according to an embodiment. Hereinafter, any repetitive descriptions of components that have already been mentioned above will be omitted.

Referring to FIG. 7A, the stacked structure ST may be formed. The stacked structure ST may include first material layers 81 and second material layers 82 that are alternately stacked on each other. The first and second material layers 81 and 82 may be formed through a deposition method such as a Chemical Vapor Deposition (CVD) method. Subsequently, a hard mask pattern 83 may be formed on the stacked structure ST. The hard mask pattern 83 may include an oxide, a carbon-based material, or a combination thereof. The hard mask pattern 83 may include the first opening OP1. The first sidewall SW1 of the hard mask pattern 83 may be defined by the first opening OP1.

Subsequently, the second opening OP2 that passes through the stacked structure ST may be formed. The second opening OP2 may be formed by etching the stacked structure ST by using the hard mask pattern 83 as an etching barrier. The second sidewall SW2 of each of the first material layers 81 and the fourth sidewall SW4 of each of the second material layers 82 may be defined by the second opening OP2. The second sidewall SW2 and the fourth sidewall SW4 may be located on the first extending line EXL1 of the first sidewall SW1.

Subsequently, first material patterns 92 may be formed on the first material layers 81, respectively. The first material patterns 92 may be selectively grown on the first material layers 81, respectively. After a surface treatment is performed to accelerate the growth of a first material on a surface of each of the first material layers 81 or a surface treatment is performed to hinder the growth of the first material on a surface of each of the second material layers 82, the first material patterns 92 may be formed.

The first material patterns 92 may include a material with high etch selectivity with respect to the second material layers 82. The first material patterns 92 may include the same material or a similar material as the first material layers 81. The first material patterns 92 may include a nitride. A second sidewall SW2' of each of the first material patterns 92 may protrude farther into the second opening OP2 than the first sidewall SW1 and the fourth sidewall SW4.

Figure 7B:
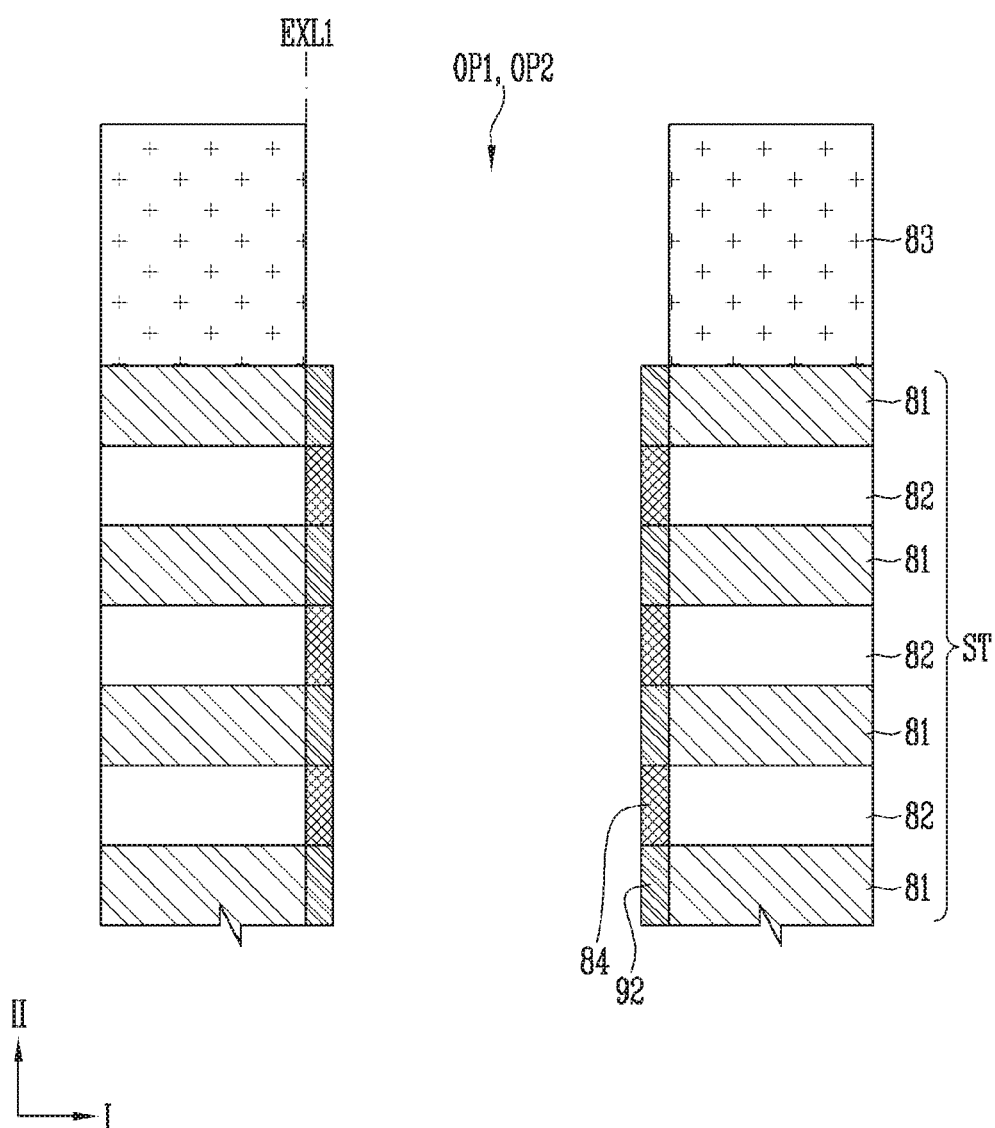

Referring to FIG. 7B, each of seed patterns 84 may be formed between the adjacent first material patterns 92. The seed patterns 84 may include silicon and may be polysilicon layers. The seed patterns 84 may be separated from each other. Although not illustrated in FIG. 7B, a seed material may remain on the sidewall of the hard mask pattern 83 during an etching process subsequent to a deposition process of the seed material. According to this embodiment, a seed pattern may also be formed on the sidewall of the hard mark pattern 83.

Figure 7C:
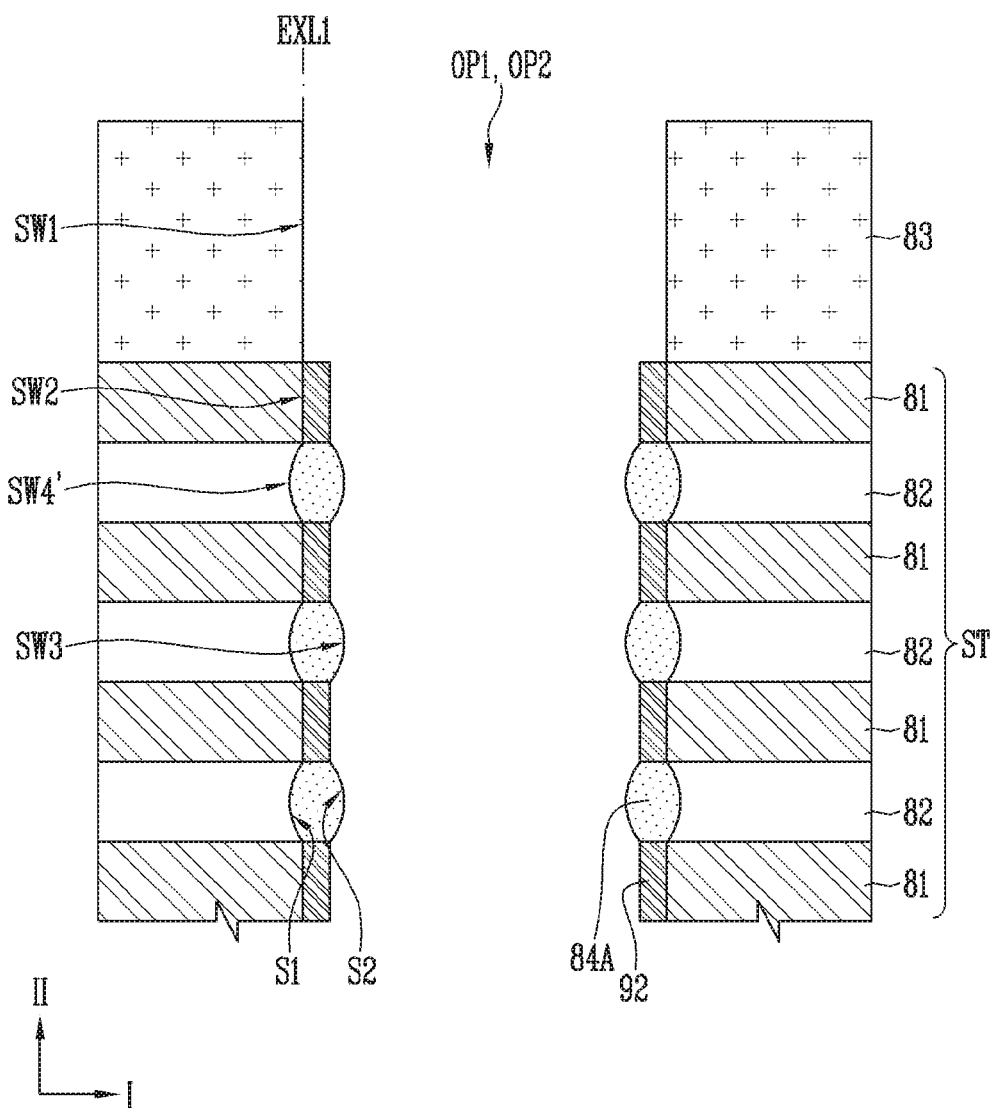

Referring to FIG. 7C, insulating patterns 84A may be formed on the second material layers 82, respectively. The insulating patterns 84A may protrude farther into the second opening OP2 than the first sidewall SW1. The third sidewall SW3 of each of the insulating patterns 84A may protrude farther into the second opening OP2 than the first extending line EXL1.

The insulating patterns 84A may be formed by selectively oxidizing the seed patterns 84. The insulating patterns 84A that are formed through an oxidation process may have different properties of matter compared to the second material layers 82 that are formed through a deposition process. A position of the fourth sidewall SW4' of each of the second material layers 82 may be changed through the oxidation process. The fourth sidewall SW4' may be located on the first extending line EXL1 or may recede from the first extending line EXL1. The fourth sidewall SW4' may be spaced apart farther from the second opening OP2 than the second sidewall SW2.

Each of the insulating patterns 84A may include the first surface S1 contacting the second material layer 82 and the second surface S2 that faces the first surface S1. Each of the first surface S1 and the second surface S2 may include a curved surface. The second surface S2 may correspond to the third sidewall SW3 and the first surface S1 may correspond to the fourth sidewall SW4'.

Figure 7D:
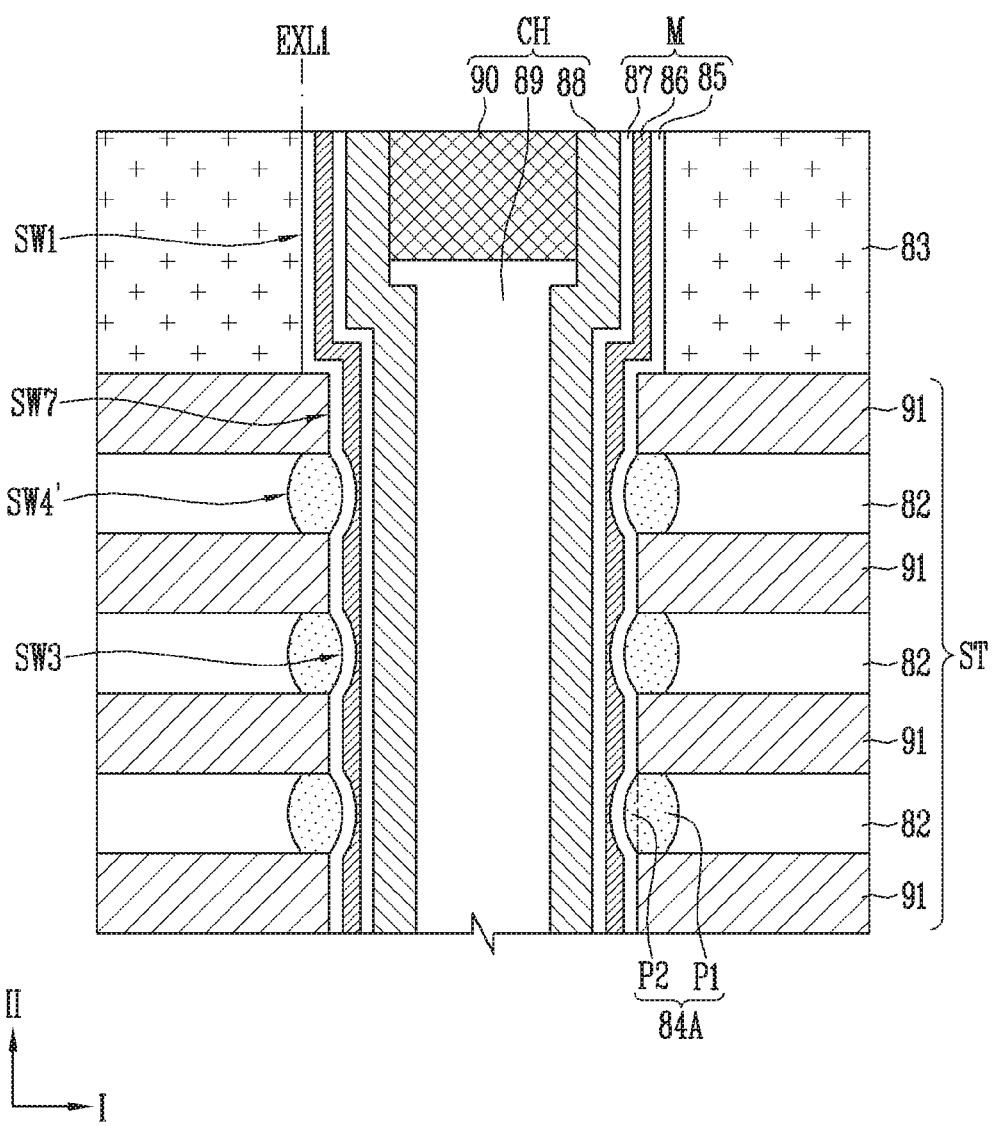

Referring to FIG. 7D, the memory layer M and the channel structure CH may be formed in the first and second openings OP1 and OP2. The memory layer M may include at least one of a blocking layer 85, a data storage layer 86, and a tunnel insulating layer 87. The channel structure CH may include at least one of a channel layer 88, a gap-fill layer 89, and a capping layer 90.

Subsequently, the first material layers 81 and the first material patterns 92 may be replaced through third material layers 91. The third material layers 91 may include metal layers, silicide layers, or the like.

The seventh sidewall SW7 of each of the third material layers 91 may protrude farther towards the channel structure CH than the first sidewall SW1. Each of the insulating patterns 84A may include the first portion P1, interposed between the adjacent third material layers 91 and the second portion P2, protruding farther towards the channel structure CH than the seventh sidewall SW7. The third sidewall SW3 of each of the insulating patterns 84A may protrude farther towards the channel structure CH than the first sidewall SW1 and the seventh sidewall SW7.

According to the above-described manufacturing method, the data storage layer 86 with a thickness that varies based on the region thereof may be easily formed. In addition, because the third material layers 91 and the insulating patterns 84A protrude farther than the first extending line EXL1, the data storage layer 86 may be easily formed without extending the width or the diameter of the second opening OP2 in the first direction I.

Figure 8B:
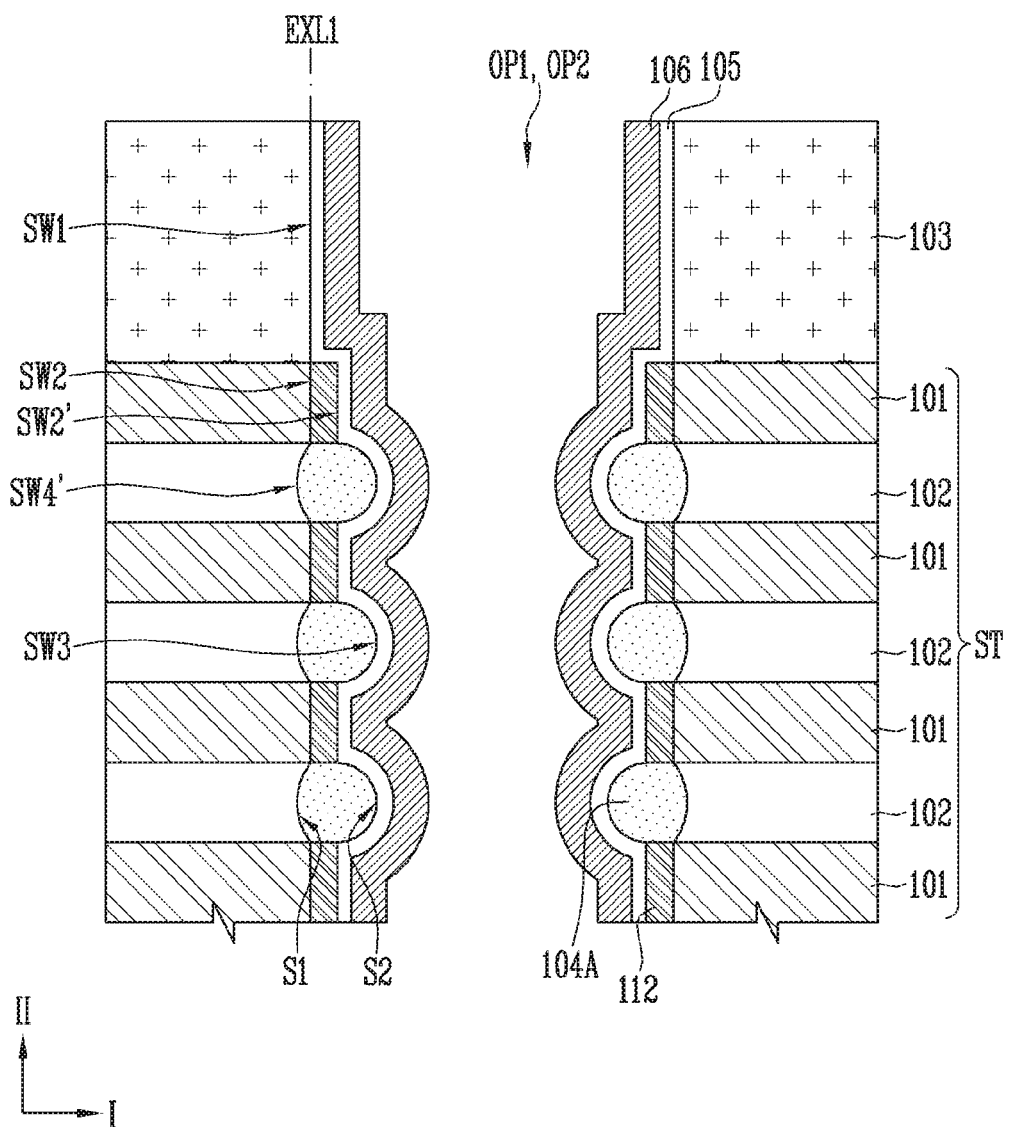
Figure 8C:
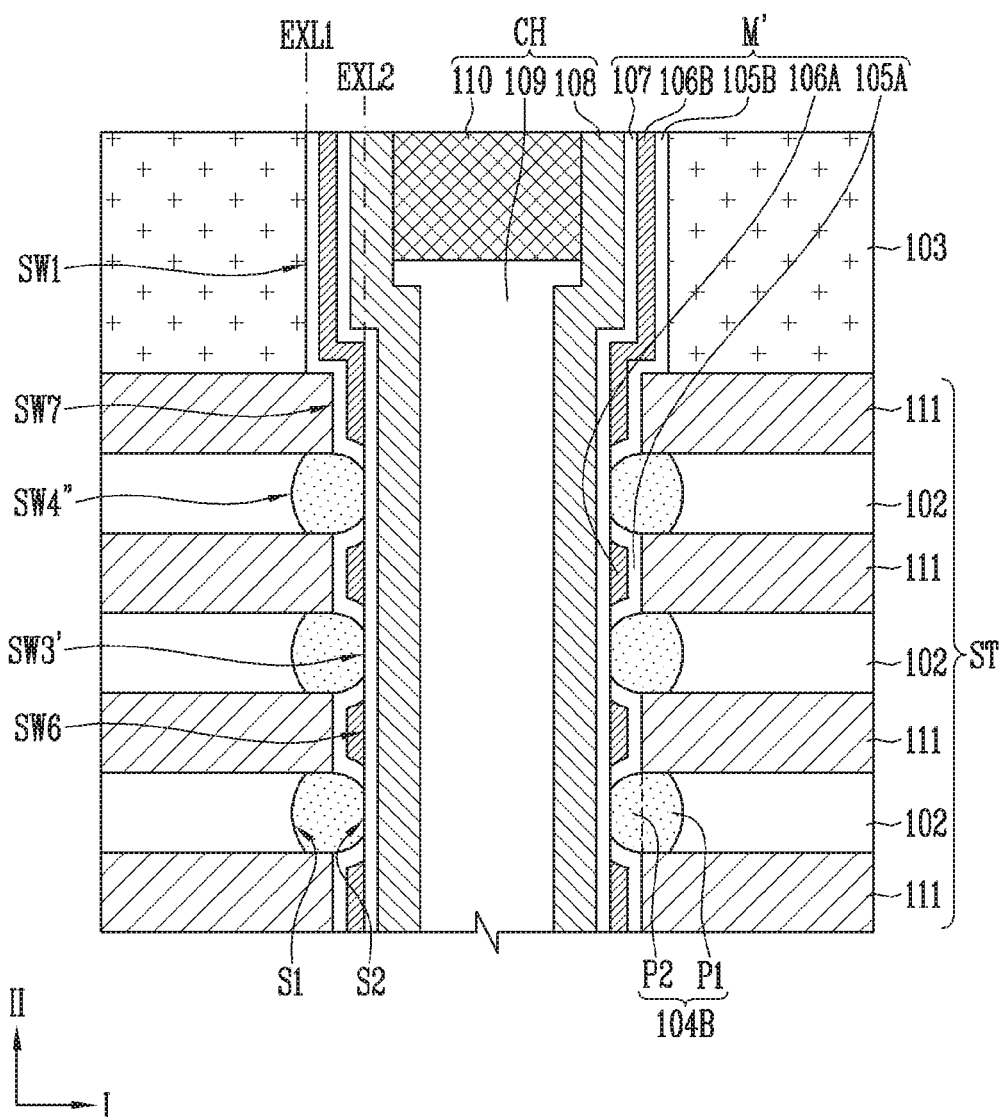

FIGS. 8A to 8C are diagrams, illustrating a method of manufacturing a semiconductor device, according to an embodiment. Hereinafter, any repetitive descriptions of components that have already been mentioned above will be omitted.

Referring to FIG. 8A, the stacked structure ST may be formed. The stacked structure ST may include first material layers 101 and second material layers 102 that are alternately stacked on each other. The first and second material layers 101 and 102 may be formed through a deposition method such as a Chemical Vapor Deposition (CVD) method. Subsequently, a hard mask pattern 103 may be formed on the stacked structure ST. The hard mask pattern 103 may include an oxide, a carbon-based material, or a combination thereof. The hard mask pattern 103 may include the first opening OP1. The first sidewall SW1 of the hard mask pattern 103 may be defined by the first opening OP1.

Subsequently, the second opening OP2 that passes through the stacked structure ST may be formed using the hard mask pattern 103 as an etching barrier. The second sidewall SW2 of each of the first material layers 101 and the fourth sidewall SW4 of each of the second material layers 102 may be defined by the second opening OP2. The second sidewall SW2 and the fourth sidewall SW4 may be located on the first extending line EXL1 of the first sidewall SW1. Subsequently, first material patterns 112 may be formed on the first material layers 101, respectively. The second sidewall SW2' of each of the first material patterns 112 may protrude farther into the second opening OP2 than the first sidewall SW1 and the fourth sidewall SW4.

Subsequently, each of seed patterns 104 may be formed between the adjacent first material patterns 112. The seed patterns 104 may include silicon and may be polysilicon layers. The size of the seed patterns 104 may be increased through selectively growing a seed material on the seed patterns 104. The seed patterns 104 may protrude farther into the second opening OP2 than the first extending line EXL1.

Referring to FIG. 8B, insulating patterns 104A may be formed on the second material layers 102, respectively. The third sidewall SW3 of each of the insulating patterns 104A may protrude farther into the second opening OP2 than the first extending line EXL1. The insulating patterns 104A may be formed by oxidizing the seed patterns 104. The insulating patterns 104A that are formed through an oxidation process, may have different properties of matter compared to the second material layers 102 that are formed through a deposition process. The fourth sidewall SW4' of each of the second material layers 102 may recede from the first extending line EXL1 through the oxidation process.

Subsequently, a blocking layer 105 may be formed in the first and second openings OP1 and OP2. Subsequently, a data storage layer 106 may be formed on the inner surface of the blocking layer 105. The data storage layer 106 may be formed along the inner surface of the blocking layer 105 and fill spaces between the insulating patterns 104A.

Referring to FIG. 8C, first data storage patterns 106A, a second data storage pattern 106B, first blocking patterns 105A, and a second blocking pattern 105B may be formed by etching the data storage layer 106 and the blocking layer 105. Subsequently, a tunnel insulating layer 107 may be formed in the first and second openings OP1 and OP2. Therefore, the memory layer M' may be formed.

When the data storage layer 106 and the blocking layer 105 are etched, a part of each of insulating patterns 104B may be etched. The second surface S2 of the second portion P2 may include a plane or may include a plane and a curved surface. The second surface S2 may correspond to the third sidewall SW3'.

The first blocking patterns 105A may be located between the insulating patterns 104B and may be separated from each other. The second blocking pattern 105B may extend to the first sidewall SW1 of the hard mask pattern 103. The first data storage patterns 106A may be located between the insulating patterns 104B and may be separated from each other. The second data storage pattern 106B may extend to the first sidewall SW1. The sixth sidewall SW6 of each of the first and second data storage patterns 106A and 106B may be located on the second extending line EXL2 of the third sidewall SW3'.

Subsequently, the channel structure CH may be formed in the first and second openings OP1 and OP2. The channel structure CH may include a channel layer 108, a gap-fill layer 109, and a capping layer 110. Subsequently, the first material layers 101 and the first material patterns 112 may be replaced through third material layers 111. The third material layers 111 may include metal layers, silicide layers, or the like.

The seventh sidewall SW7 of each of the third material layers 111 may protrude farther towards the channel structure CH than the first sidewall SW1. Each of the insulating patterns 104B may include the first portion P1, interposed between the adjacent third material layers 111 and the second portion P2, protruding farther towards the channel structure CH than the seventh sidewall SW7. The third sidewall SW3' of each of the insulating patterns 104B may protrude farther towards the channel structure CH than the first sidewall SW1 and the seventh sidewall SW7.

According to the above-described manufacturing method, the first and second data storage patterns 106A and 106B that are separated from each other may be easily formed. In addition, because the insulating patterns 104B protrude farther than the first extending line EXL1, the first and second data storage patterns 106A and 106B may be easily formed without extending the width or the diameter of the second opening OP2 in the first direction I.

Figure 9B:
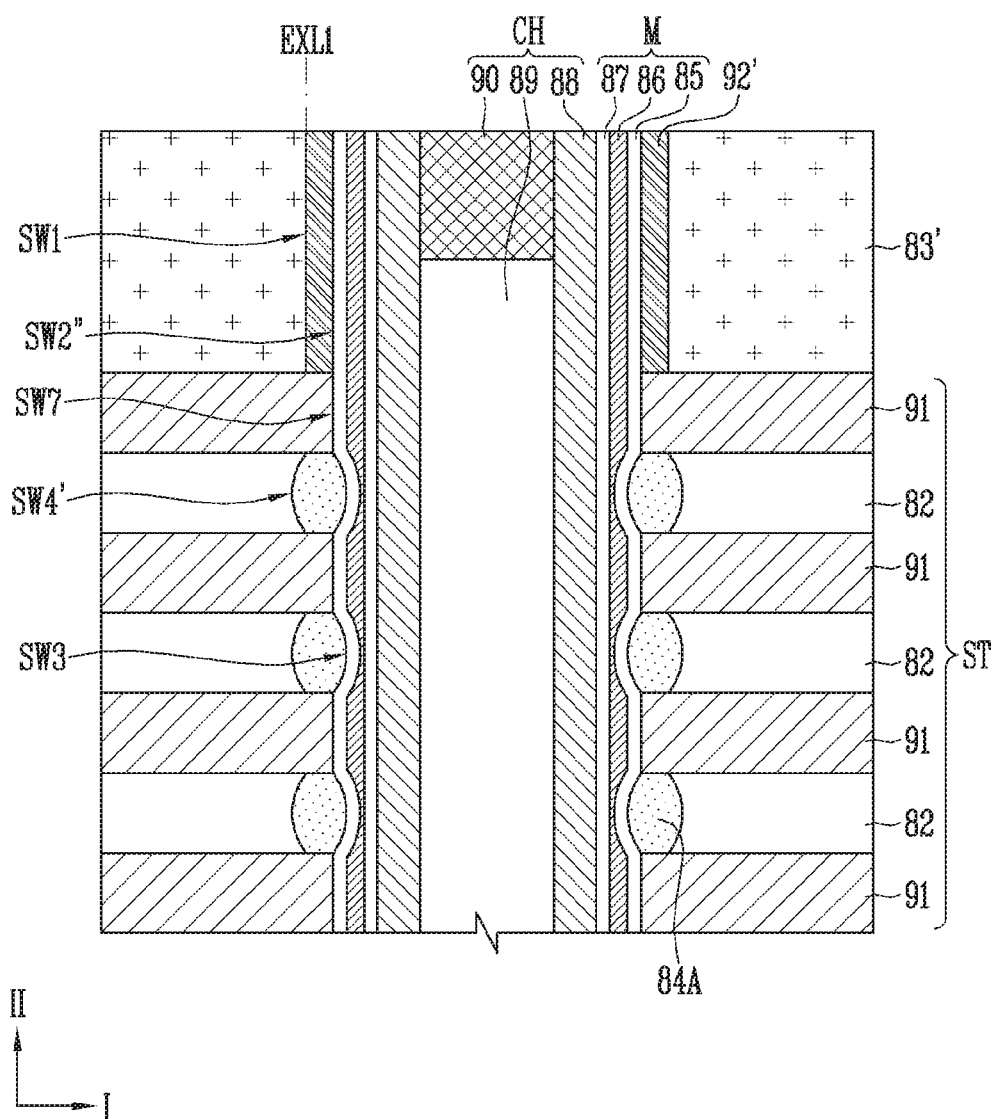

FIGS. 9A and 9B are diagrams, illustrating a method of manufacturing a semiconductor device, according to an embodiment. Hereinafter, any repetitive descriptions of components that have already been mentioned above will be omitted.

Referring to FIG. 9A, the stacked structure ST may be formed. The stacked structure ST may include the first material layers 81 and the second material layers 82 that are alternately stacked on each other. The first and second material layers 81 and 82 may be formed through a deposition method such as a Chemical Vapor Deposition (CVD) method. The first material layers 81 may include a nitride and the second material layers 82 may include an oxide.

Subsequently, a hard mask pattern 83' may be formed on the stacked structure ST. The hard mask pattern 83' may include the first opening OP1. The first sidewall SW1 of the hard mask pattern 83' may be defined by the first opening OP1. The hard mask pattern 83' may include a nitride and an impurity, such as carbon. The first material layers 81 may include a material with higher etch selectivity compared to the hard mask pattern 83'. The first material layers 81 may include silicon nitride (SiNx) layers, and the hard mask pattern 83' may include a silicon carbon nitride (SiCN) layer.

Subsequently, the second opening OP2 that passes through the stacked structure ST may be formed. The second opening OP2 may be formed by etching the stacked structure ST by using the hard mask pattern 83' as an etching barrier. The second sidewall SW2 and the fourth sidewall SW4 may be located on the first extending line EXL1 of the first sidewall SW1.

Subsequently, the first material patterns 92 may be selectively formed on the first material layers 81, respectively. Because the hard mask pattern 83' includes a nitride, a first material pattern 92' may be formed on the first sidewall SW1 of the hard mask pattern 83'. The first material pattern 92, formed on the first material layer 81 that contacts the hard mask pattern 83', and the first material pattern 92', formed on the hard mask pattern 83', may be a single layer by being coupled to each other.

The first material patterns 92 and 92' may include a material with high etch selectivity with respect to the second material layers 82 and the hard mask pattern 83'. The first material patterns 92 and 92' may include substantially the same material or a similar material as the first material layers 81. The first material patterns 92 and 92' may include a nitride. The second sidewall SW2' of each of the first material patterns 92 and the sidewall SW2" of the first material pattern 92' may protrude farther into the second opening OP2 than the first sidewall SW1 and the fourth sidewall SW4. Therefore, the width of the first opening OP1 may be reduced. In addition, a width of a part of the second opening OP2 which corresponds to each of the first material layers 81 may be reduced.

Subsequently, each of the seed patterns 84 may be formed between the adjacent first material patterns 92 and 92'. The seed patterns 84 may include silicon and may be polysilicon layers. The seed patterns 84 may be separated from each other.

Referring to FIG. 9B, the insulating patterns 84A may be formed on the second material layers 82, respectively. The insulating patterns 84A may be formed by selectively oxidizing the seed patterns 84. The insulating patterns 84A that are formed through an oxidation process may have different properties of matter compared to the second material layers 82 that are formed through a deposition process. The insulating patterns 84A may protrude farther into the second opening OP2 than the first sidewall SW1. The sidewall SW3 of each of the insulating patterns 84A may protrude farther into the second opening OP2 than the first extending line EXL1.

Subsequently, the memory layer M and the channel structure CH may be formed in the first and second openings OP1 and OP2. The memory layer M may include at least one of the blocking layer 85, the data storage layer 86, and the tunnel insulating layer 87. The channel structure CH may include at least one of the channel layer 88, the gap-fill layer 89, and the capping layer 90.

Subsequently, the first material layers 81 and the first material patterns 92 may be replaced through the third material layers 91. After a slit (not illustrated) that passes through the hard mask pattern 83' and the stacked structure ST is formed and then the first material layers 81 and the first material patterns 92 that are exposed through the slit are etched, the third material layers 91 may be formed in regions in which the first material layers 81 were removed. Because the first material layers 81 are selectively etched, the hard mask pattern 83' might not be etched and the first material pattern 92' might not be exposed. Therefore, the first material pattern 92' may remain between the memory layer M and the hard mask pattern 83'. Alternatively, a region of the first material pattern 92' that is adjacent to the first material pattern 92 may be partially etched, and the third material layer 91 may fill the etched region of the first material pattern 92' or a void may be defined to the etched region of the first material pattern 92'. The sidewall SW2" of the first material pattern 92' may be located on an extending line of the seventh sidewall SW7.

According to the above-described manufacturing method, the widths of the first opening OP1 and the second opening OP2 may be reduced using the first material patterns 92 and 92'. In addition, the data storage layer 86 with a thickness that varies based on the region thereof may be easily formed.

Figure 10A:
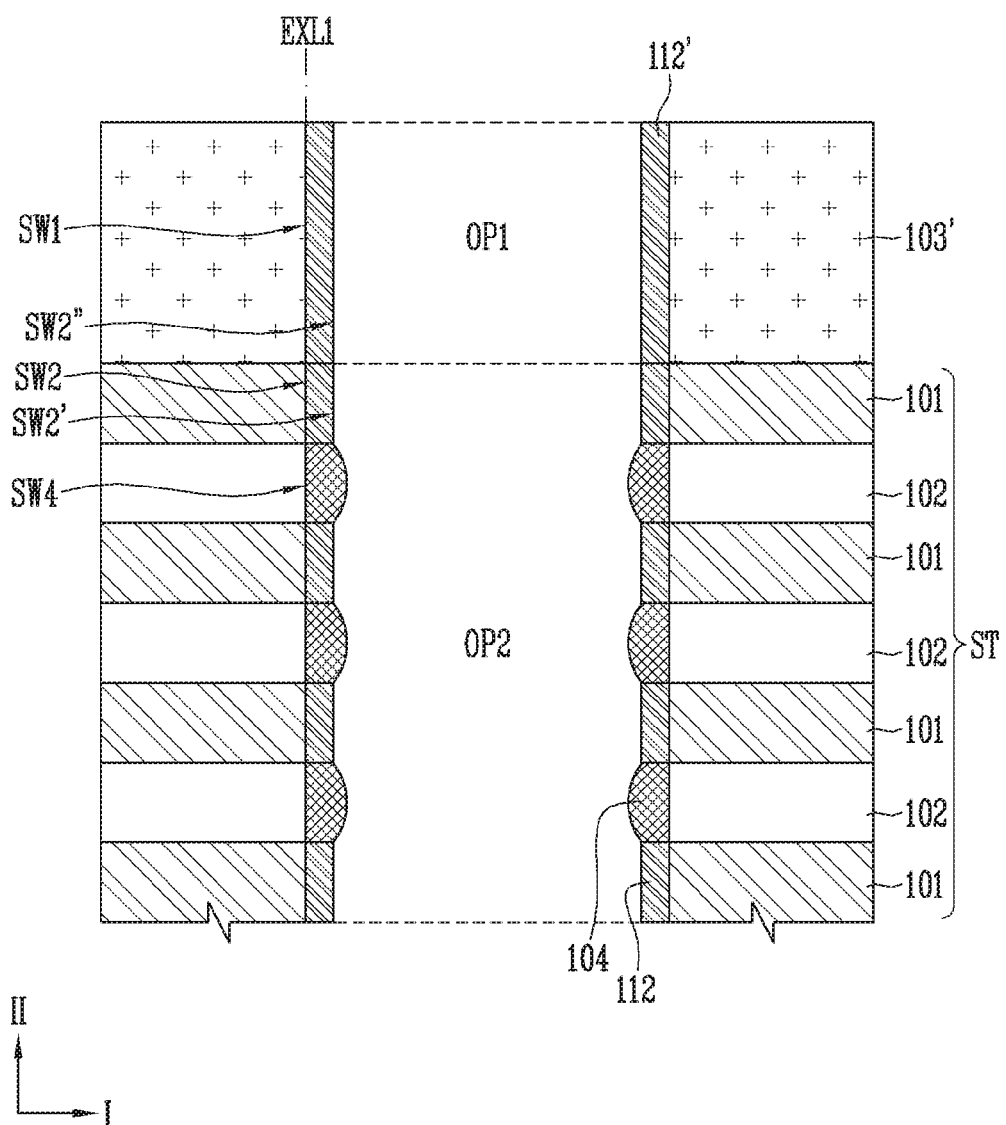
FIGS. 10A and 10B are diagrams, illustrating a method of manufacturing a semiconductor device, according to an embodiment.
Figure 10B:
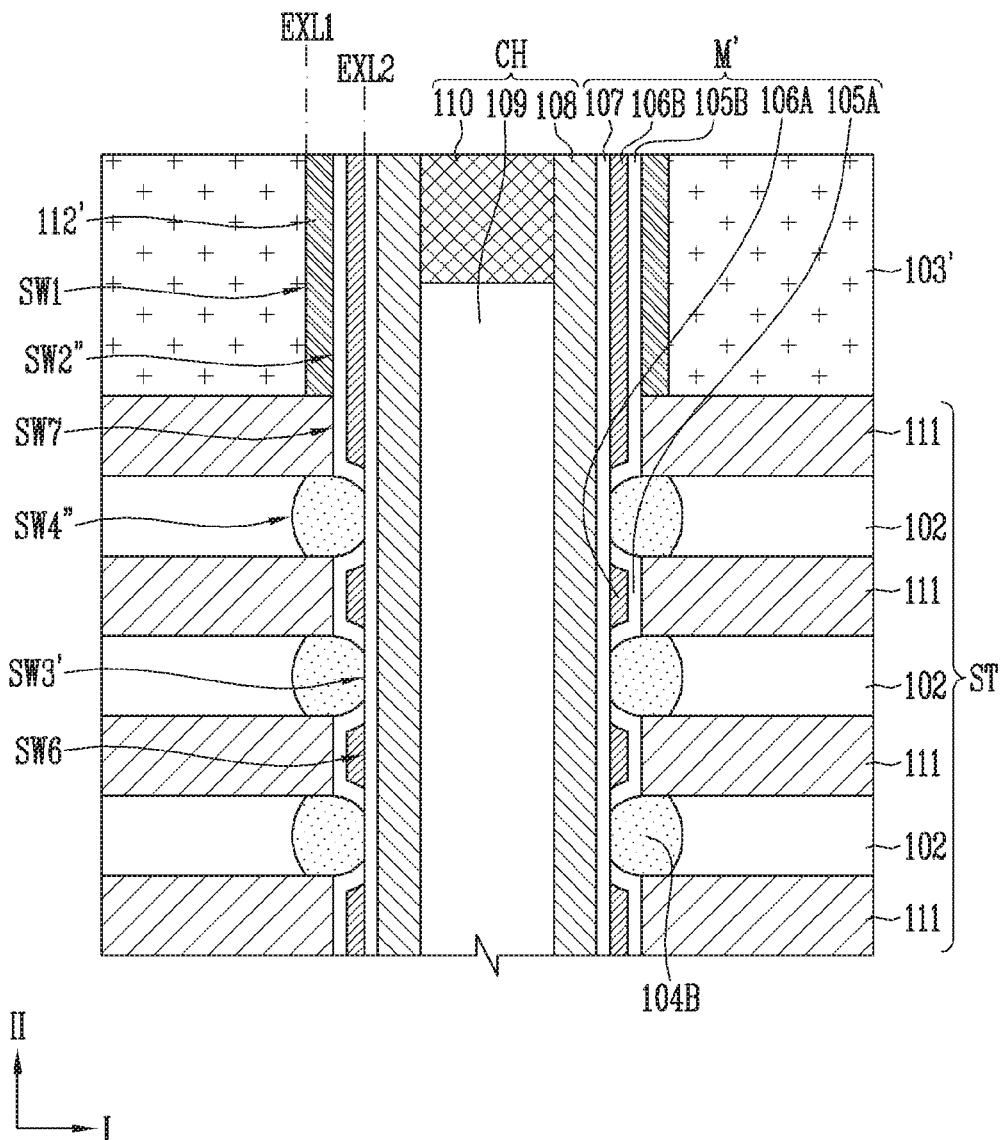

FIGS. 10A and 10B are diagrams, illustrating a method of manufacturing a semiconductor device, according to an embodiment. Hereinafter, any repetitive descriptions of components that have already been mentioned above will be omitted.

Referring to FIG. 10A, the stacked structure ST may be formed. The stacked structure ST may include the first material layers 101 and the second material layers 102 that are alternately stacked on each other. The first and second material layers 101 and 102 may be formed through a deposition method, such as a Chemical Vapor Deposition (CVD) method. The first material layers 101 may include a nitride and the second material layers 102 may include an oxide.

Subsequently, a hard mask pattern 103' may be formed on the stacked structure ST. The hard mask pattern 103' may include a nitride and an impurity, such as carbon. The first material layers 101 may include a material with a higher etch selectivity compared to the hard mask pattern 103'. The hard mask pattern 103' may include the first opening OP1. The first sidewall SW1 of the hard mask pattern 103' may be defined by the first opening OP1.

Subsequently, the second opening OP2 that passes through the stacked structure ST may be formed using the hard mask pattern 103' as an etching barrier. The second sidewall SW2 of each of the first material layers 101 and the fourth sidewall SW4 of each of the second material layers 102 may be defined by the second opening OP2. The second sidewall SW2 and the fourth sidewall SW4 may be located on the first extending line EXL1 of the first sidewall SW1.

Subsequently, the first material patterns 112 may be selectively formed on the first material layers 101. Because the hard mask pattern 103' includes a nitride, a first material pattern 112' may be formed on the first sidewall SW1 of the hard mask pattern 103'.

Subsequently, the seed patterns 104 may be formed between the first material patterns 112 and 112'. The size of the seed patterns 104 may be increased by selectively growing a seed material on the seed patterns 104.

Referring to FIG. 10B, the insulating patterns 104B may be formed on the second material layers 102, respectively. The sidewall SW3' of each of the insulating patterns 104B may protrude farther into the second opening OP2 than the first extending line EXL1. The insulating patterns 104B may be formed by oxidizing the seed patterns 104. The insulating patterns 104B that are formed through an oxidation process may have different properties of matter compared to the second material layers 102 that are formed through a deposition process.

Subsequently, the memory layer M' and the channel structure CH may be formed in the first and second openings OP1 and OP2. The memory layer M' may include at least one of the first data storage patterns 106A, the second data storage pattern 106B, the first blocking patterns 105A, the second blocking pattern 105B, and the tunnel insulating layer 107. The channel structure CH may include the channel layer 108 and may further include at least one of the gap-fill layer 109 and the capping layer 110.

Subsequently, the first material layers 101 and the first material patterns 112 may be replaced through the third material layers 111. The first material pattern 112' may remain between the memory layer M' and the hard mask pattern 103'. The sidewall SW2" of the first material pattern 112' may be located on an extending line of the seventh sidewall SW7.

According to the above-described manufacturing method, the widths of the first opening OP1 and the second opening OP2 may be reduced using the first material patterns 112 and 112'. In addition, the first and second data storage patterns 106A and 106B that are separated from each other through the insulating patterns 104B may be easily formed.

Figure 11A:
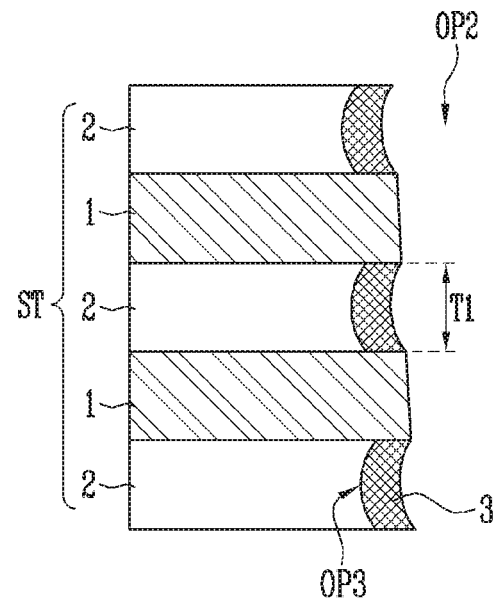
FIGS. 11A to 11C are diagrams, illustrating a method of manufacturing a semiconductor device, according to an embodiment.
Figure 11B:
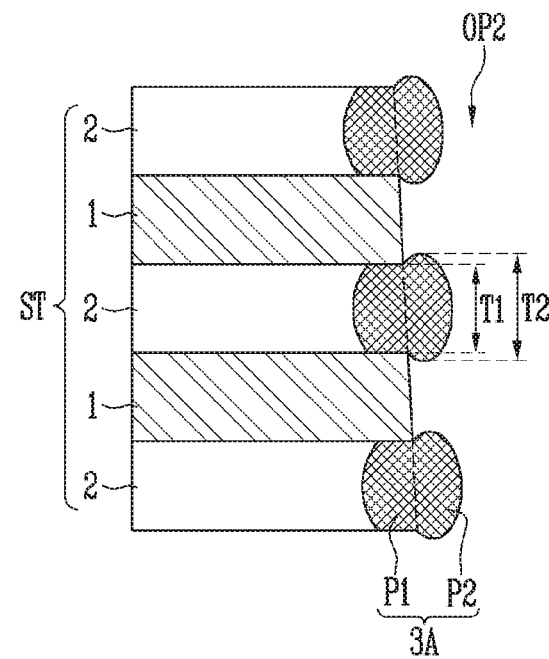
Figure 11C:
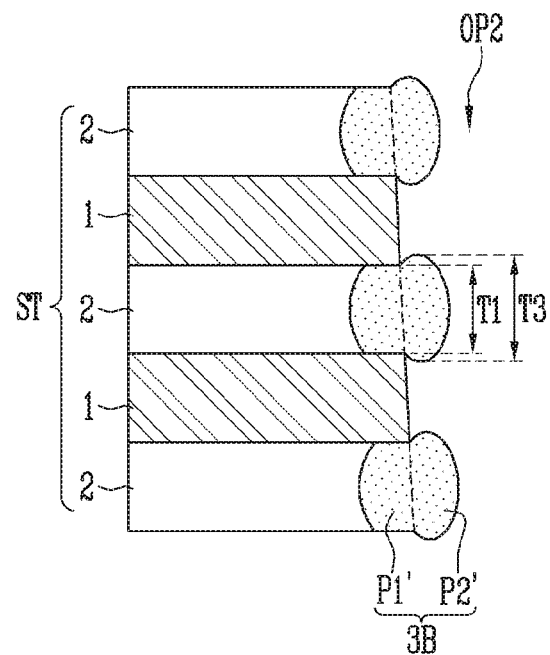

FIGS. 11A to 11C are diagrams, illustrating a method of manufacturing a semiconductor device, according to an embodiment. This embodiment may be applied when the insulating patterns 44A that are described above with reference to FIGS. 5A to 5E, the insulating patterns 64A that are described above with reference to FIGS. 6A to 6D, the insulating patterns 84A that are described above with reference to FIGS. 7A to 7D, 9A and 9B, or the insulating patterns 104A and 104B that are described above with reference to FIGS. 8A to 8C, 10A and 10B are formed.

Referring to FIG. 11A, the stacked structure ST may be formed. The stacked structure ST may include first material layers 1 and second material layers 2 that are alternately stacked on each other. Subsequently, a hard mask pattern (not illustrated) with a first opening may be formed on the stacked structure ST. Subsequently, the second opening OP2 that passes through the stacked structure ST may be formed using the hard mask pattern as an etching barrier.

Subsequently, the third openings OP3 may be formed by selectively etching the second material layers 2. The third openings OP3 may be coupled to the second opening OP2. Subsequently, seed patterns 3 may be formed in the third openings OP3, respectively. The seed patterns 3 may completely or partially fill the third openings OP3, respectively. Each of the seed patterns 3 may have substantially the same thickness T1 as each of the second material layers 2.

Referring to FIG. 11B, a seed material may be selectively grown from the seed patterns 3 through a selective growth process. The seed material may be grown from a surface of each of the seed patterns 3. Therefore, seed patterns 3A may further protrude into the second opening OP2. Each of the seed patterns 3A may include the first portion P1, interposed between the adjacent first material layers 1 and the second portion P2, protruding farther towards the second opening OP2 than a sidewall of each of the first material layers 1. The second portion P2 may have a thickness that is greater than each of the second material layers 2 (T2>T1).

Referring to FIG. 11C, insulating patterns 3B may be formed by oxidizing the seed patterns 3A. Each of the insulating patterns 3B may include a first portion P1', interposed between the adjacent first material layers 1 and the second portion P2', protruding farther towards the second opening OP2 than the sidewall of each of the first material layers 1. The second portion P2' may have a thickness that is greater than each of the second material layers 2 (T3>T1). In addition, the insulating patterns 3B may farther protrude into the second opening OP2 than the first material layers 1.

According to the above-described process, the size of the insulating patterns 3B may be easily adjusted. The insulating patterns 3B may further protrude into the second opening OP2 through selectively growing the seed material.

Figure 12A:
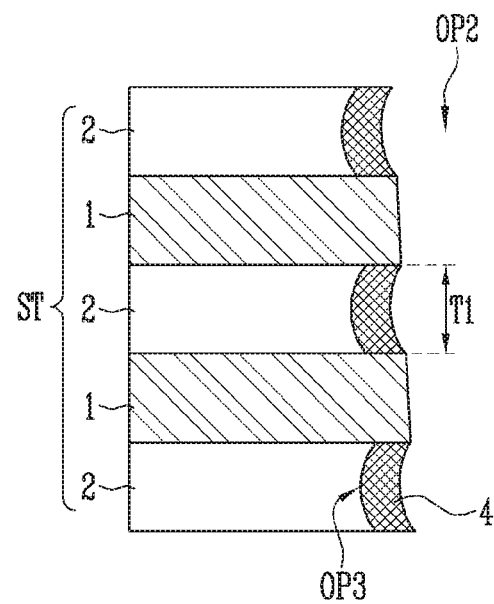
FIGS. 12A to 12C are diagrams, illustrating a method of manufacturing a semiconductor device, according to an embodiment.
Figure 12B:
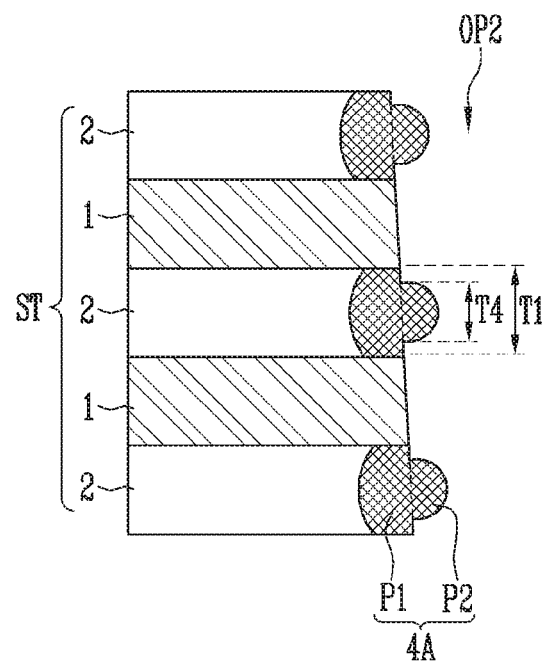
Figure 12C:
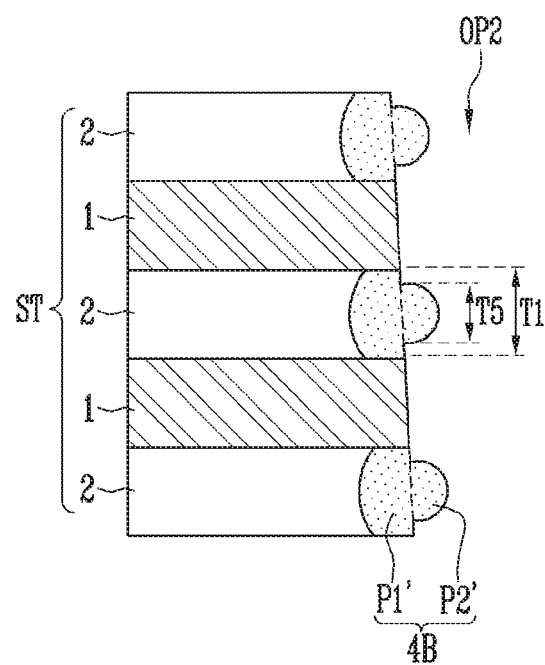

FIGS. 12A to 12C are diagrams, illustrating a method of manufacturing a semiconductor device, according to an embodiment. According to the embodiment, a method of adjusting the size of the insulating patterns 44A that are described above with reference to FIGS. 5A to 5E, the insulating patterns 64A that are described above with reference to FIGS. 6A to 6D, the insulating patterns 84A that are described above with reference to FIGS. 7A to 7D, 9A and 9B, or the insulating patterns 104A and 104B that are described above with reference to FIGS. 8A to 8C, 10A and 10B is described.

Referring to FIG. 12A, the stacked structure ST may be formed. The stacked structure ST may include the first material layers 1 and the second material layers 2 that are alternately stacked on each other. Subsequently, the second opening OP2 that passes through the stacked structure ST may be formed. Subsequently, the third openings OP3 may be formed by selectively etching the second material layers 2. Subsequently, seed patterns 4 may be formed in the third openings OP3, respectively.

Referring to FIG. 12B, a seed material may be selectively grown from the seed patterns 4 through a selective growth process. Therefore, seed patterns 4A may further protrude into the second opening OP2. Each of the seed patterns 4A may include a first portion P1, interposed between the adjacent first material layers 1 and the second portion P2, protruding farther towards the second opening OP2 than a sidewall of each of the first material layers 1. The size of the second portion P2 may be adjusted by adjusting the amount of seed material to be grown. The second portion P2 may have a thickness that is smaller than each of the second material layers 2. (T4<T1).

Referring to FIG. 12C, insulating patterns 4B may be formed by oxidizing the seed patterns 4A. Each of the insulating patterns 4B may include the first portion P1', interposed between the adjacent first material layers 1 and the second portion P2', protruding farther towards the second opening OP2 than the sidewall of each of the first material layers 1. The second portion P2' may have a thickness that is smaller than each of the second material layers 2 (T5<T1). In addition, the insulating patterns 4B may protrude farther into the second opening OP2 than the first material layers 1.

According to the above-described process, the size of the insulating patterns 4B may be adjusted by adjusting the amount of seed material to be selectively grown.

Figure 13A:
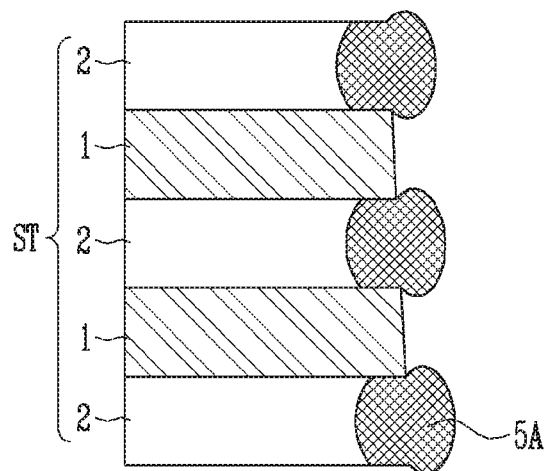
FIGS. 13A to 13C are diagrams, illustrating a method of manufacturing a semiconductor device, according to an embodiment.
Figure 13B:
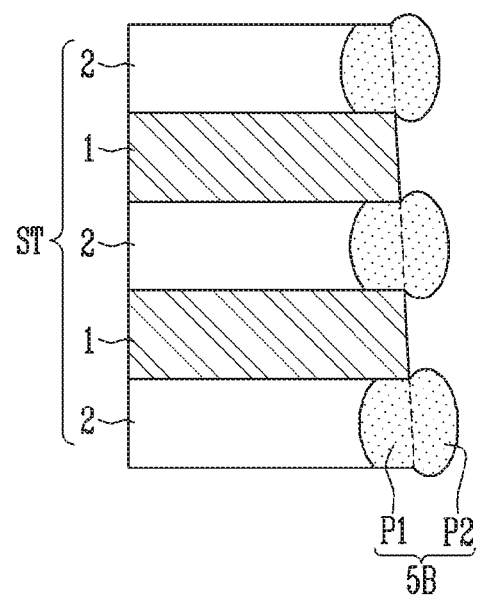
Figure 13C:
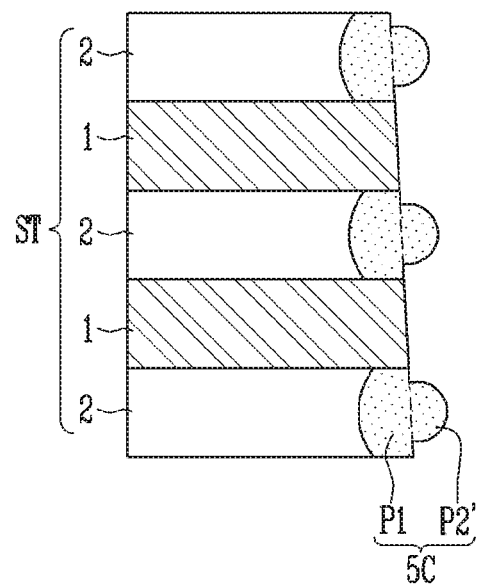

FIGS. 13A to 13C are diagrams, illustrating a method of manufacturing a semiconductor device, according to an embodiment. According to the embodiment, a method of adjusting the size of the insulating patterns 44A that are described above with reference to FIGS. 5A to 5E, the insulating patterns 64A that are described above with reference to FIGS. 6A to 6D, the insulating patterns 84A that are described above with reference to FIGS. 7A to 7D, 9A and 9B, or the insulating patterns 104A and 104B that are described above with reference to FIGS. 8A to 8C, 10A and 10B is described.

Referring to FIG. 13A, the stacked structure ST may be formed. The stacked structure ST may include the first material layers 1 and the second material layers 2 that are alternately stacked on each other. Subsequently, the second opening OP2 that passes through the stacked structure ST may be formed. Subsequently, the third openings OP3 may be formed by selectively etching the second material layers 2. Subsequently, seed patterns 5A may be formed in the third openings OP3, respectively. The size of the seed patterns 5A may be adjusted by selectively growing a seed material through a selective growth process when the seed patterns 5A are formed.

Referring to FIG. 13B, insulating patterns 5B may be formed by oxidizing the seed patterns 5A. The insulating patterns 5B may include a first portion P1, interposed between the adjacent first material layers 1 and the second portion P2, protruding farther towards the second opening OP2 than the sidewall of each of the first material layers 1.

Referring to FIG. 13C, the size of insulating patterns 5C may be adjusted. The size of the insulating patterns 5C may be reduced by etching the insulating patterns 5C. The size of the insulating patterns 5C may be reduced by etching the second portion P2' of the insulating pattern 5C, which protrudes into the second opening OP2 during an etching process.

According to the above-described process, the size of the insulating patterns 5C may be adjusted through an additional etching process.

Figure 14A:
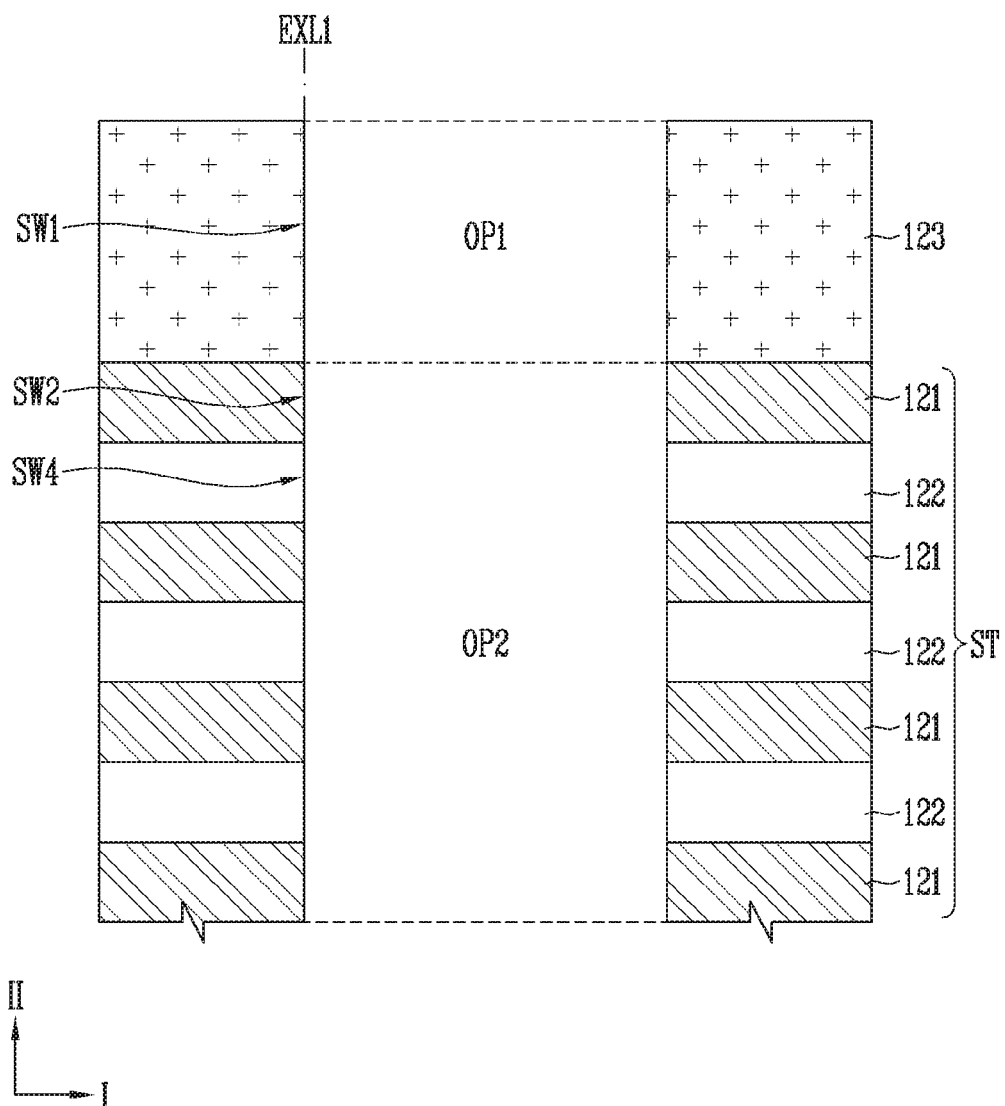
Figure 14C:
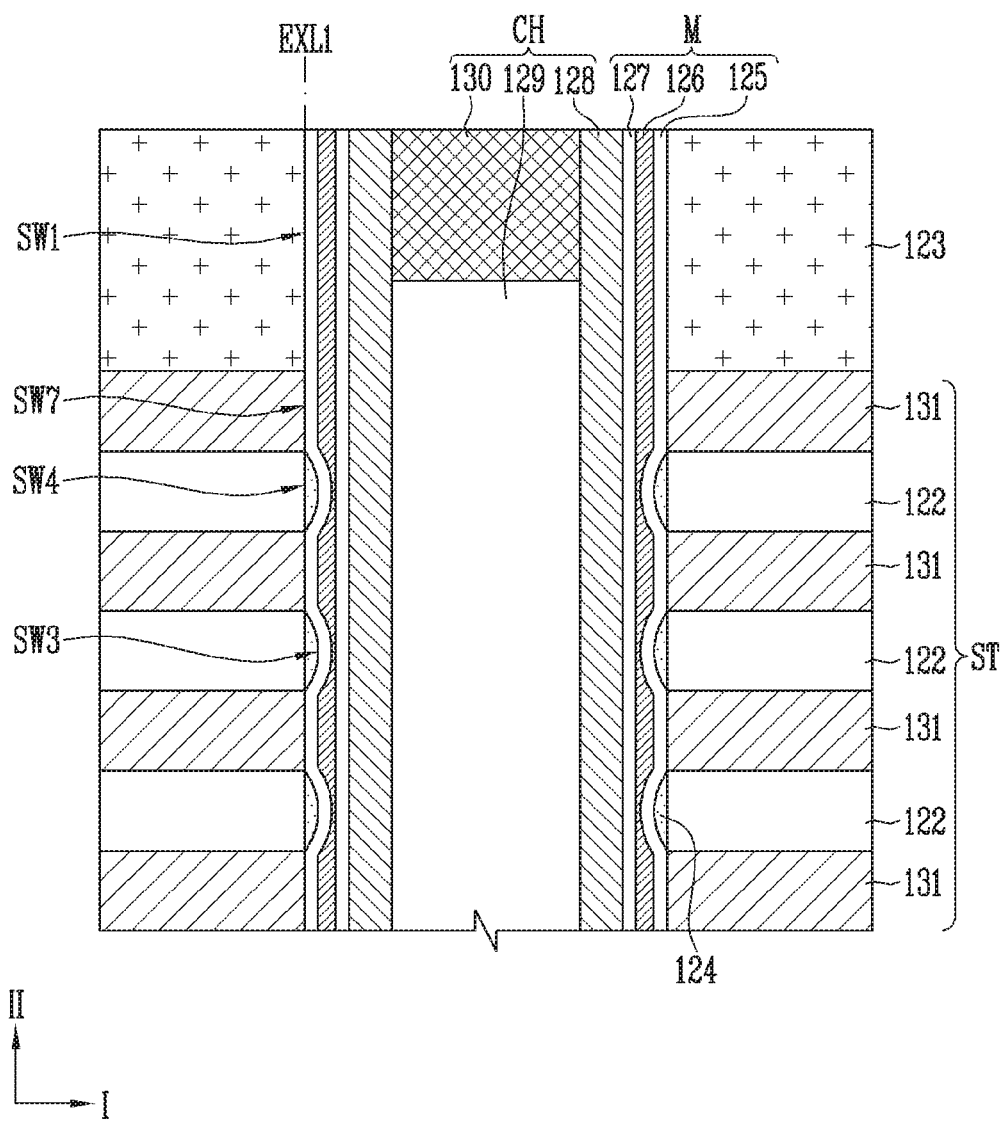

FIGS. 14A to 14C are diagrams, illustrating a method of manufacturing a semiconductor device, according to an embodiment. Hereinafter, any repetitive descriptions of components that have already been mentioned above will be omitted.

Referring to FIG. 14A, the stacked structure ST may be formed. The stacked structure ST may include first material layers 121 and second material layers 122 that are alternately stacked on each other. The first and second material layers 121 and 122 may be formed through a deposition process such as a Chemical Vapor Deposition (CVD) process. The first material layers 121 may include a material with high etch selectivity with respect to the second material layers 122.

Subsequently, a hard mask pattern 123 may be formed on the stacked structure ST. The hard mask pattern 123 may include an oxide, a nitride, a carbon-based material, or a combination thereof. The hard mask pattern 123 may include the first opening OP1. The first sidewall SW1 of the hard mask pattern 123 may be defined by the first opening OP1.

Subsequently, the second opening OP2 that passes through the stacked structure ST may be formed. The second opening OP2 may be formed by etching the stacked structure ST by using the hard mask pattern 123 as an etching barrier. The second sidewall SW2 of each of the first material layers 121 and the fourth sidewall SW4 of each of the second material layers 122 may be defined by the second opening OP2. The second sidewall SW2 and the fourth sidewall SW4 may be located on the first extending line EXL1 of the first sidewall SW1.

Referring to FIG. 14B, insulating patterns 124 that protrude farther into the second openings OP2 than the sidewall SW1 of the hard mask pattern 123 may be formed on the second material layers 122, respectively. The insulating patterns 124 may be formed by selectively depositing an insulating material on the second material layers 122. After a surface treatment is performed to accelerate the growth of the insulating material on a surface of each of the second material layers 122 or a surface treatment is performed to hinder the growth of the insulating material on a surface of each of the first material layers 121, the insulating patterns 124 may be formed.

The insulating patterns 124 may include a material with high etch selectivity with respect to the first material layers 121. The insulating patterns 124 and the second material layers 122 may include substantially the same material. The sidewall SW3 of each of the insulating patterns 124 may protrude farther into the second opening OP2 than the first extending line EXL1. The insulating patterns 124 may be separated from each other.

Each of the insulating patterns 124 may include the first surface S1 that contacts the second material layer 122 and the second surface S2 that faces the first surface S1. The first surface S1 may include a plane and may be flat. The second surface S2 may include a curved surface. The first surface S1 may correspond to the fourth sidewall SW4, and the second surface S2 may correspond to the third sidewall SW3.

The insulating patterns 124 and the second material layers 122 may be formed through different deposition methods. For example, a condition, such as a deposition temperature and a deposition speed, may be different when deposition methods are performed. Therefore, the insulating patterns 124 and the second material layers 122 may have different properties of matter. For example, properties of matter, such as a nitrogen concentration, an etch rate, thermal stability, and dielectric strength, may be different.

The second material layers 122 may be formed through a Chemical Vapor Deposition (CVD) method. The second material layers 122 may be formed at a relatively high temperature and a relatively high deposition speed than the insulating patterns 124. The insulating patterns 124 may be formed through a selective deposition method or an Atomic Layer Deposition (ALD) method. The insulating patterns 124 may be formed at a relatively low temperature and a relatively low deposition speed compared to the second material layers 122. Therefore, the second material layers 122 may have superior films compared to the insulating patterns 124. The insulating patterns 124 may have lower thermal stability, lower dielectric strength, a higher etch rate, and the like compared to the second material layers 122.

In addition, because the first material layers 121 and the second material layers 122 are alternately deposited when the stacked structure ST is formed, a substance (for example, nitrogen) of the first material layers 121 may diffuse into the second material layers 122. Therefore, the second material layers 122 may include nitrogen and a composition thereof may be changed. On the other hand, when the insulating patterns 124 are deposited, nitrogen might not be introduced, and the change in composition of the Insulating patterns 124 may be relatively small compared to that of the second material layers 122.

Referring to FIG. 14C, the memory layer M and the channel structure CH may be formed in the first and second openings OP1 and OP2. The memory layer M may include at least one of a blocking layer 125, a data storage layer 126, and a tunnel insulating layer 127. The channel structure CH may include at least one of a channel layer 128, a gap-fill layer 129, and a capping layer 130.

Subsequently, the first material layers 121 may be replaced through third material layers 131. The third material layers 131 may include metal layers, silicide layers, or the like. The seventh sidewall SW7 of each of the third material layers 131 may be located on the first extending line EXL1 of the first sidewall SW1. The third sidewall SW3 of each of the insulating patterns 124 may protrude farther towards the channel structure CH compared to the first sidewall SW1, the fourth sidewall SW4, and the seventh sidewall SW7.

According to the above-described manufacturing method, the data storage layer 126 with a thickness that varies based on the region thereof may be easily formed. In addition, because the insulating patterns 124 protrude farther than the first extending line EXL1, the data storage layer 126 may be easily formed without extending the width or the diameter of the second opening OP2 in the first direction I.

Figure 15A:
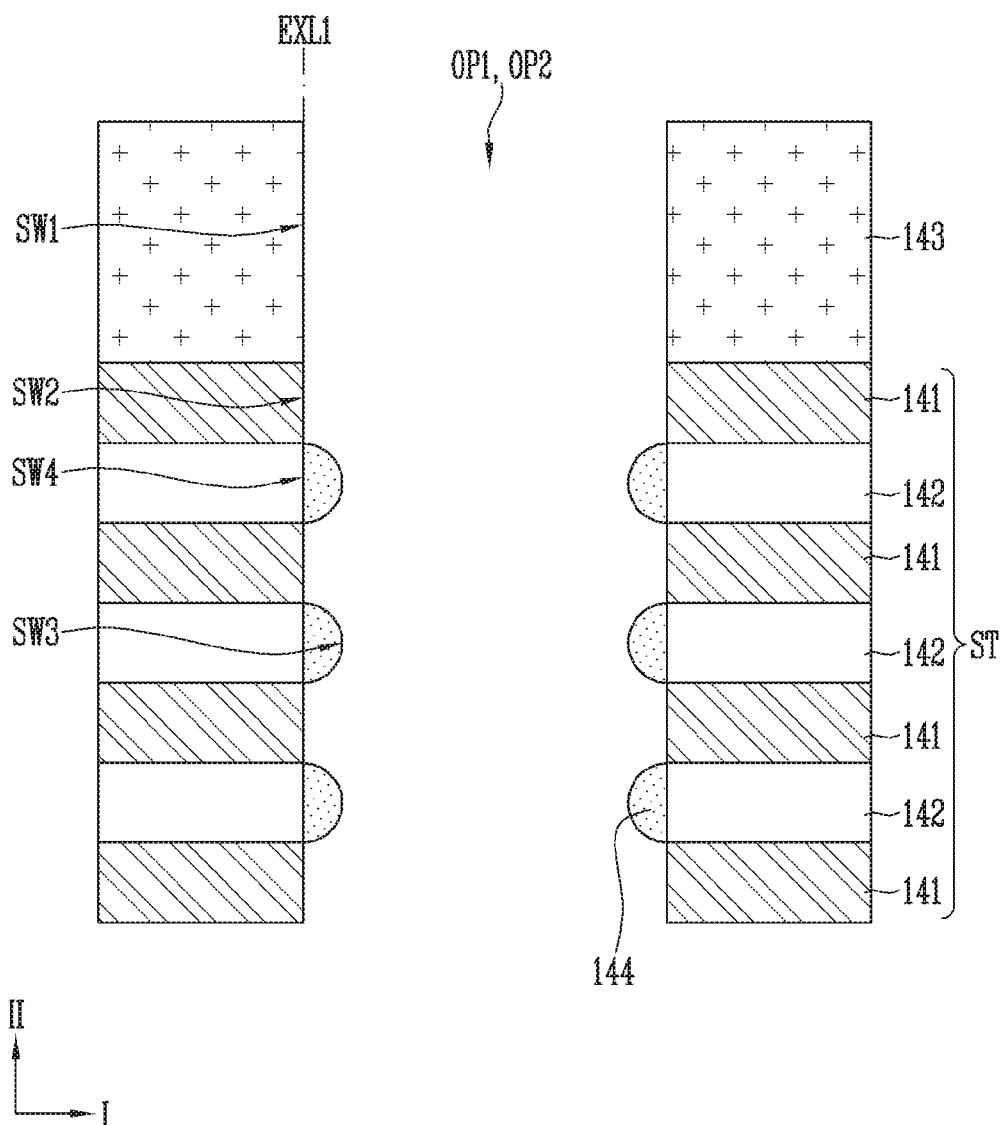
FIGS. 15A and 15B are diagrams, illustrating a method of manufacturing a semiconductor device, according to an embodiment.
Figure 15B:
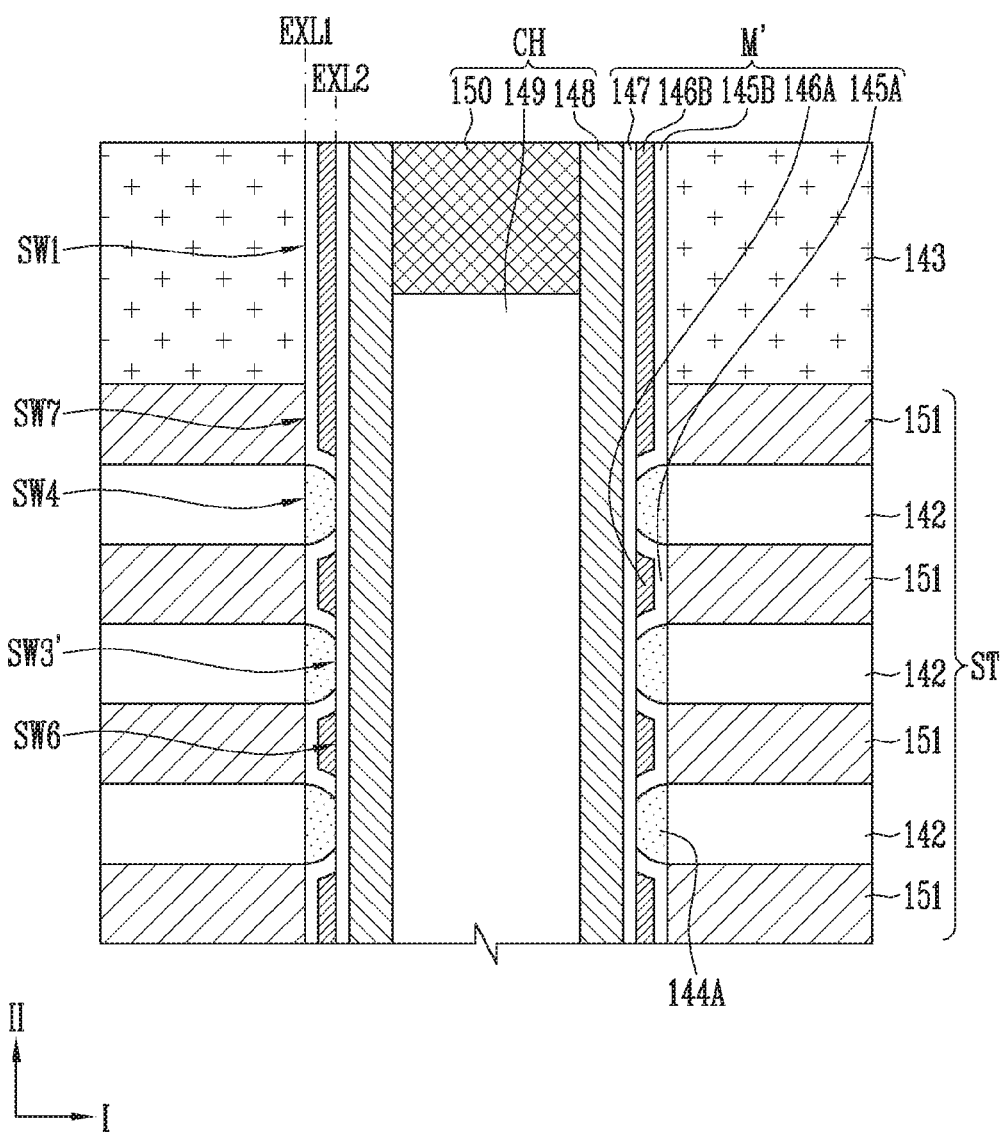

FIGS. 15A and 15B are diagrams, illustrating a method of manufacturing a semiconductor device, according to an embodiment. Hereinafter, any repetitive descriptions of components that have already been mentioned above will be omitted.

Referring to FIG. 15A, the stacked structure ST may be formed. The stacked structure ST may include first material layers 141 and second material layers 142 that are alternately stacked on each other. The first and second material layers 141 and 142 may be formed through a deposition process such as a Chemical Vapor Deposition (CVD) process.

Subsequently, a hard mask pattern 143 may be formed on the stacked structure ST. The hard mask pattern 143 may include an oxide, a nitride, a carbon-based material, or a combination thereof. The hard mask pattern 143 may include the first opening OP1. The first sidewall SW1 of the hard mask pattern 143 may be defined by the first opening OP1.

Subsequently, the second opening OP2 that passes through the stacked structure ST may be formed. The second opening OP2 may be formed by etching the stacked structure ST using the hard mask pattern 143 as an etching barrier. The second sidewall SW2 of each of the first material layers 141 and the fourth sidewall SW4 of each of the second material layers 142 may be defined by the second opening OP2. The second sidewall SW2 and the fourth sidewall SW4 may be located on the first extending line EXL1 of the first sidewall SW1.

Subsequently, insulating patterns 144 that protrude farther into the second openings OP2 than the sidewall SW1 of the hard mask pattern 143 may be formed on the second material layers 142, respectively. The insulating patterns 144 may be formed by selectively depositing an insulating material on the second material layers 142. The sidewall SW3 of each of the insulating patterns 144 may protrude farther into the second opening OP2 than the first extending line EXL1. The insulating patterns 144 and the second material layers 142 may be formed through different deposition methods and may have different properties of matter.

Referring to FIG. 15B, the memory layer M' and the channel structure CH may be formed in the first and second openings OP1 and OP2. First, after a blocking layer and a data storage layer are formed in the first and second openings OP1 and OP2, first data storage patterns 146A, a second data storage pattern 146B, first blocking patterns 145A, and a second blocking pattern 145B may be formed by etching the data storage layer and the blocking layer. When the data storage layer and the blocking layer are etched, parts of the insulating patterns 144 may be etched. Etched insulating patterns 144A may include the third sidewalls SW3' each with a plane. The sixth sidewall SW6 of each of the first and second data storage patterns 146A and 146B may be located on the second extending line EXL2 of the third sidewall SW3'.

Subsequently, the channel structure CH may be formed in the first and second openings OP1 and OP2. The channel structure CH may include at least one of a channel layer 148, a gap-fill layer 149, and a capping layer 150. Subsequently, the first material layers 141 may be replaced by third material layers 151. The third material layers 151 may include metal layers, silicide layers, or the like. The seventh sidewall SW7 of each of the third material layers 151 may be located on the first extending line EXL1 of the first sidewall SW1. The third sidewall SW3' may protrude farther towards the channel structure CH than the first sidewall SW1, the fourth sidewall SW4, and the seventh sidewall SW7.

According to the above-described manufacturing method, the first and second data storage patterns 146A and 146B separated from each other may be easily formed. In addition, because the insulating patterns 144A protrude farther than the first extending line EXL1, the first and second data storage patterns 146A and 146B may be easily formed without extending the width or the diameter of the second opening OP2 in the first direction I.

Figure 16A:
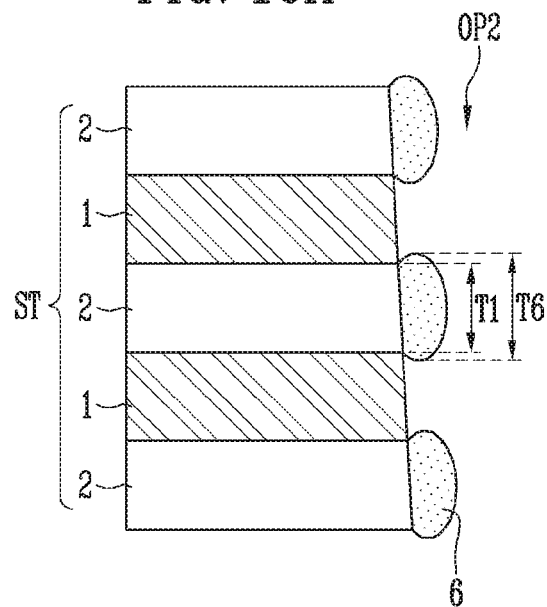
FIGS. 16A and 16B are diagrams, illustrating a method of manufacturing a semiconductor device, according to an embodiment.
Figure 16B:
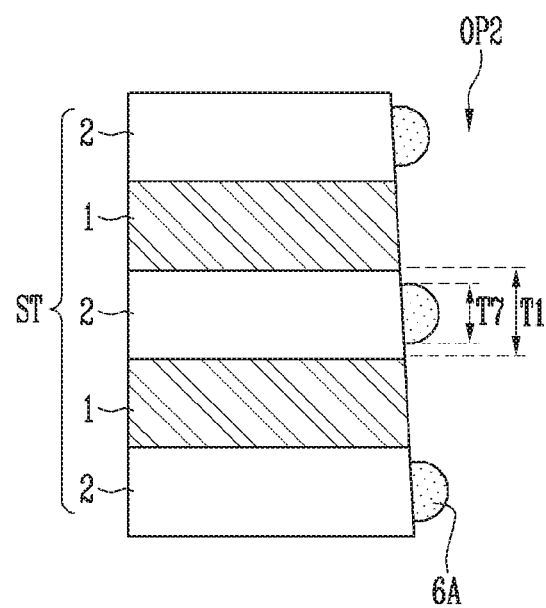

FIGS. 16A and 16B are diagrams, illustrating a method of manufacturing a semiconductor device, according to an embodiment. This embodiment may be applied when the insulating patterns 124 that are described above with reference to FIGS. 14A to 14C or the insulating patterns 144 that are described above with reference to FIGS. 15A and 15B are formed.

Referring to FIG. 16A, the stacked structure ST may be formed. The stacked structure ST may include the first material layers 1 and the second material layers 2 that are alternately stacked on each other. Subsequently, the second opening OP2 that passes through the stacked structure ST may be formed.

Subsequently, insulating patterns 6 may be formed on the second material layers 2, respectively. The insulating patterns 6 may be formed by selectively depositing an insulating material on a surface of each of the second material layers 2. The size of the insulating patterns 6 may be adjusted depending on the amount of the insulating material to be deposited. Each of the insulating patterns 6 may be deposited to have a thickness that is greater than each of the second material layers 2 (T6>T1), the corresponding thickness of each of the second material layers 2 (T6=T1), or a thickness that is smaller than each of the second material layers 2 (T6<T1).

Referring to FIG. 16B, the size of the insulating patterns 6 may be reduced. Insulating patterns 6A with a reduced thickness T7 may be formed by etching the insulating patterns 6. The thickness of each of the insulating patterns 6A may be adjusted to be greater than the thickness of each of the second material layers 2 (T7>T1), to correspond to the thickness of each of the second material layers 2 (T7=T1), or to be smaller than the thickness of each of the second material layers 2 (T7<T1).

According to the above-described process, the size of the insulating patterns 6A may be easily adjusted. In addition, the extent of protrusion of the insulating patterns 6A into the second opening OP2 may be adjusted.

Figure 17:
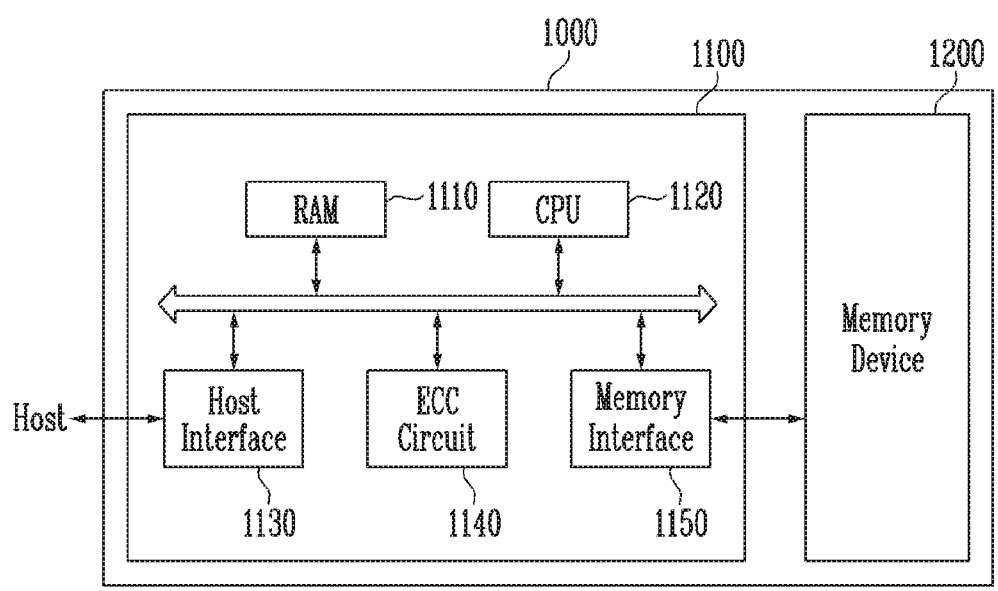
FIG. 17 is a block diagram, illustrating the configuration of a memory system, according to an embodiment.

FIG. 17 is a block diagram, illustrating the configuration of a memory system 1000, according to an embodiment.

Referring FIG. 17, the memory system 1000 may include a memory device 1200 and a controller 1100.

The memory device 1200 may be used to store data information with various data formats such as a text format, a graphical format, and a software code format. The memory device 1200 may be a non-volatile memory device. Furthermore, the memory device 1200 may have the structure that is described above with reference to FIGS. 1A to 16B. The memory device 1200 may be manufactured through the manufacturing method that is described above with reference to FIGS. 1A to 16B. According to an embodiment, the memory device 1200 may include a stacked structure with insulating layers and conductive layers that are alternately stacked on each other, a hard mask pattern on the stacked structure, a channel structure that passes through the hard mask pattern and the stacked structure, insulating patterns interposed between the insulating layers and the channel structure and protruding farther towards the channel structure than a sidewall of the hard mask pattern, and a memory layer interposed between the stacked structure and the channel structure and filling spaces between the insulating patterns. Because the memory device 1200 is configured and manufactured in the same manner as described above, a detailed description thereof will be omitted.

The controller 1100 may be coupled to a host and the memory device 1200 and may be configured to access the memory device 1200 in response to a request from the host. For example, the controller 1100 may control read, write, erase, and background operations of the memory device 1200.

The controller 1100 may include Random Access Memory (RAM) 1110, a Central Processing Unit (CPU) 1120, a host interface 1130, an Error Correction Code (ECC) circuit 1140, a memory interface 1150, and the like.

The RAM 1110 may be used as operational memory of the CPU 1120, cache memory between the memory device 1200 and the host, buffer memory between the memory device 1200 and the host, or the like. The RAM 1110 may be replaced with Static Random Access Memory (SRAM), Read Only Memory (ROM), or the like.

The CPU 1120 may control the overall operation of the controller 1100. For example, the CPU 1120 may operate firmware such as a Flash Translation Layer (FTL) stored in the RAM 1110.

The host interface 1130 may interface with the host. For example, the controller 1100 may communicate with the host through at least one of various interface protocols such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, a private protocol, and the like.

The ECC circuit 1140 may use an Error Correction Code (ECC) to detect and correct errors in data read from the memory device 1200.

The memory interface 1150 may interface with the memory device 1200. For example, the memory interface 1150 may include a NAND interface or a NOR interface.

The controller 1100 may further include buffer memory (not illustrated) for temporarily storing data. The buffer memory may be used to temporarily store data to be transferred to an external device through the host interface 1130 or data to be transferred from the memory device 1200 through the memory interface 1150. In addition, the controller 1100 may further include ROM which stores code data to interface with the host.

Because the memory system 1000 according to the embodiment includes the memory device 1200 with improved integration density and characteristics, the integration density and characteristics of the memory system 1000 may also be improved.

Figure 18:
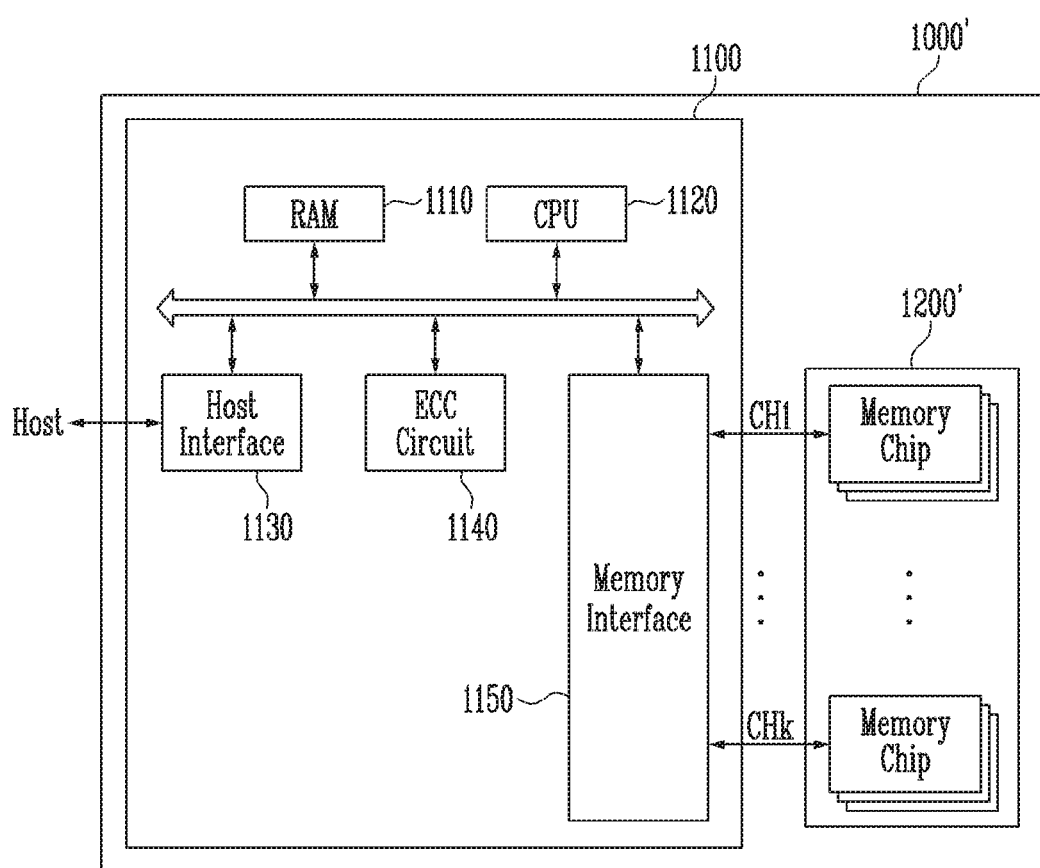
FIG. 18 is a block diagram, illustrating the configuration of a memory system, according to an embodiment.

FIG. 18 is a block diagram, illustrating the configuration of a memory system 1000', according to an embodiment. Hereinafter, any repetitive descriptions of components that have already been mentioned above will be omitted.

Referring to FIG. 18, the memory system 1000' may include a memory device 1200' and the controller 1100. In addition, the controller 1100 may include the RAM 1110, the CPU 1120, the host interface 1130, the ECC circuit 1140, the memory interface 1150, and the like.

The memory device 1200' may be a non-volatile memory device. Furthermore, the memory device 1200' may have the structure as described above with reference to FIGS. 1A to 16B, and may be manufactured through the manufacturing method that is described above with reference to FIGS. 1A to 16B. According to an embodiment, the memory device 1200' may include a stacked structure with insulating layers and conductive layers that are alternately stacked on each other, a hard mask pattern on the stacked structure, a channel structure that passes through the hard mask pattern and the stacked structure, insulating patterns interposed between the insulating layers and the channel structure and protruding farther towards the channel structure than a sidewall of the hard mask pattern, and a memory layer interposed between the stacked structure and the channel structure and filling spaces between the insulating patterns. Because the memory device 1200' is configured and manufactured in the same manner as described above, a detailed description thereof will be omitted.

Furthermore, the memory device 1200' may be a multi-chip package with a plurality of memory chips. The plurality of memory chips may be divided into a plurality of groups, which may communicate with the controller 1100 through first to kth channels CH1 to CHk, respectively. In addition, memory chips included in a single group may communicate with the controller 1100 through a common channel. The memory system 1000' may be modified so that a single memory chip may be coupled to a single channel.

Because the memory system 1000' according to the embodiment includes the memory device 1200' with improved integration density and characteristics, the integration density and characteristics of the memory system 1000' may also be improved. In addition, because the memory device 1200' is formed into a multi-chip package, data storage capacity and driving speed of the memory system 1000' may be enhanced.

Figure 19:
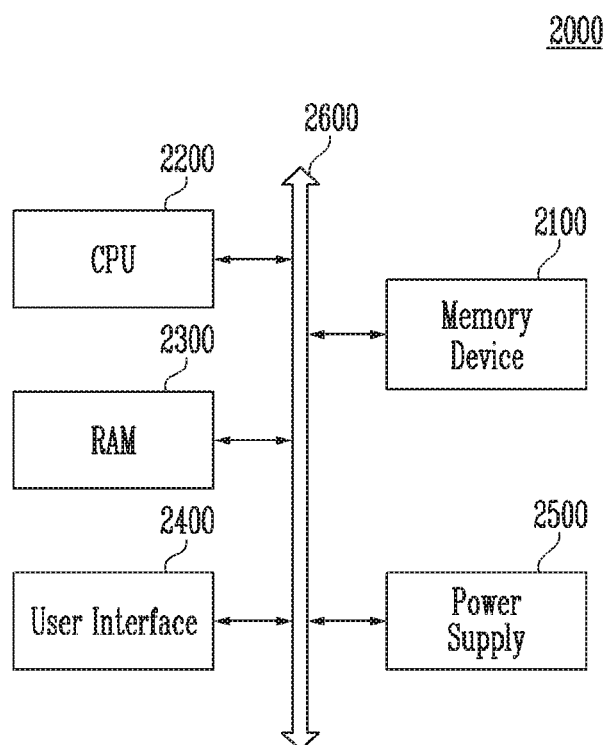
FIG. 19 is a block diagram, illustrating the configuration of a computing system, according to an embodiment.

FIG. 19 is a block diagram, showing the configuration of a computing system 2000, according to an embodiment. Hereinafter, any repetitive descriptions of components that have already been mentioned above will be omitted.

Referring to FIG. 19, the computing system 2000 may include a memory device 2100, a CPU 2200, RAM 2300, a user interface 2400, a power supply 2500, a system bus 2600, and the like.

The memory device 2100 may store data provided via the user interface 2400, data processed through the CPU 2200, and the like. In addition, the memory device 2100 may be electrically coupled to the CPU 2200, the RAM 2300, the user interface 2400, the power supply 2500, and the like through the system bus 2600. For example, the memory device 2100 may be coupled to the system bus 2600 via a controller (not illustrated), alternatively, directly coupled to the system bus 2600. When the memory device 2100 is directly coupled to the system bus 2600, functions of the controller may be performed by the CPU 2200 and the RAM 2300.

The memory device 2100 may be a non-volatile memory device. Furthermore, the memory device 2100 may have the structure that is described above with reference to FIGS. 1A to 16B, and may be manufactured by the manufacturing method that is described above with reference to FIGS. 1A to 16B. According to an embodiment, the memory device 2100 may include a stacked structure with insulating layers and conductive layers that are alternately stacked on each other, a hard mask pattern on the stacked structure, a channel structure that passes through the hard mask pattern and the stacked structure, insulating patterns interposed between the insulating layers and the channel structure and protruding farther towards the channel structure than a sidewall of the hard mask pattern, and a memory layer interposed between the stacked structure and the channel structure and filling spaces between the insulating patterns. Because the memory device 2100 is configured and manufactured in the same manner as described above, a detailed description thereof will be omitted.

In addition, as described above with reference to FIG. 18, the memory device 2100 may be a multi-chip package with a plurality of memory chips.

The computing system 2000 with the above-mentioned configuration may be provided as one of various elements of an electronic device such as a computer, an Ultra Mobile PC (UMPC), a workstation, a net-book, a Personal Digital Assistant (PDA), a portable computer, a web tablet, a wireless phone, a mobile phone, a smartphone, an e-book, a Portable Multimedia Player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or the like.

As described above, because the computing system 2000 according to the embodiment includes the memory device 2100 with improved integration density and characteristics, the characteristics of the computing system 2000 may also be improved.

Figure 20:
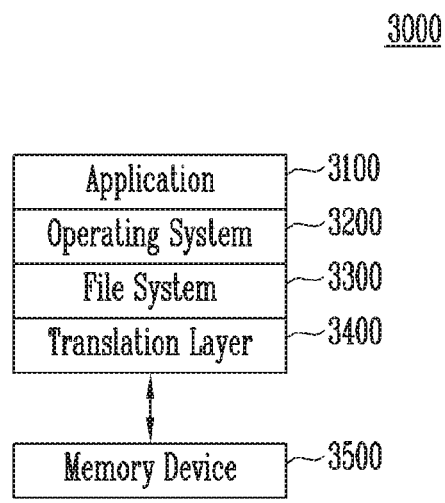
FIG. 20 is a block diagram, illustrating a computing system, according to an embodiment.

FIG. 20 is a block diagram, illustrating a computing system 3000, according to an embodiment.

Referring to FIG. 20, the computing system 3000 may include a software layer that has an operating system 3200, an application 3100, a file system 3300, and a translation layer 3400. In addition, the computing system 3000 may include a hardware layer such as a memory device 3500.

The operating system 3200 may manage software and hardware resources of the computing system 3000. The operating system 3200 may control program execution of a central processing unit. The application 3100 may include various application programs executed through the computing system 3000. The application 3100 may be a utility executed through the operating system 3200.

The file system 3300 may refer to a logical structure configured to manage data and files present in the computing system 3000. The file system 3300 may organize files or data to be stored in the memory device 3500 according to given rules. The file system 3300 may be determined depending on the operating system 3200 used in the computing system 3000. For example, when the operating system 3200 is a Microsoft Windows-based system, the file system 3300 may be a File Allocation Table (FAT), an NT file system (NTFS), or the like. In addition, when the operating system 3200 is a Unix/Linux-based system, the file system 3300 may be an extended file system (EXT), a Unix File System (UFS), a Journaling File System (JFS), or the like.

FIG. 20 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logical address, generated through the file system 3300, into a physical address of the memory device 3500. Mapping information of the logical address and the physical address may be stored in an address translation table. For example, the translation layer 3400 may be a Flash Translation Layer (FTL), a Universal Flash Storage Link Layer (ULL), or the like.

The memory device 3500 may be a non-volatile memory device. Furthermore, the memory device 3500 may have the structure that is described above with reference to FIGS. 1A to 16B, and may be manufactured through the manufacturing method that is described above with reference to FIGS. 1A to 16B. According to an embodiment, the memory device 3500 may include a stacked structure with insulating layers and conductive layers that are alternately stacked on each other, a hard mask pattern on the stacked structure, a channel structure that passes through the hard mask pattern and the stacked structure, insulating patterns interposed between the insulating layers and the channel structure and protruding farther towards the channel structure than a sidewall of the hard mask pattern, and a memory layer interposed between the stacked structure and the channel structure and filling spaces between the insulating patterns. Because the memory device 3500 is configured and manufactured in the same manner as described above, a detailed description thereof will be omitted.

The computing system 3000 with the above-described configuration may be divided into an operating system layer that is operated in an upper level region and a controller layer that is operated in a lower level region. The application 3100, the operating system 3200, and the file system 3300 may be included in the operating system layer, and may be driven through operational memory of the computing system 3000. The translation layer 3400 may be included in the operating system layer or the controller layer.

As described above, because the computing system 3000 according to the embodiment includes the memory device 3500 with improved integration density and characteristics, the characteristics of the computing system 3000 may also be improved.

According to the present disclosure, a semiconductor device with a stabilized structure and improved reliability may be provided. In addition, a method of manufacturing a semiconductor device may be simplified with a lower level of difficulty of processes and lower manufacturing costs.

What is claimed is:

1. A semiconductor device, comprising:
   a stacked structure with insulating layers and conductive layers that are alternately stacked on each other, wherein the insulating layers and the conductive layers extend in a first direction;
   a hard mask pattern on the stacked structure;
   a channel structure extending in a second direction perpendicular to the hard mask pattern and the stacked structure;
   insulating patterns interposed between the insulating layers and the channel structure and interposed between the conductive layers spaced apart in the second direction, wherein the insulating patterns protrude farther towards the channel structure than a sidewall of the hard mask pattern; and
   a memory layer interposed between the stacked structure and the channel structure, wherein the memory layer fills a space between the insulating patterns.

2. The semiconductor device of claim 1, wherein the insulating patterns and the insulating layers have different properties of matter.

3. The semiconductor device of claim 1, wherein each of the insulating patterns includes a first surface that faces each of the insulating layers and a second surface that faces the channel structure, and
   wherein each of the first surface and the second surface includes a curved surface.

4. The semiconductor device of claim 1, wherein each of the insulating patterns includes a first surface that faces each of the insulating layers and a second surface that faces the channel structure, and
   wherein the first surface includes a curved surface and the second surface includes a plane.

5. The semiconductor device of claim 1, wherein each of the insulating patterns includes a first portion, interposed between the conductive layers and a second portion, protruding farther than a sidewall of each of the conductive layers.

6. The semiconductor device of claim 5, wherein the second portion has a greater width than the first portion.

7. The semiconductor device of claim 5, wherein the second portion has substantially a same width as the first portion.

8. The semiconductor device of claim 5, wherein the second portion has a smaller width than the first portion.

9. The semiconductor device of claim 5, wherein a width of each of second portions of the insulating patterns is different from a width of each of the insulating layers.

10. The semiconductor device of claim 1, wherein the memory layer includes a data storage layer that surrounds a sidewall of the channel structure, extending to the sidewall of the hard mask pattern, and
    wherein the memory layer includes protrusions that protrude between the insulating patterns.

11. The semiconductor device of claim 1, wherein the memory layer comprises:
    first data storage patterns located between the insulating patterns and separated from each other; and
    a second data storage pattern extending to the sidewall of the hard mask pattern.

12. The semiconductor device of claim 1, wherein a sidewall of each of the conductive layers is located on an extending line of the sidewall of the hard mask pattern.

13. The semiconductor device of claim 1, wherein an interface between each of the insulating layers and each of the insulating patterns is located to be spaced apart farther from a sidewall of the channel structure than the sidewall of the hard mask pattern.

14. The semiconductor device of claim 1, wherein interfaces between the insulating layers and the insulating patterns are convex towards the insulating layers.

* * * * *